US012721204B2

(12) United States Patent
Shih et al.

(10) Patent No.: US 12,721,204 B2
(45) Date of Patent: Aug. 25, 2026

(54) METHOD FOR MANUFACTURING A PACKAGE STRUCTURE

(71) Applicant: Advanced Semiconductor Engineering, Inc., Kaohsiung (TW)

(72) Inventors: Yu-Lin Shih, Kaohsiung (TW); Chih-Cheng Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 874 days.

(21) Appl. No.: 17/940,827

(22) Filed: Sep. 8, 2022

(65) Prior Publication Data

US 2024/0088091 A1 Mar. 14, 2024

(51) Int. Cl.
*H10W 72/00* (2026.01)

(52) U.S. Cl.
CPC ............................... *H10W 72/0198* (2026.01)

(58) Field of Classification Search
CPC ........... H01L 2224/95136; H01L 24/96; H01L 24/97; H10W 72/0198
See application file for complete search history.

(56) References Cited

U.S. PATENT DOCUMENTS

2021/0265290 A1* 8/2021 Liu ..................... H10W 70/611
2021/0327731 A1* 10/2021 Chang ................. H10P 72/0451

* cited by examiner

*Primary Examiner* — Vongsavanh Sengdara
(74) *Attorney, Agent, or Firm* — Foley and Lardner LLP

(57) ABSTRACT

A method for manufacturing a package structure includes: providing a first electrical element and a second electrical element on a surface of a first carrier, wherein the second electrical element is shifted with respect to the first electrical element; and moving the first electrical element along at least one direction substantially parallel with the surface of the first carrier until a first surface of the first electrical element is substantially aligned with a first surface of the second electrical element from a top view.

20 Claims, 58 Drawing Sheets

METHOD FOR MANUFACTURING A PACKAGE STRUCTURE

BACKGROUND

1. Field of the Disclosure

The present disclosure relates to a method for manufacturing a package structure, and to a method including an alignment process.

2. Description of the Related Art

As for semiconductor packages, such as panel level package (PLP), manufacturing processes typically include wafer based processing and transferring techniques. To reduce manufacturing time, it is necessary to transfer multi-dies from a singulated wafer to a substrate or a carrier. However, the singulating process and the transferring process may cause positions of the multi-dies to shift, thereby decreasing manufacturing yield.

SUMMARY

In some embodiments, a method for manufacturing a package structure includes: providing a first electrical element and a second electrical element on a surface of a first carrier, wherein the second electrical element is shifted with respect to the first electrical element; and moving the first electrical element along at least one direction substantially parallel with the surface of the first carrier until a first surface of the first electrical element is substantially aligned with a first surface of the second electrical element from a top view.

In some embodiments, a method for manufacturing a package structure includes: providing a carrier defining a plurality of predetermined areas aligned with each other from a top view; providing a plurality of electrical elements contacting the carrier; and making the plurality of electrical elements move relative to the carrier until the plurality of electrical elements enter the plurality of predetermined areas respectively from the top view.

In some embodiments, a method for manufacturing a package structure includes: providing a plurality of electrical elements on a surface of a first carrier; and pushing a plurality of first surfaces of the plurality of electrical elements through a first plane of a frame respectively until the plurality of first surfaces of the plurality of electrical elements are substantially aligned with each other.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
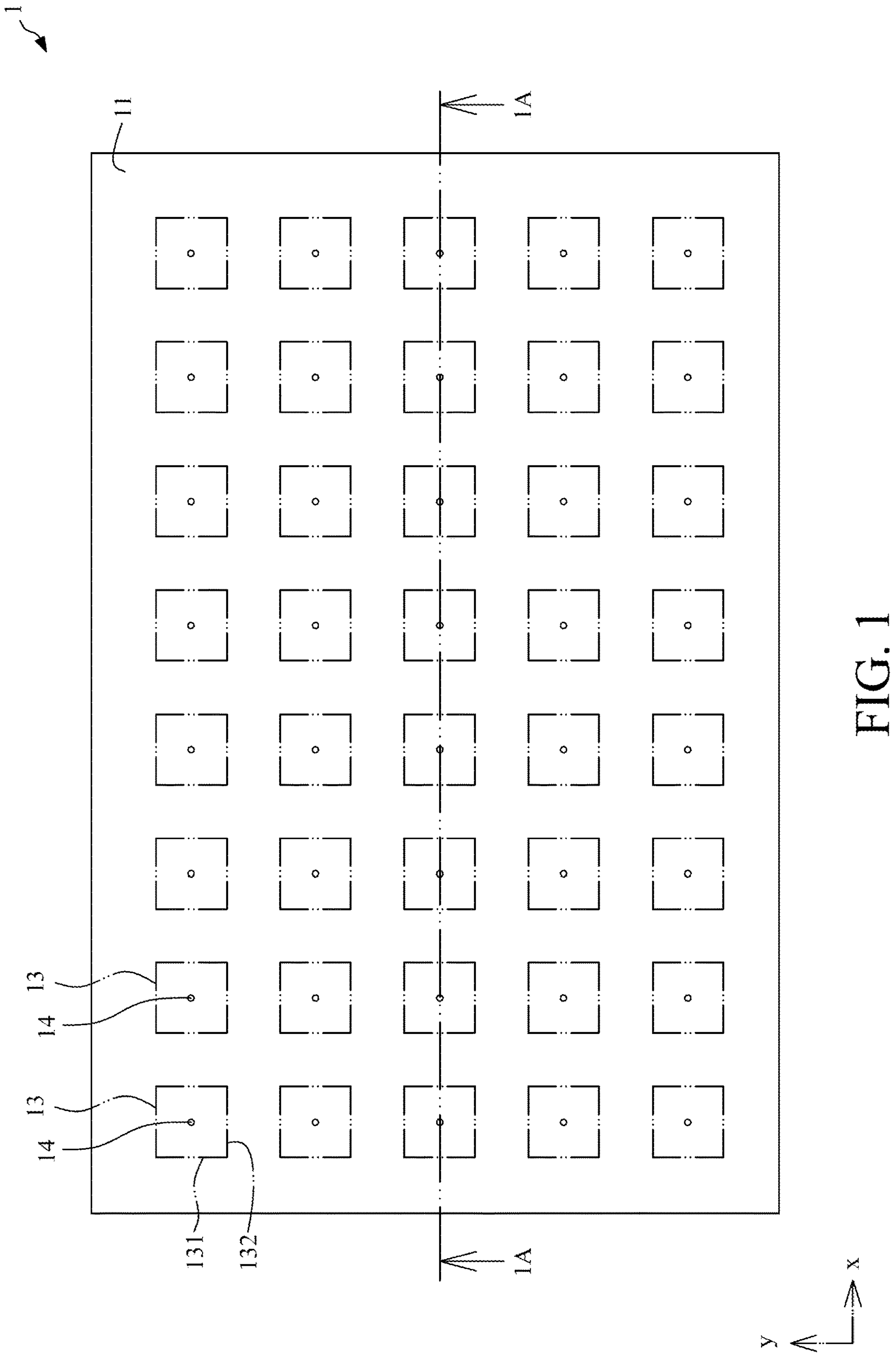
FIG. 1, FIG. 1A, FIG. 2, FIG. 2A-2B, FIG. 3, FIG. 3A, FIG. 4, FIG. 4A-4B, FIG. 5, FIG. 5A-5B, and FIG. 6 to FIG. 11 illustrate a method for manufacturing a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
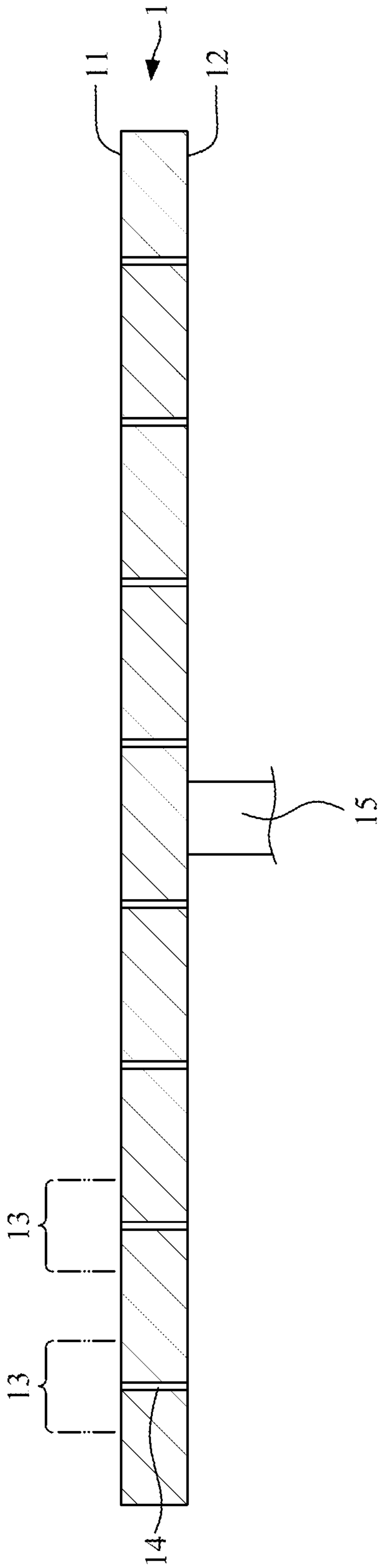

FIG. 1 to FIG. 11 illustrate a method for manufacturing a package structure according to some embodiments of the present disclosure. Referring to FIG. 1 and FIG. 1A, a first carrier 1 is provided. FIG. 1 illustrates a top view of the first carrier 1 according to some embodiments of the present disclosure. FIG. 1A illustrates a cross-sectional view taken along line 1A-1A of FIG. 1. The first carrier 1 may be a buffer carrier. In some embodiments, a material of the first carrier 1 may be antistatic so as to prevent the component or element disposed thereon from being damaged by the static. For example, the material of the first carrier 1 may be polyetheretherketone (PEEK) or ceramic.

The first carrier 1 may have a top surface 11 and a bottom surface 12 opposite to the top surface 11. The top surface 11 may be a flat surface so that the component or element may side or move thereon. Thus, the top surface 11 may be a receiving surface. The first carrier 1 may define a plurality of predetermined areas 13 and a plurality of suction holes 14. The predetermined areas 13 may be arranged in an array. The predetermined area 13 may have a first edge 131 and a second edge 132. The position and/or orientation of the predetermined area 13 may be a predetermined position and/or a predetermined orientation that an element 2 (FIG. 2) on the first carrier 1 to be moved to. The suction holes 14 may be located within a respective one of the predetermined areas 13. Each of the suction holes 14 may have an opening at the top surface 11 within the predetermined areas 13. Although FIG. 1 illustrates only one suction hole 14 in one predetermined area 13, it can be understood that any suitable numbers of the suction hole 14 can be configured in one predetermined area 13. In addition, each of the suction holes 14 may extend through the first carrier 1, and may be communicated with a pressure control device (not shown). Alternatively, the suction holes 14 may be communicated with each other. The pressure control device may provide a negative pressure to the predetermined areas 13 through the suction holes 14. In some embodiments, the predetermined areas 13 and/or the suction holes 14 may be omitted. In some embodiments, the first carrier 1 may be supported by a supporter 15. The supporter 15 may be connected to the bottom surface 12 the first carrier 1 for supporting the first carrier 1. The supporter 15 may be configured to fix, move or rotate the first carrier 1 through a position control mechanism (not shown).

Figure 2:
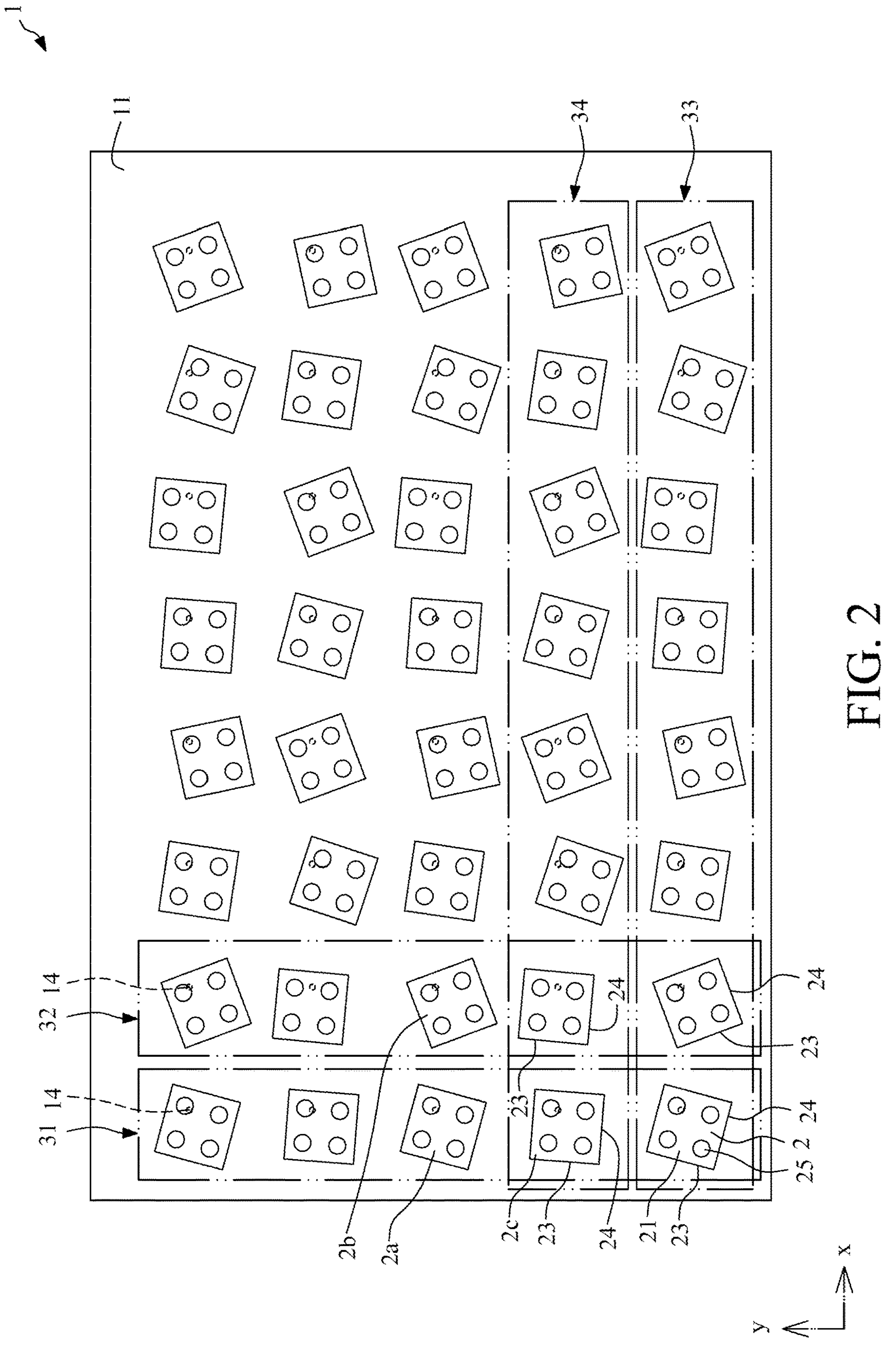
Figure 2A:
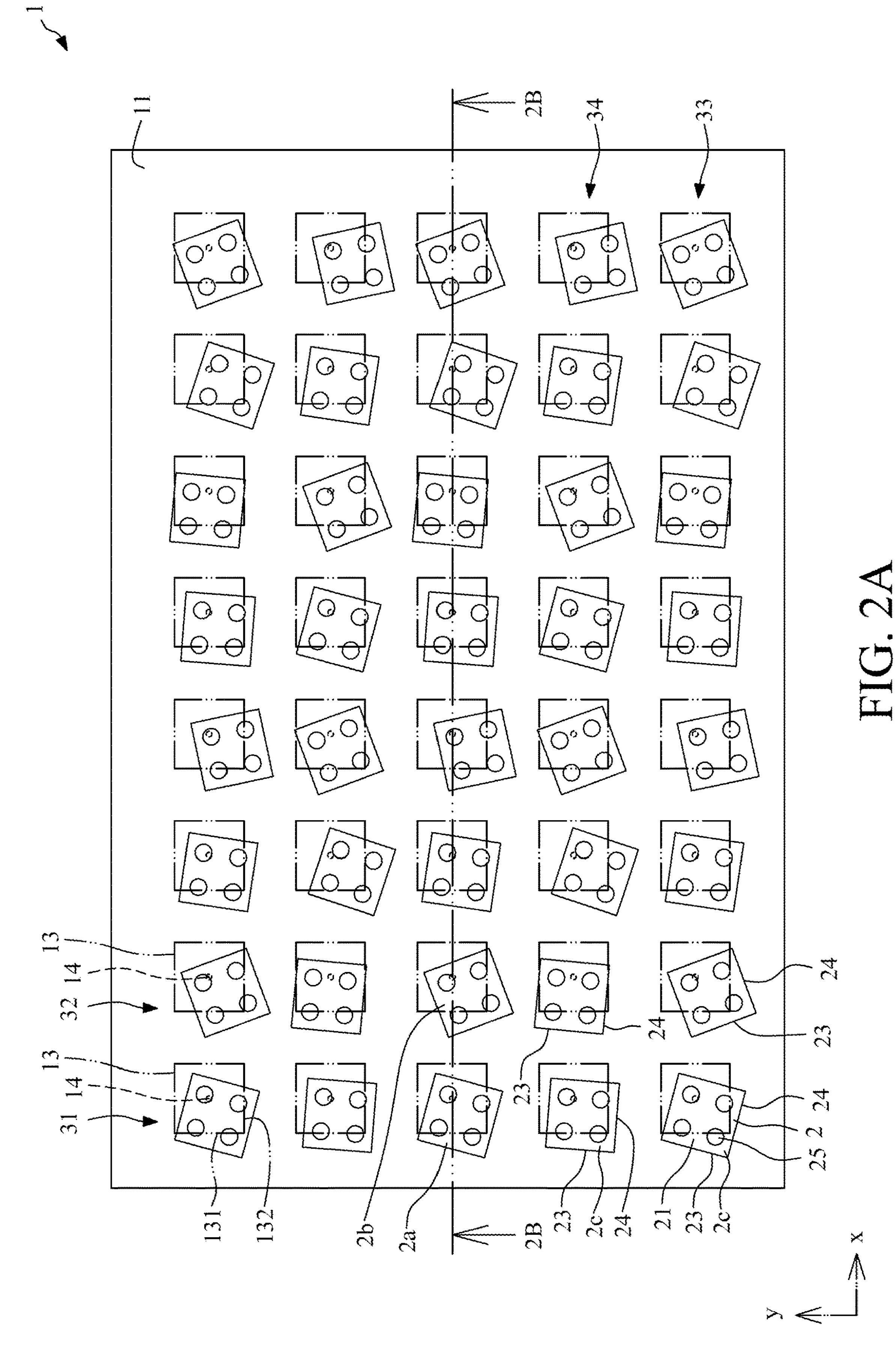
Figure 2B:
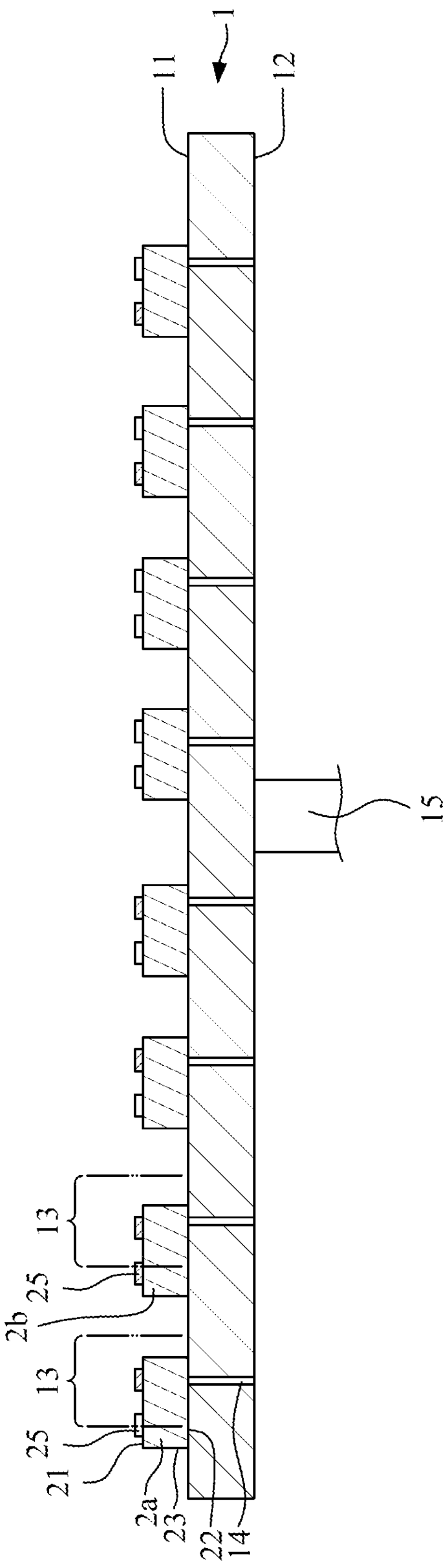

Referring to FIG. 2, FIG. 2A and FIG. 2B, a plurality of elements 2 are disposed or provided on the top surface 11 of the first carrier 1. FIG. 2A illustrates a comparison of the elements of FIG. 2 and the predetermined areas 13 of FIG. 1. FIG. 2B illustrates a cross-sectional view taken along line 2B-2B of FIG. 2A. Each of the elements 2 may be an electronic element, an electrical element, an electrical device or a semiconductor device such as a semiconductor die, a semiconductor chip, a semiconductor package or an electronic package. Each of the elements 2 may be an active component or a passive component. The elements 2 may include at least one first electrical element 2*a* and at least one second electrical element 2*b*, 2*c*. A size of the first electrical element 2*a* may be equal to or different from a size of the second electrical element 2*b*, 2*c*.

In some embodiments, each of the elements 2 (including the first electrical element(s) 2*a* and the second electrical element(s) 2*b*, 2*c*) may have a top surface 21 (e.g., an active surface), a bottom surface 22, a first surface 23 (e.g., a first lateral surface, a first side or a first edge) and a second surface 24 (e.g., a second lateral surface, a second side or a second edge). The bottom surface 22 may be opposite to the top surface 21 and may contact the top surface 11 of the first carrier 1. The first surface 23 and the second surface 24 may extend between the top surface 21 and the bottom surface 22. The first surface 23 is non-parallel with the second surface 24. In some embodiments, the first surface 23 may be perpendicular to the second surface 24. In addition, the element 2 may include a plurality of metal studs 25 (e.g., copper studs) disposed adjacent to the top surface 21. The bottom surface 22 of the element 2 may contact the top surface 11 of the first carrier 1, and may slide, move or rotate on the top surface 11 of the first carrier 1.

The elements 2 (including the first electrical element(s) 2*a* and the second electrical element(s) 2*b*, 2*c*) may be disposed on or attached to the top surface 11 of the first carrier 1 by a pick-and-place process or a pick-and-place method respectively. Alternatively, the elements 2 may be disposed on the top surface 11 of the first carrier 1 simultaneously. The pick-and-place process or the pick-and-place method is a process or a method that an element or an unit is picked up from a substrate or a wafer by a head, and then the head together with the element or the unit move to above a carrier (or another substrate or another wafer), and then the head together with the element or the unit move downward to the carrier (or another substrate or another wafer) so as to place the element or the unit move on the carrier.

As shown in FIG. 2 and FIG. 2A, the elements 2 (including the first electrical element(s) 2*a* and the second electrical element(s) 2*b*, 2*c*) may be not aligned with each other. The elements 2 may at least include a first column 31 of the elements 2 (e.g., the first element(s) 2*a* and the second element 2*c*), a second column 32 of the elements 2 (e.g., the second elements 2*b*), a first row 33 of the elements 2 and a second row 34 of the elements 2 (e.g., the second element(s) 2*c*). The first column 31 of the elements 2 may be arranged along a second direction such as the y-axis direction. The second column 32 of the elements 2 may be also arranged along the second direction. The first row 33 of the elements 2 may be arranged along a first direction such as the x-axis direction. The second row 34 of the elements 2 may be also arranged along the first direction. The first direction is non-parallel with the second direction. In some embodiments, the first direction may be perpendicular to the second direction.

The elements 2 may be shifted or misaligned with each other. For example, the second electrical element 2*b*, 2*c* may be shifted or misaligned with respect to the first electrical element 2*a*. As shown in FIG. 2, the first surfaces 23 of the first column 31 of the elements 2 (e.g., the first elements 2*a*) are not aligned with each other along the second direction. The first surfaces 23 of the second column 32 of the elements 2 (e.g., the second elements 2*b*) are not aligned with each other along the second direction. The first surfaces 23 of the first column 31 of the elements 2 are not parallel with the first surfaces 23 of the second column 32 of the elements 2. Further, the second surfaces 24 of the first row 33 of the elements 2 are not aligned with each other along the first direction. The second surfaces 24 of the second row 34 of the elements 2 are not aligned with each other along the first direction. The second surfaces 24 of the first row 33 of the elements 2 are not parallel with the second surfaces 24 of the second row 34 of the elements 2. Therefore, the elements 2 (including the first electrical element(s) 2*a* and the second electrical element(s) 2*b*, 2*c*) may be misaligned with each other along the second direction and the first direction. In addition, as shown in FIG. 2A, each of the elements 2 (including the first electrical element(s) 2*a* and the second electrical element(s) 2*b*, 2*c*) may be misaligned with a respective one of the predetermined areas 13. There may be a shift problem and/or a rotation problem during the pick-and-place process of the elements 2.

Figure 3:
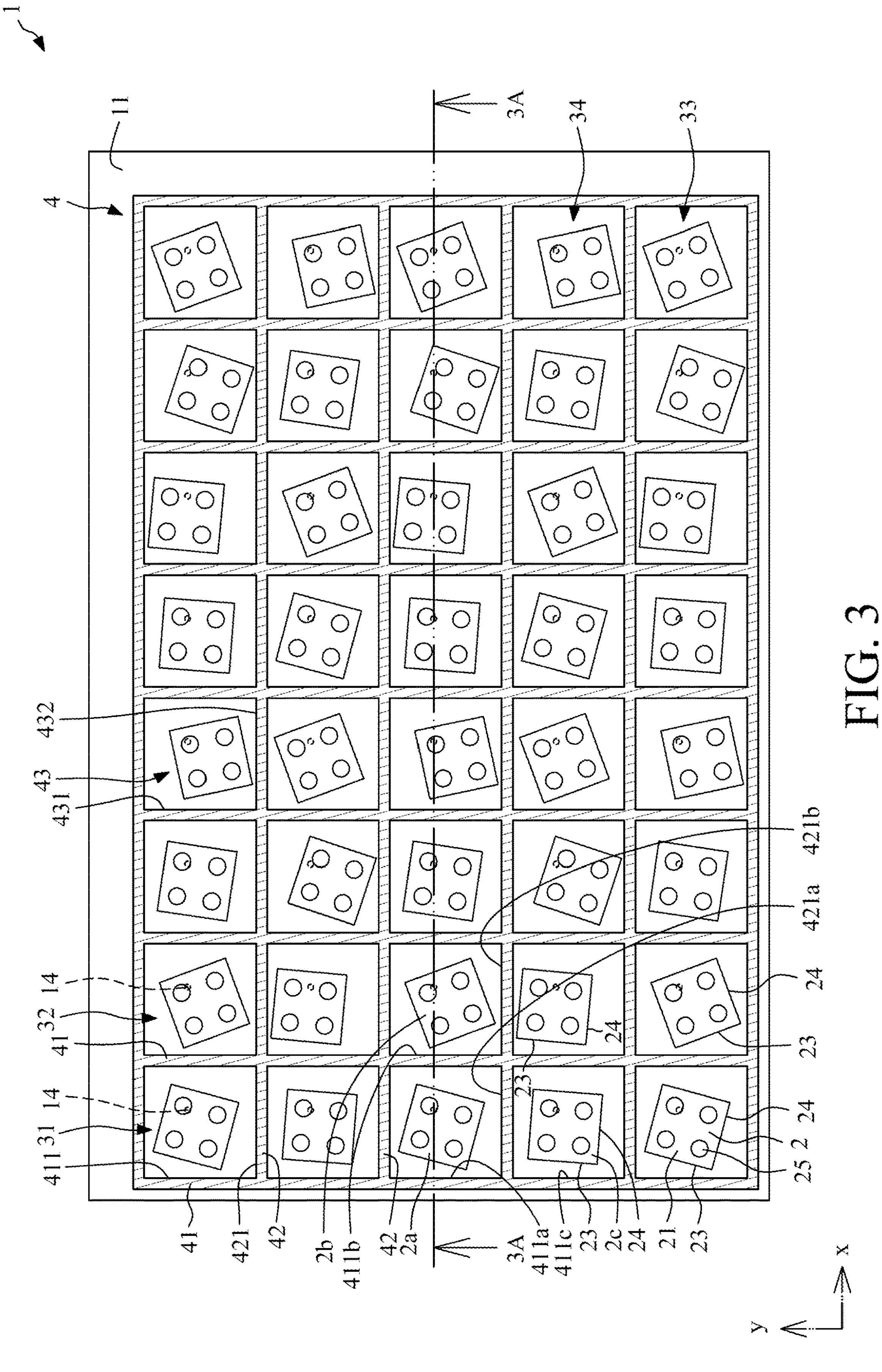
Figure 3A:
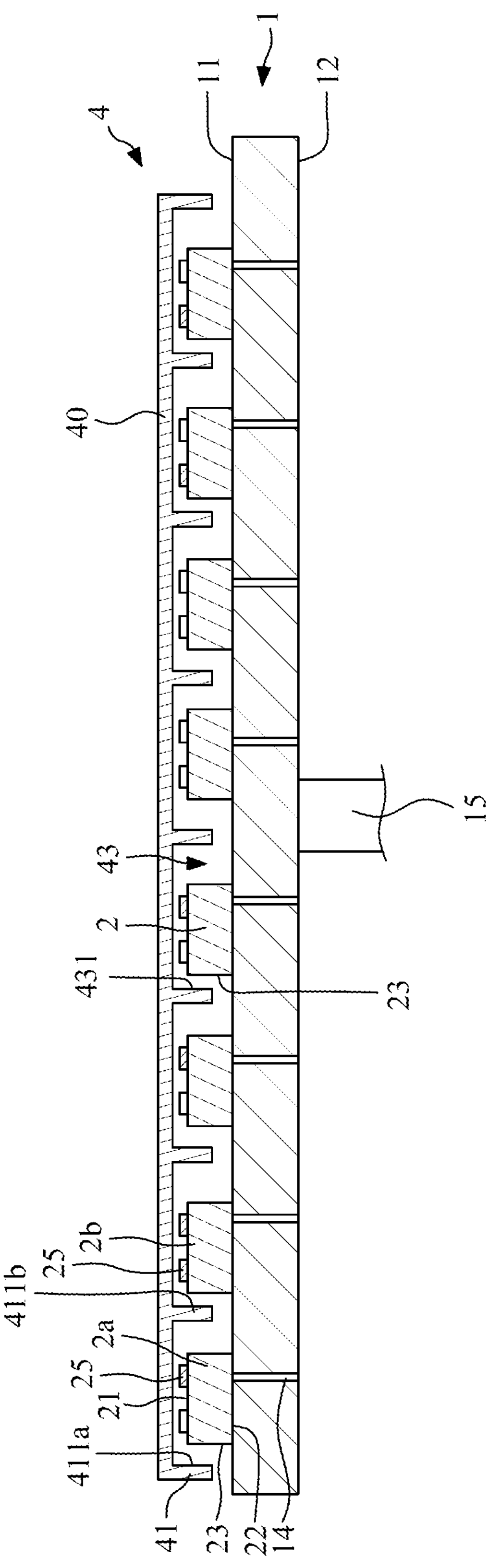

Referring to FIG. 3 to FIG. 6, the elements 2 (including the first electrical element(s) 2*a* and the second electrical element(s) 2*b*, 2*c*) may slide on the top surface 11 of the first carrier 1 to a predetermined position and/or orientation (i.e., the predetermined area 13) of each of the elements 2. Referring to FIG. 3 and FIG. 3A, a frame 4 is provided. FIG. 3A illustrates a cross-sectional view taken along line 3A-3A of FIG. 3, wherein a cover portion 40 of the frame 4 in FIG. 3 is omitted for clear illustration. The frame 4 may be a position frame, a pushing frame or an adjustment frame. The frame 4 may include a cover portion 40, a plurality of first strip portions 41 and a plurality of second strip portions 42. The first strip portion 41 may be also referred to as "a first sidewall", and the second strip portion 42 may be also referred to as "a second sidewall". The first strip portions 41 may protrude from the cover portion 40, may extend along the second direction such as the y-axis direction, and may be substantially parallel with each other. The second strip portions 42 may protrude from the cover portion 40, may extend along the first direction such as the x-axis direction, and may be substantially parallel with each other. The first strip portions 41 and the second strip portions 42 may be crossed with each other at a predetermined angle (e.g., 90 degrees) so as to define a plurality of unit spaces 43. Each of the unit spaces 43 may accommodate an element 2. Thus, the first strip portions 41 and the second strip portions 42 may be located between the elements 2.

The first strip portion 41 has a first inner surface 411 facing the element 2. The first inner surface 411 of the first strip portion 41 may be also referred to as "a first reference plane", "a first plane" or "a first inner sidewall". The second strip portion 42 has a second inner surface 421 facing the element 2. The second inner surface 421 of the second strip portion 42 may be also referred to as "a second reference plane", "a second plane" or "a second inner sidewall". The second inner surface 421 of the second strip portion 42 may be non-parallel with the first inner surface 411 of the first strip portion 41. The unit space 43 may have a first sidewall 431 and a second sidewall 432. The first sidewall 431 may be a portion of the first inner surface 411 of the first strip portion 41. The second sidewall 432 may be a portion of the second inner surface 421 of the second strip portion 42. The first sidewalls 431 may be substantially aligned with each other since the first inner surface 411 of the first strip portion 41 may be a flat surface. The second sidewalls 432 may be substantially aligned with each other since the second inner surface 421 of the second strip portion 42 may be a flat surface. In addition, the first strip portion 41 (e.g., the first sidewall) may include a first portion 411*a* and a second portion 411*b*, 411*c*. The first portion 411*a* and the second portion 411*c* may be a portion of the first inner surface 411, and may be substantially aligned with each other. The second strip portion 42 (e.g., the second sidewall") may include a first portion 421*a* and a second portion 421*b*. The first portion 421*a* and the second portion 421*b* may be a portion of the second inner surface 421, and may be substantially aligned with each other. Alternatively, the first portion 411*a* and the second portion 411*b*, 411*c* may be sidewalls that are adjacent to the predetermined areas 13 and are substantially aligned with each other.

Figure 4:
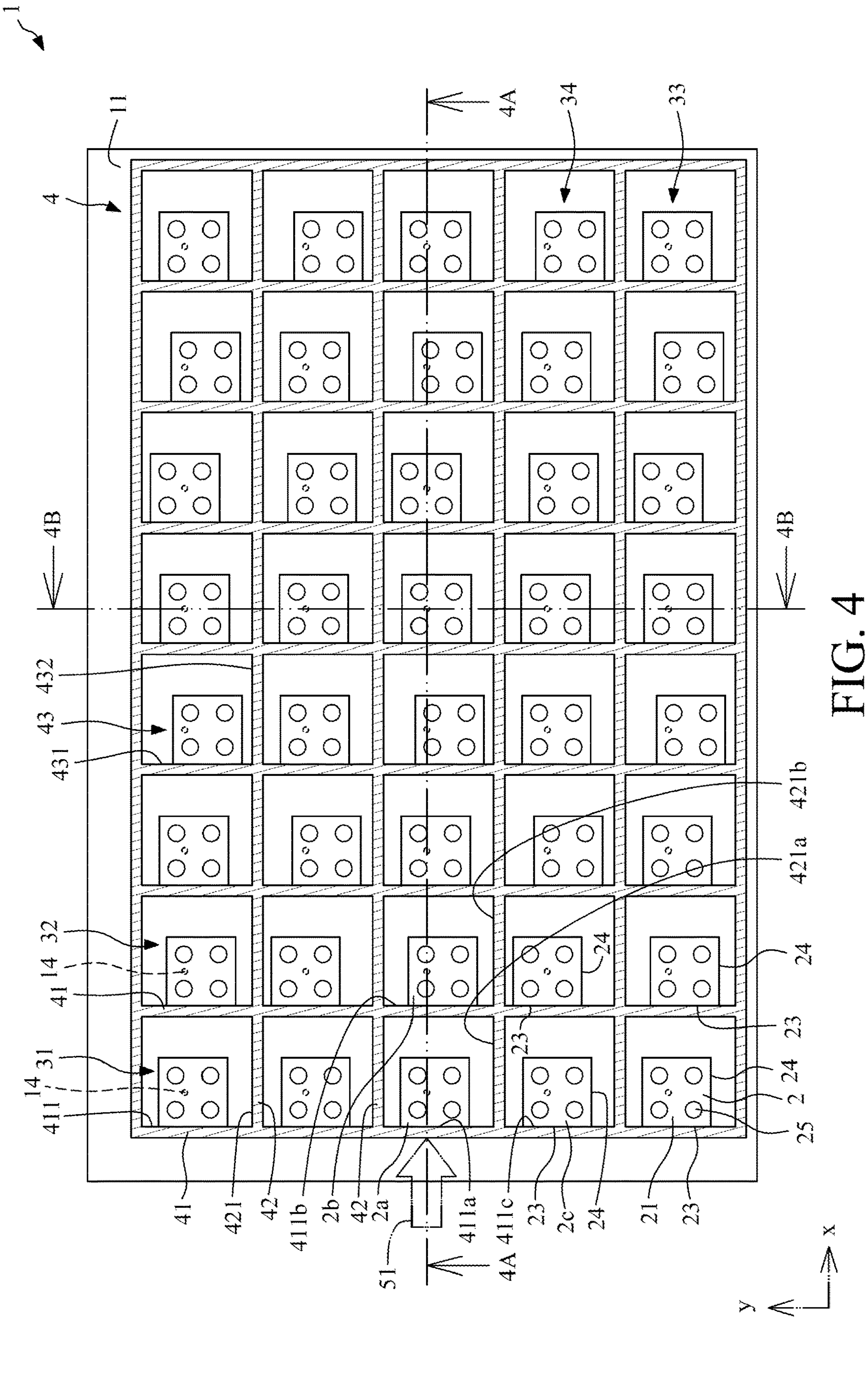
Figure 4A:
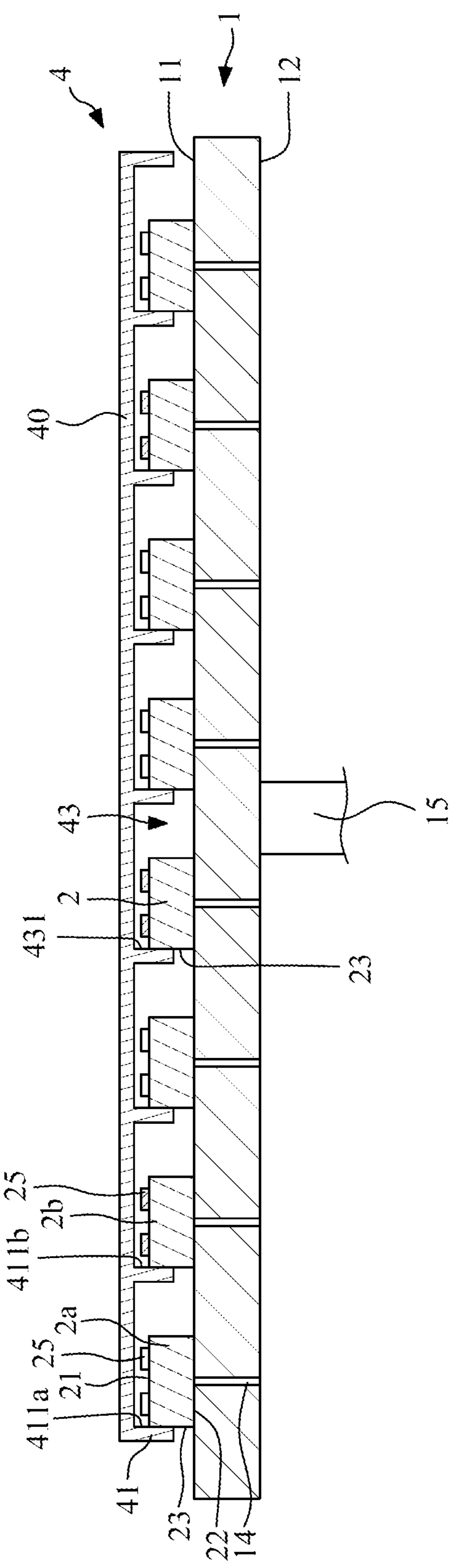
Figure 4B:
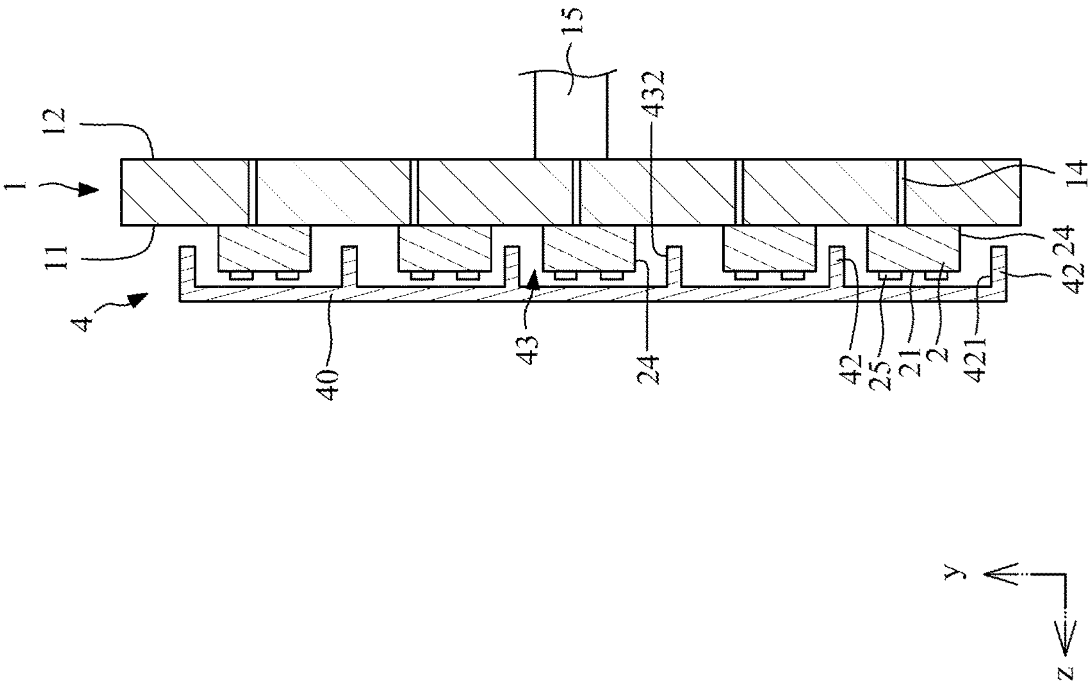

Referring to FIG. 4, FIG. 4A and FIG. 4B, the frame 4 is pushed to move along the first direction 51 such as the x-axis direction. FIG. 4A illustrates a cross-sectional view taken along line 4A-4A of FIG. 4. FIG. 4B illustrates a cross-sectional view taken along line 4B-4B of FIG. 4. The first direction 51, such as the x-axis direction, may be substantially parallel with the top surface 11 of the first carrier 1. Meanwhile, the elements 2 may rotate so that the first inner surface 411 of the first strip portion 41 (i.e., the first reference plane) of the frame 4 or the first sidewall 431 of the unit space 43 may contact the first surface 23 of the element(s) 2 by face-to-face contact. For example, the first portion 411*a* may contact the first surface 23 of the first element 2*a*, the second portion 411*b* may contact the first surface 23 of the second element 2*b*, and the second portion 411*c* may contact the first surface 23 of the second element 2*c*. In some embodiments, the elements 2 may slide until the lateral surfaces (e.g., the first surfaces 23) of the elements 2 lean on the sidewalls (e.g., the first portion 411*a* and the second portion 411*c*) respectively.

Thus, the elements 2 (including the first electrical element (s) 2*a* and the second electrical element(s) 2*b*, 2*c*) may relatively move with respect to each other along the first direction 51 such as the x-axis direction. The elements 2 (including the first electrical element(s) 2*a* and the second electrical element(s) 2*b*, 2*c*) may relatively rotate with respect to each other. In addition, the first inner surface 411 of the first strip portion 41 (i.e., the first reference plane) of the frame 4 or the first sidewall 431 of the unit space 43 may simultaneously push the first surfaces 23 of the elements 2 (including the first electrical element(s) 2*a* and the second electrical element(s) 2*b*, 2*c*) so that the elements 2 may rotate and/or may slide or move toward the first direction 51 simultaneously for a distance. Therefore, the first surfaces 23 of the elements 2 (including the first electrical element(s) 2*a* and the second electrical element 2*c*) are substantially aligned with each other along the second direction such as the y-axis direction. For example, the first surfaces 23 of the first column 31 of the elements 2 (e.g., the first electrical element 2*a* and the second electrical element 2*c*) are substantially aligned with each other along the second direction, and the first surfaces 23 of the second column 32 of the elements 2 (e.g., the second electrical element(s) 2*b*) are substantially aligned with each other along the second direction. The first surfaces 23 of the first column 31 of the elements 2 are substantially parallel with the first surfaces 23 of the second column 32 of the elements 2.

In some embodiments, the frame 4 may simultaneously move (e.g., push and/or rotate) the first electrical element 2*a* and the second electrical element 2*c* until the first surface 23 of the first electrical element 2*a* is substantially aligned with the first surface 23 of the second electrical element 2*c* from a top view. For example, the first electrical element 2*a* may be pushed and/or rotated by using the first portion 411*a* of the first strip portion 41 (e.g., the first sidewall) of the frame 4. The second electrical element 2*c* may be pushed and/or rotated by using the second portion 411*c* of the first strip portion 41 (e.g., the first sidewall) of the frame 4.

Figure 5:
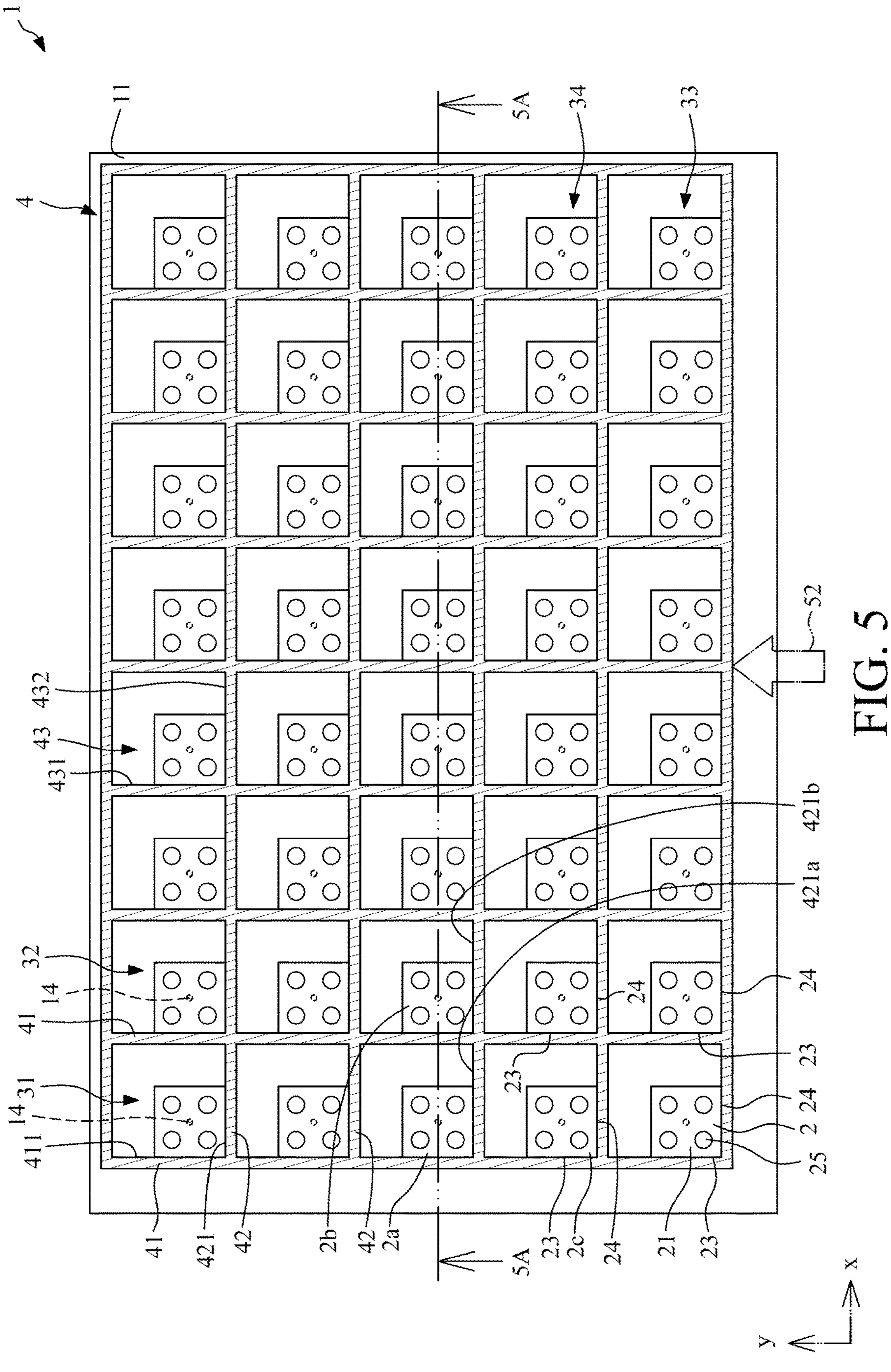
Figure 5A:
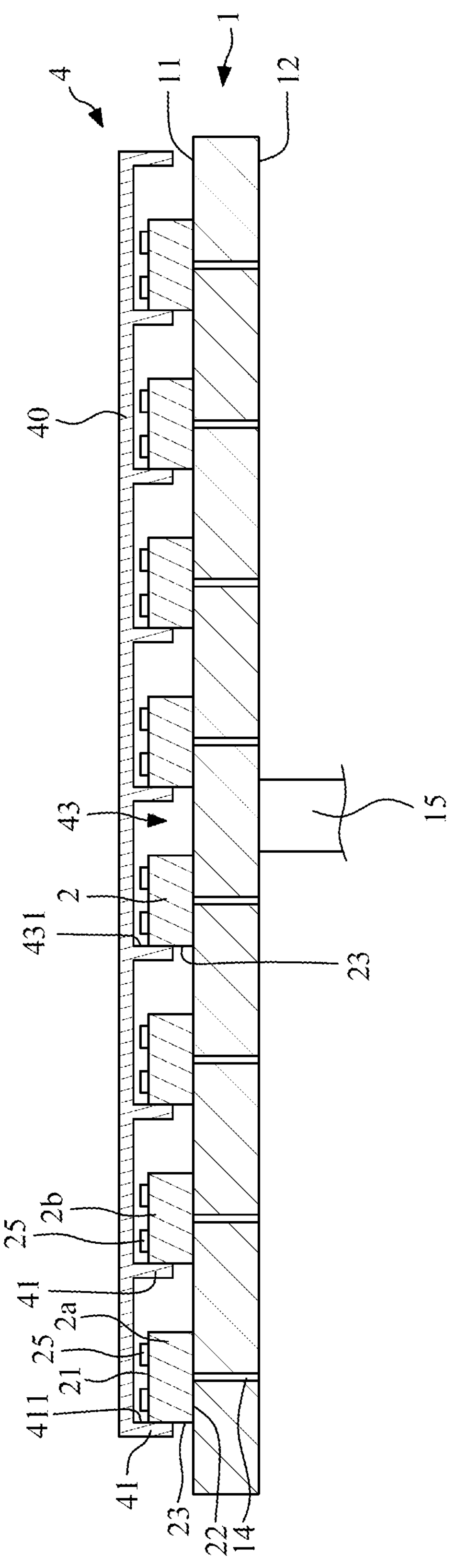
Figure 5B:
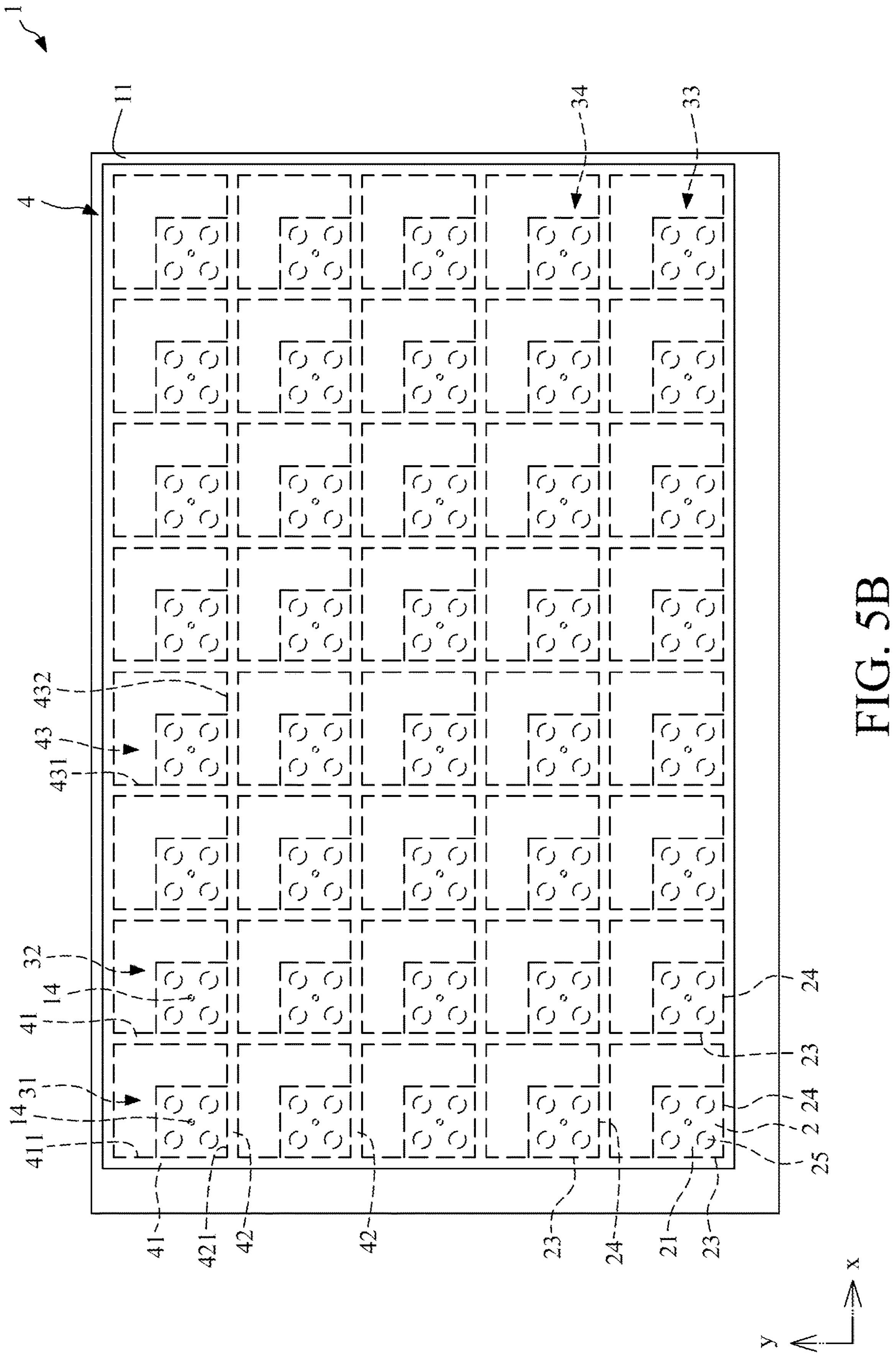

Referring to FIG. 5, FIG. 5A and FIG. 5B, the frame 4 is pushed to move along the second direction 52 such as the y-axis direction. FIG. 5A illustrates a cross-sectional view taken along line 5A-5A of FIG. 5. The second direction 52 may be non-parallel with the first direction 51 from a top view. For example, the second direction 52 may be perpendicular to the first direction 51 from the top view. Meanwhile, the second inner surface 421 of the second strip portion 42 (i.e., the second reference plane) of the frame 4 or the second sidewall 432 of the unit space 43 may contact the second surface 24 of the element(s) 2 by face-to-face contact. For example, the first portion 421*a* may contact the second surface 24 of the first element 2*a*, and the second portion 421*b* may contact the second surface 24 of the second element 2*b*. In addition, the second inner surface 421 of the second strip portion 42 (i.e., the second reference plane) of the frame 4 or the second sidewall 432 of the unit space 43 may push the second surfaces 24 of the elements 2 (including the first electrical element(s) 2*a* and the second electrical element(s) 2*b*, 2*c*) so that the elements 2 may slide or move toward the second direction 52 simultaneously for a distance. Further, the corner of the element 2 may contact the corner of the unit space 43. Therefore, the second surfaces 24 of the elements 2 (including the first electrical element(s) 2*a* and the second electrical element(s) 2*b*, 2*c*) are substantially aligned with each other along the first direction 51 such as the x-axis direction. For example, the second surfaces 24 of the first row 33 of the elements 2 (including, for example, the first electrical element(s) 2*a* and the second electrical element(s) 2*b*) are substantially aligned with each other along the first direction 51, and the second surfaces 24 of the second row 34 of the elements 2 (including, for example, the first second element(s) 2*c*) are substantially aligned with each other along the first direction 51. The second surfaces 24 of the first row 33 of the elements 2 are substantially parallel with the second surfaces 24 of the second row 34 of the elements 2. Therefore, the elements 2 (including the first electrical element(s) 2*a* and the second electrical element(s) 2*b*, 2*c*) may be substantially aligned with each other along the second direction and the first direction. Thus, the frame 4 may make the electrical elements 2 move relative to the first carrier 1 until the electrical elements 2 enter the predetermined areas 13 respectively from the top view.

FIG. 5B illustrates a top view of FIG. 5, wherein the cover portion 40 of the frame 4 is included. The elements 2 are covered by the cover portion 40, thus, they are shown in dotted lines. Further, the first strip portions 41 and the second strip portions 42 are also covered by the cover portion 40, thus, they are also shown in dotted lines. In addition, FIG. 5A may be a cross-sectional view of FIG. 5B.

Figure 6:
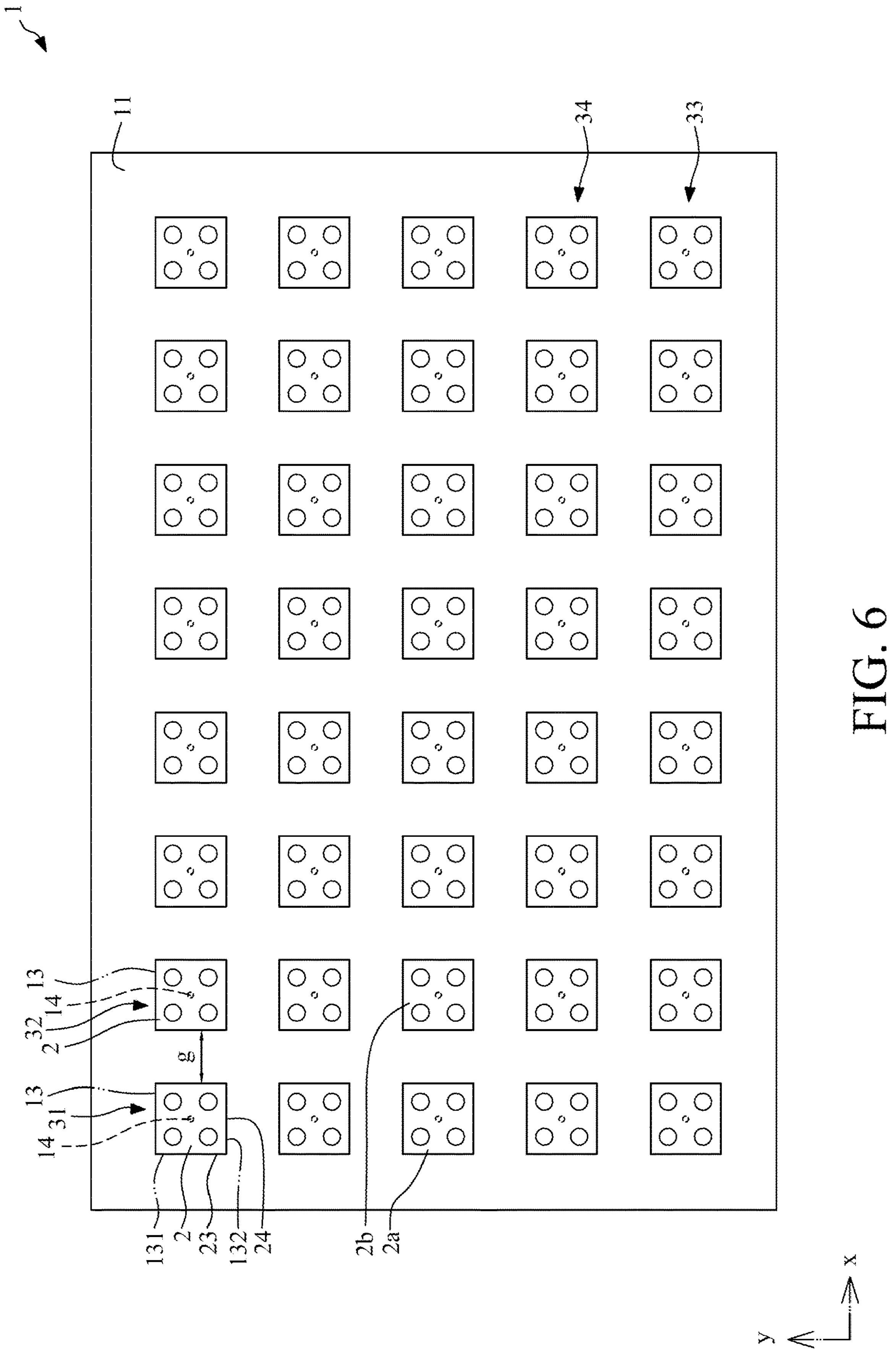

Referring to FIG. 6, the frame 4 is removed. Each of the elements 2 may be substantially aligned with a respective one of the predetermined areas 13. Each of the elements 2 may be disposed in and fit the respective one of the predetermined areas 13. The shift problem and/or the rotation problem during the pick-and-place process may be eliminated. As shown in FIG. 6, a gap g between two opposite sides of two adjacent elements 2 is consistent.

Figure 7:
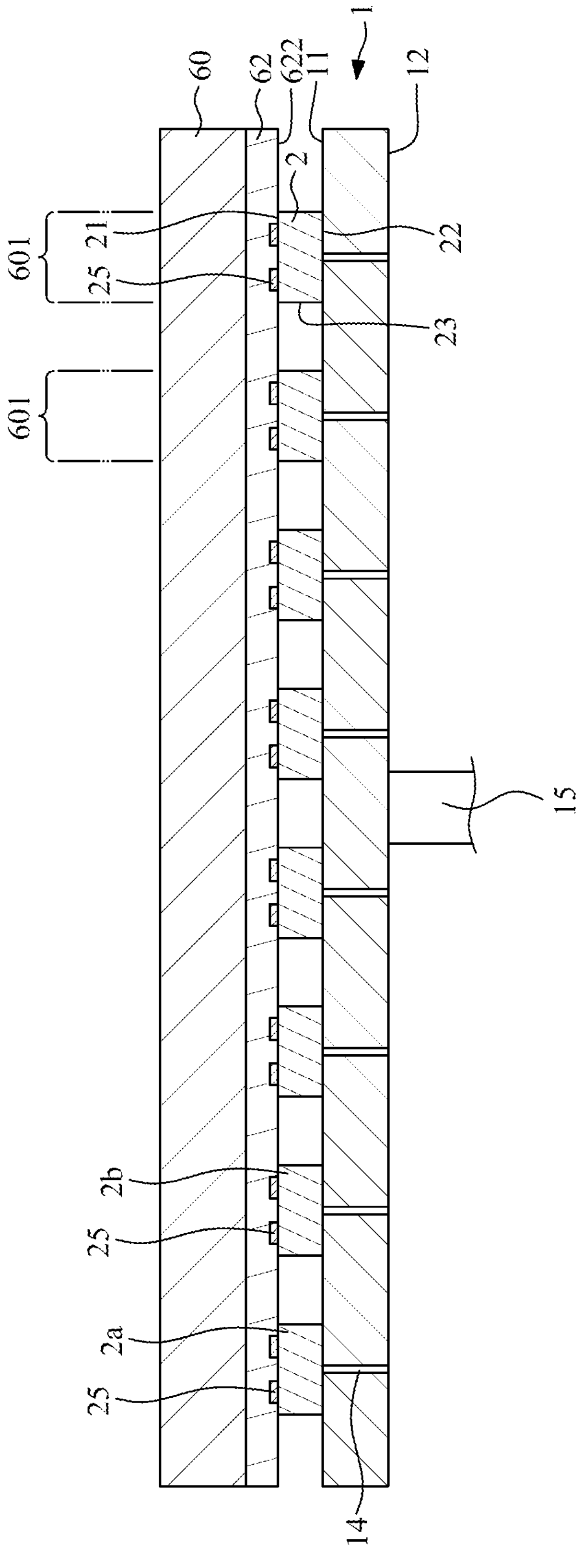

Referring to FIG. 7, the elements 2 (including the first electrical element(s) 2*a* and the second electrical element(s) 2*b*, 2*c*) may be attached on the top surface 11 of the first carrier 1. A negative pressure is created between the elements 2 and the top surface 11 of the first carrier 1. In some embodiments, a negative pressure is created on the top surface 11 of the first carrier 1 through the suction holes 14 to suck the elements 2 (including the first electrical element(s) 2*a* and the second electrical element(s) 2*b*, 2*c*). For example, a first negative pressure may be created between the first electrical element 2*a* and the first carrier 1, and a second negative pressure may be created between the second electrical element 2*b*, 2*c* and the first carrier 1. The first negative pressure and the second negative pressure may be created simultaneously or individually. Then, a second carrier 60 is provided. The second carrier 60 may define a plurality of predetermined areas 601 arranged in an array. The predetermined areas 601 of the second carrier 60 may correspond to or may be aligned with the predetermined areas 13 of the first carrier 1. If the predetermined areas 601 of the second carrier 60 are not aligned with the predetermined areas 13 of the first carrier 1, the design of the locations of the singulation lines 63 in FIG. 10 should consider the shift between the predetermined areas 601 of the second carrier 60 and the predetermined areas 13 of the first carrier 1.

The second carrier 60 may include a buffer layer 62 disposed on a surface of the second carrier 60. The buffer layer 62 may have a surface 622 opposite to the second carrier 60. The buffer layer 62 may be an adhesive layer or an adhesive tape. Then, the first carrier 1 and the elements 2 (including the first electrical element(s) 2*a* and the second electrical element(s) 2*b*, 2*c*) may be moved to a position corresponding to the second carrier 60. Alternatively, the second carrier 60 with the buffer layer 62 may be moved to a position corresponding to the first carrier 1. Then, the first carrier 1 may move toward the second carrier 60, or the second carrier 60 may move toward the first carrier 1. Thus, the first surfaces 21 of the elements 2 may contact the surface 622 of the buffer layer 62. In some embodiments, the first surfaces 21 of the elements 2 may be adhered to the surface 622 of the buffer layer 62, and the metal studs 25 of the elements 2 may be embedded in, inserted into, drawn into, or enclosed by the buffer layer 62. The elements 2 are simultaneously disposed to the second carrier 60. Thus, the elements 2 (including the first electrical element(s) 2*a* and the second electrical element(s) 2*b*, 2*c*) may be simultaneously transferred to the second carrier 60.

Figure 8:
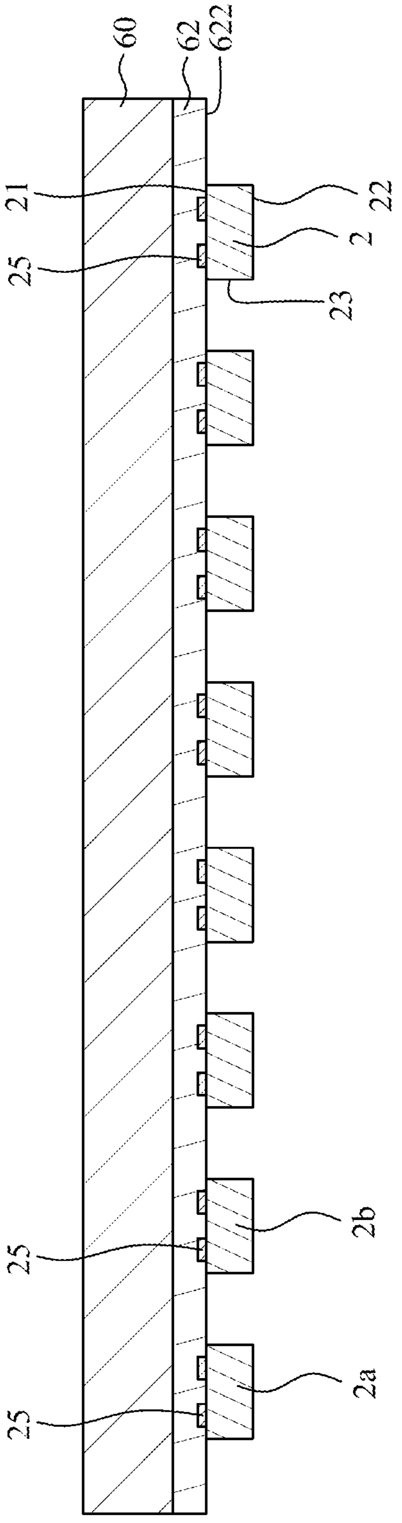

Referring to FIG. 8, the negative pressure (including, for example, the first negative pressure and the second negative pressure) may be released. Then, the first carrier 1 may be removed. Thus, the elements 2 are simultaneously transferred to the second carrier 60. The first surfaces 21 of the elements 2 (including the first electrical element(s) 2*a* and the second electrical element(s) 2*b*, 2*c*) may be substantially aligned with the surface 622 of the buffer layer 62.

Figure 9:
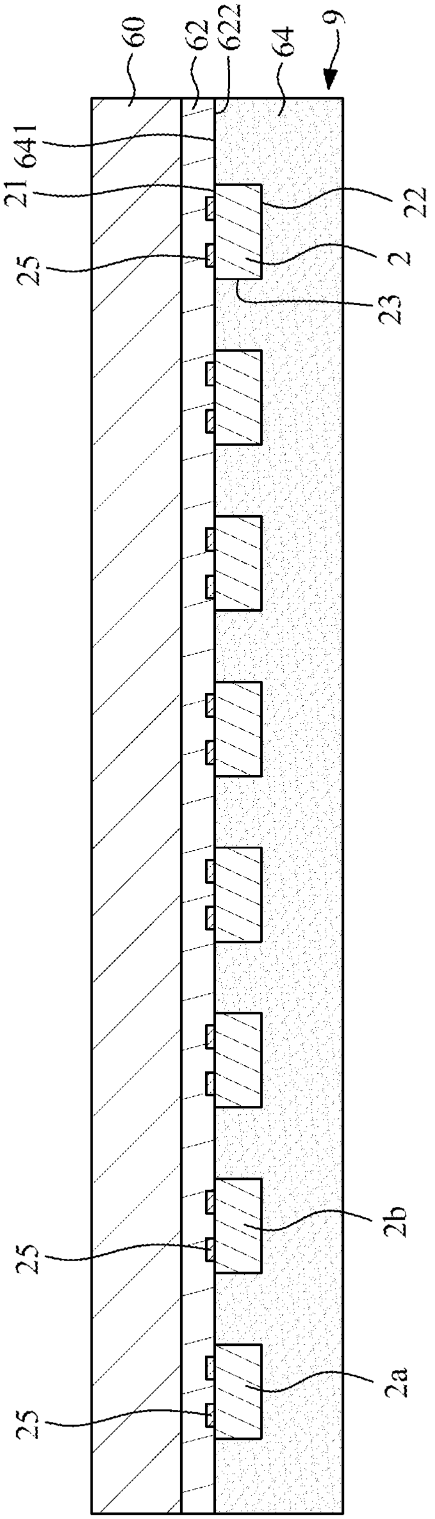

Referring to FIG. 9, an encapsulant 64 (e.g., a molding compound) may be applied to encapsulate the elements 2 (including the first electrical element(s) 2*a* and the second electrical element(s) 2*b*, 2*c*) to form a molded substrate 9. The encapsulant 64 may cover the surface 622 of the buffer layer 62. Thus, a surface 641 of the encapsulant 64 may contact the surface 622 of the buffer layer 62.

Figure 10:
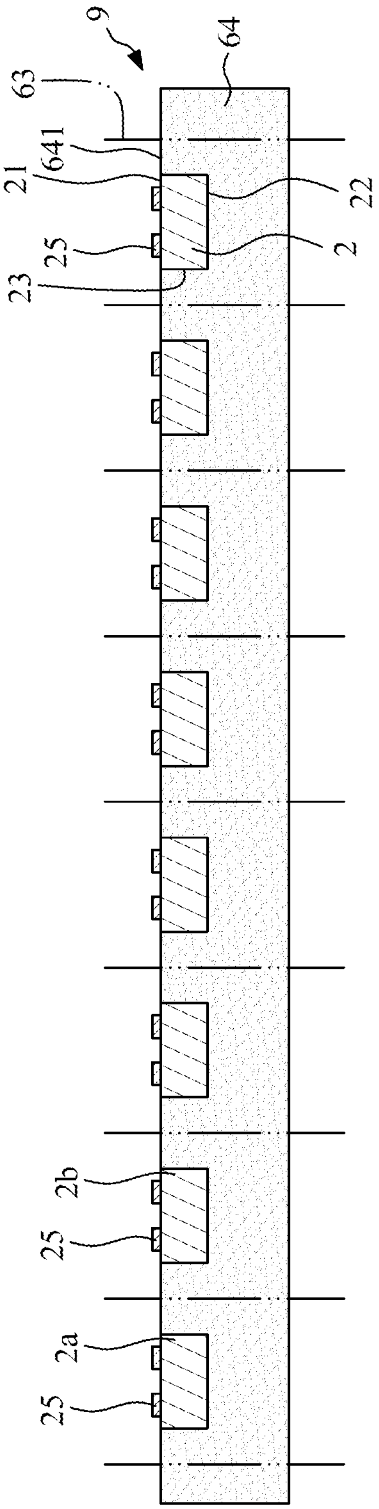

Referring to FIG. 10, the second carrier 60 with the buffer layer 62 may be removed. Thus, the surface 641 of the encapsulant 64 may be substantially aligned with the first surfaces 21 of the elements 2. The molded substrate 9 (e.g., the encapsulant 64) may have a plurality of singulation lines 63. In some embodiments, the surface 641 of the molded substrate 9 (e.g., the encapsulant 64) may be ground to expose the metal studs 25 of the elements 2.

Figure 11:
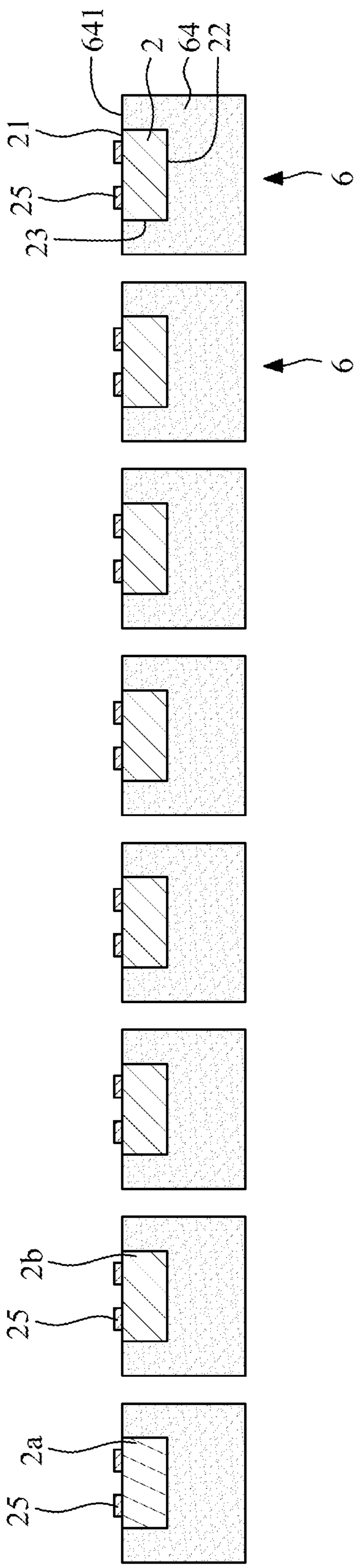

Referring to FIG. 11, the molded substrate 9 (e.g., the encapsulant 64) may be singulated along the singulation lines 63 to form a plurality of package structures 6.

In the embodiment illustrated in FIG. 1 to FIG. 11, the elements 2 may be aligned simultaneously and concurrently, thus, a production rate of units per hour (UPH) for the method for manufacturing the package structure 6 may be improved.

Figure 12:
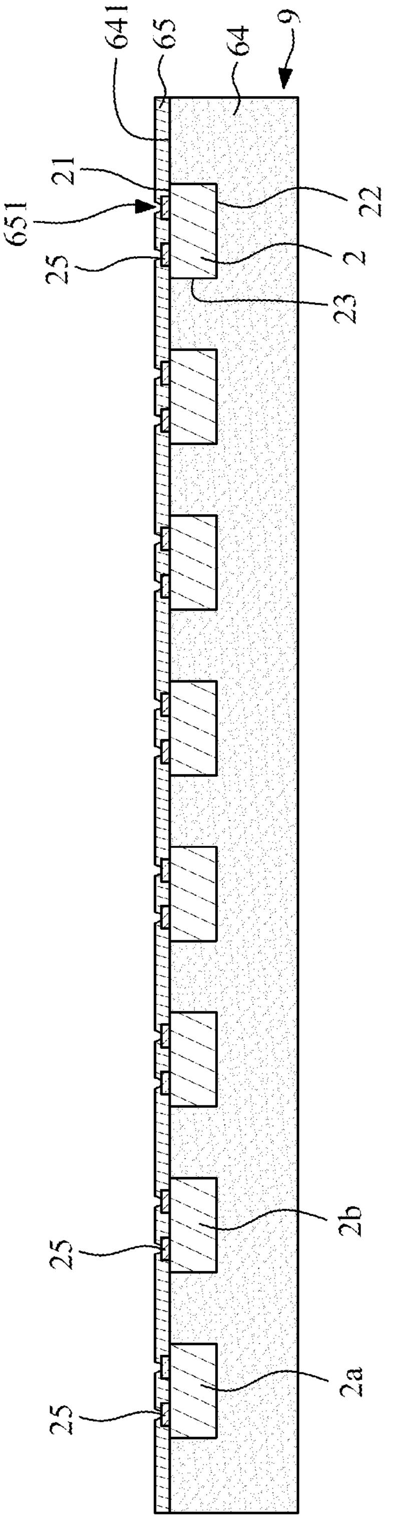
FIG. 12 to FIG. 16 illustrate a method for manufacturing a package structure according to some embodiments of the present disclosure.

FIG. 12 to FIG. 16 illustrate a method for manufacturing a package structure according to some embodiments of the present disclosure. The initial several stages of the method corresponding to FIG. 12 to FIG. 16 are the same as, or at least similar to, the stages illustrated in FIG. 1 to FIG. 10. FIG. 12 depicts a stage subsequent to that depicted in FIG. 10.

Referring to FIG. 12, a first dielectric layer 65 may be formed or disposed on the surface 641 of the molded substrate 9 (e.g., the encapsulant 64) and the first surfaces 21 of the elements 2. Then, a plurality of openings 651 may be formed in the first dielectric layer 65 to expose the metal studs 25 of the elements 2.

Figure 13:
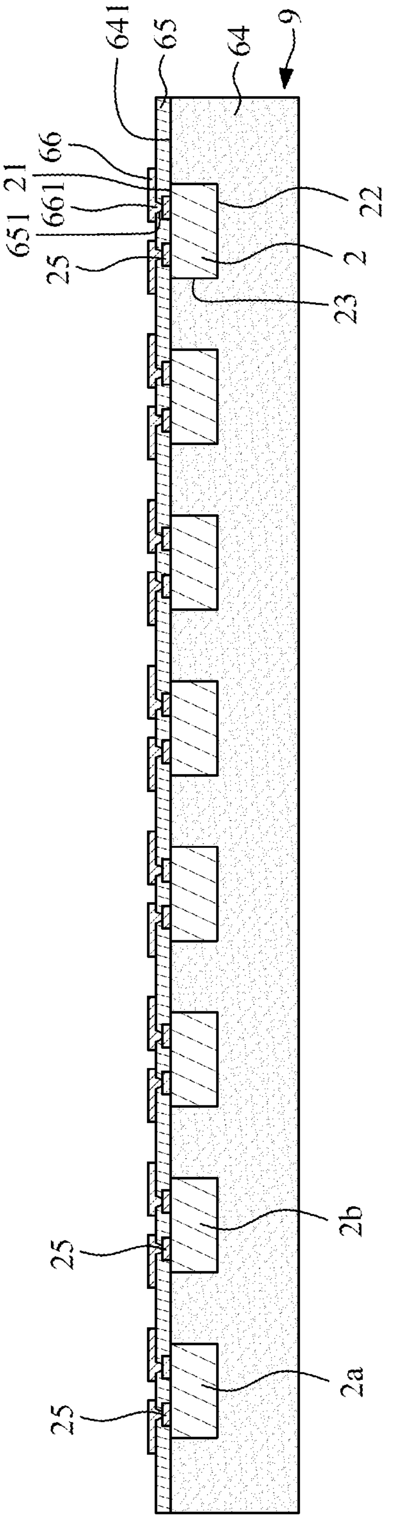

Referring to FIG. 13, a redistribution layer 66 or a circuit layer may be formed or disposed on the first dielectric layer 65. The redistribution layer 66 may include a plurality of via portions 661 disposed in the openings 651 of the first dielectric layer 65 to physically connect or electrically connect the metal studs 25 of the elements 2. The via portions 661 may taper toward the elements 2.

Figure 14:
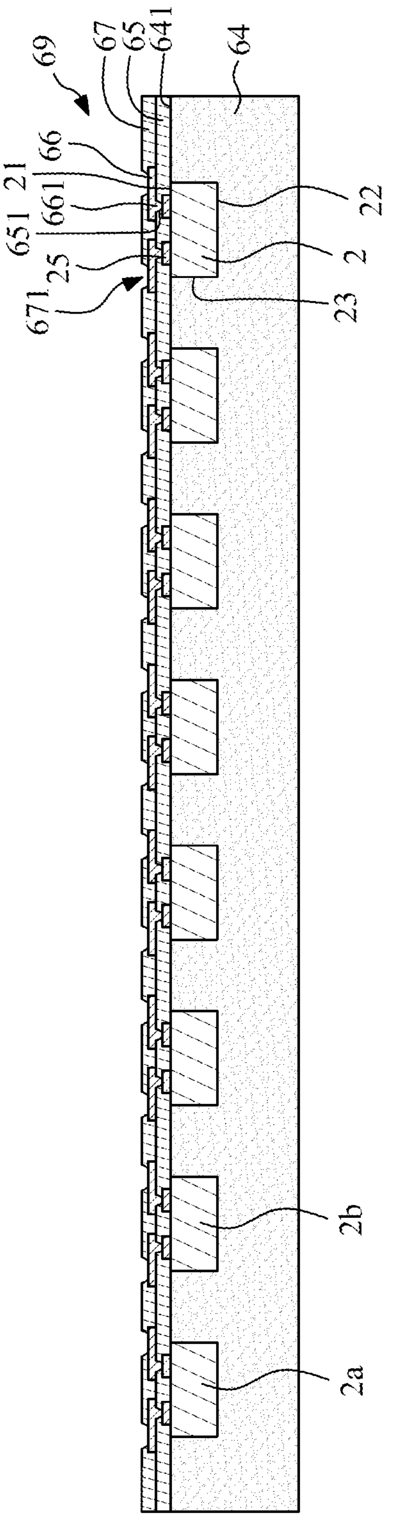

Referring to FIG. 14, a second dielectric layer 67 may be formed or disposed on the first dielectric layer 65 to cover the redistribution layer 66. Then, a plurality of openings 671 may be formed in the second dielectric layer 67 to expose a portion of the redistribution layer 66. The first dielectric layer 65, the redistribution layer 66 and the second dielectric layer 67 may form a redistribution structure 69. Thus, the redistribution structure 69 may be formed on the molded substrate 9 (e.g., the encapsulant 64). In some embodiments, the redistribution structure 69 may electrically connect the first electrical element(s) 2*a* and the second electrical element(s) 2*b*, 2*c*.

Figure 15:
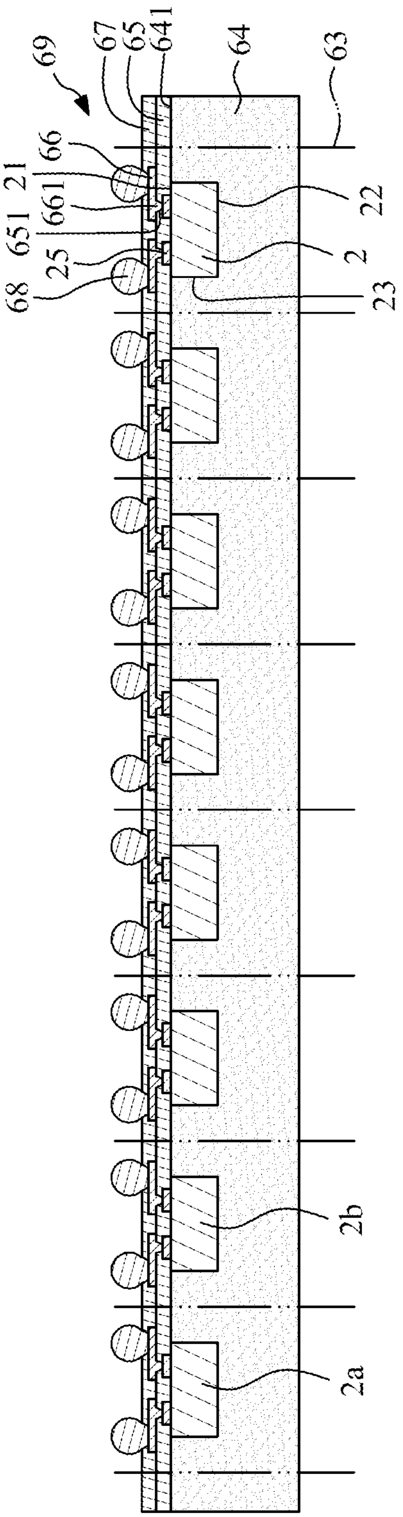

Referring to FIG. 15, a plurality of connecting elements 68 (e.g., solder balls) may be formed or disposed in the openings 671 of the second dielectric layer 67 to physically connect or electrically connect the redistribution layer 66. The encapsulant 64 may have a plurality of singulation lines 63.

Figure 16:
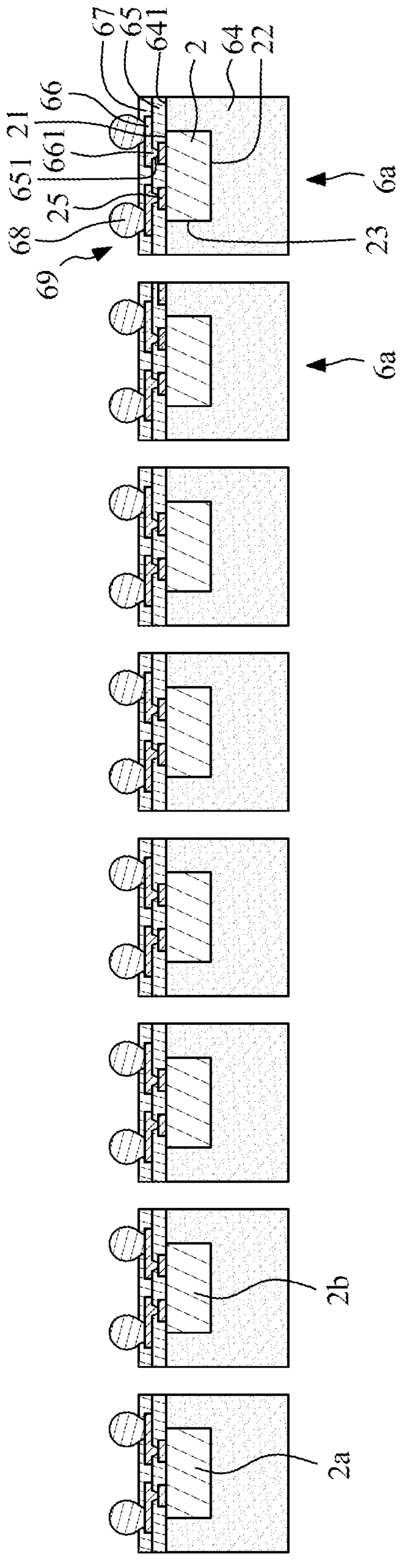

Referring to FIG. 16, the molded substrate 9 (e.g., the encapsulant 64) may be singulated along the singulation lines 63 to form a plurality of package structures 6*a*. The package structures 6*a* may include one element 2. Alternatively, the package structures 6*a* may include a plurality of elements 2 (including the first electrical element(s) 2*a* and the second electrical element(s) 2*b*, 2*c*).

Figure 17:
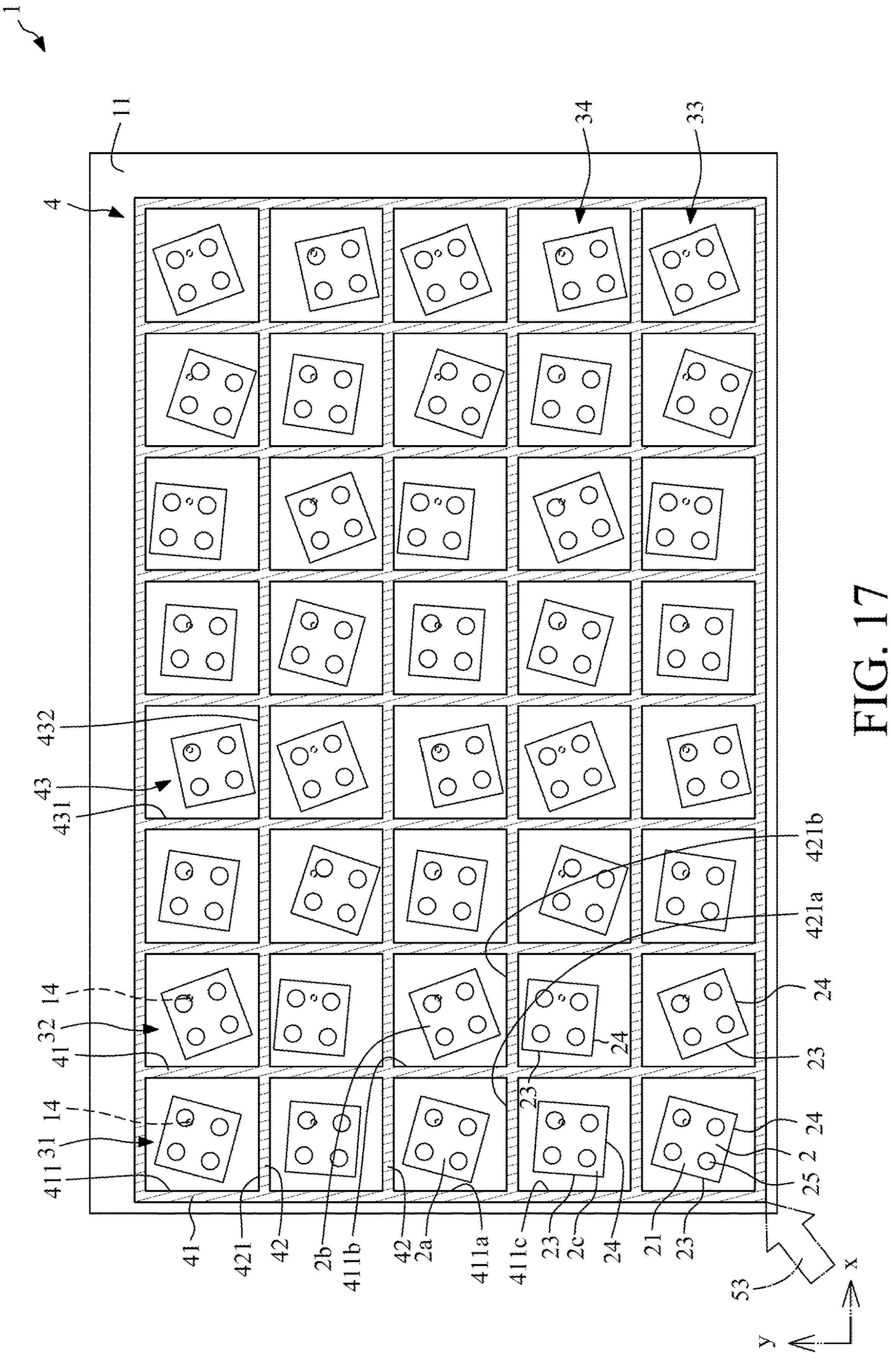
FIG. 17 to FIG. 18 illustrate a method for manufacturing a package structure according to some embodiments of the present disclosure.
Figure 18:
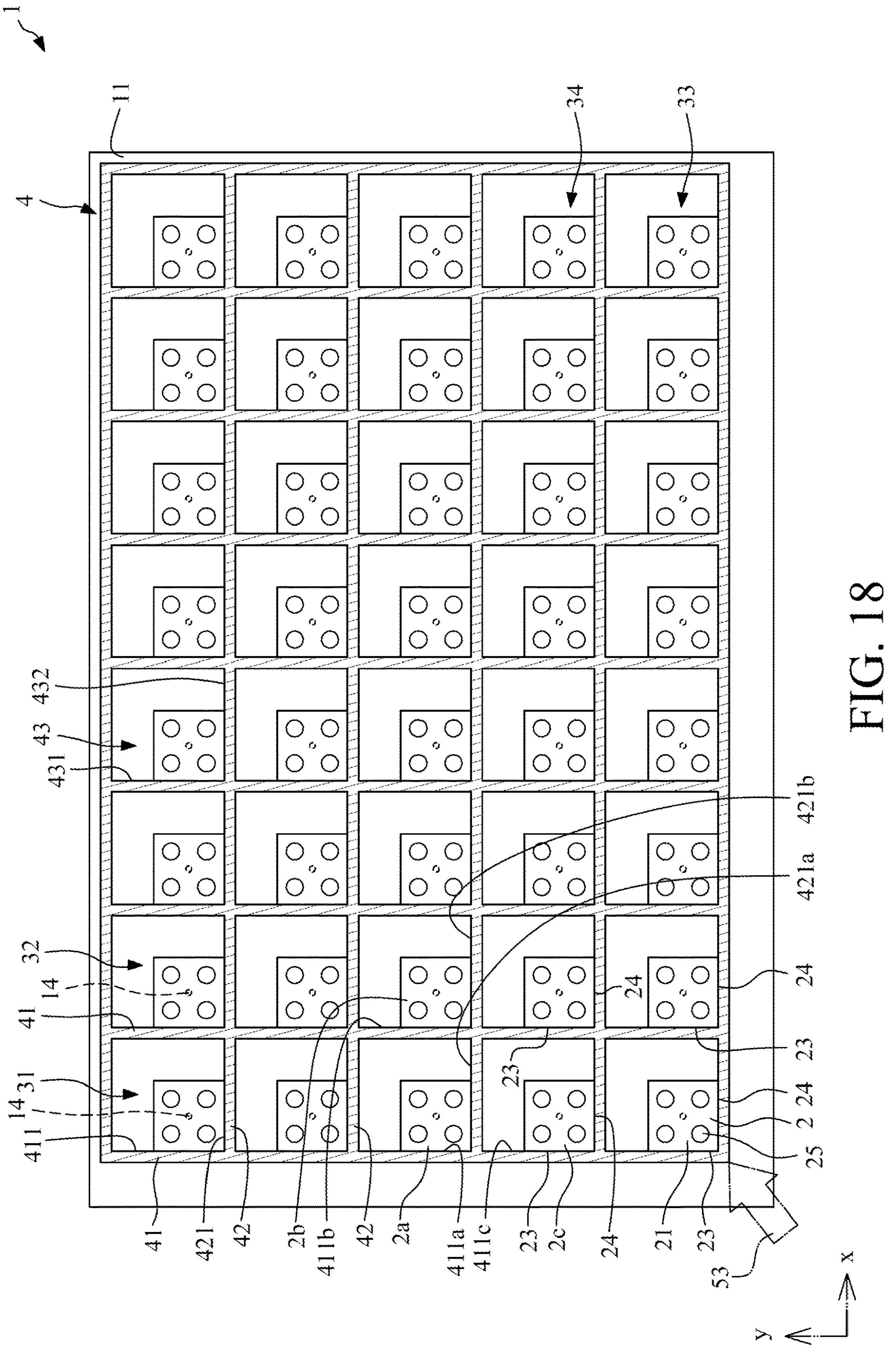

FIG. 17 to FIG. 18 illustrate a method for manufacturing a package structure according to some embodiments of the present disclosure. The initial several stages of the method corresponding to FIG. 17 to FIG. 18 are the same as, or at least similar to, the stages illustrated in FIG. 1 to FIG. 3A. FIG. 17 depicts a stage subsequent to that depicted in FIG. 3A.

Referring to FIG. 17 and FIG. 18, the frame 4 is pushed to move along a third direction 53. The third direction 53 may be non-parallel with the first direction 51 and the second direction 52. For example, an inclination angle between the third direction 53 and the first direction 51 may be 45 degrees. An inclination angle between the third direction 53 and the second direction 52 may be 45 degrees. Meanwhile, the elements 2 (including the first electrical element(s) 2*a* and the second electrical element(s) 2*b*) may rotate so that the first inner surface 411 of the first strip portion 41 (i.e., the first reference plane) of the frame 4 or the first sidewall 431 of the unit space 43 may contact the first surface 23 of the element(s) 2 by face-to-face contact. In addition, the second inner surface 421 of the second strip portion 42 (i.e., the second reference plane) of the frame 4 or the second sidewall 432 of the unit space 43 may contact the second surface 24 of the element(s) 2 by face-to-face contact. The corner of the unit space 43 may contact the corner of the element 2. The frame 4 may push the elements 2 to slide or move toward the third direction 53 simultaneously for a distance. Therefore, the first surfaces 23 of the elements 2 are substantially aligned with each other along the second direction such as the y-axis direction, and the second surfaces 24 of the elements 2 are substantially aligned with each other along the first direction such as the x-axis direction. It may be understood that the positions of the elements 2 and the frame 4 of FIG. 18 may be same as the positions of the elements 2 and the frame 4 of FIG. 5.

The following stages of the method corresponding to FIG. 17 to FIG. 18 are the same as, or at least similar to, the stages illustrated in FIG. 6 to FIG. 11 so as to obtain the package structures 6 of FIG. 11.

Figure 19:
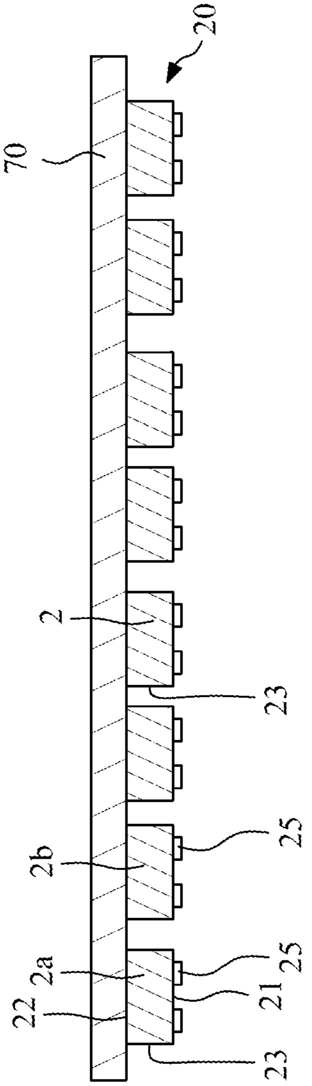
FIG. 19 to FIG. 28 illustrate a method for manufacturing a package structure according to some embodiments of the present disclosure.

FIG. 19 to FIG. 28 illustrate a method for manufacturing a package structure according to some embodiments of the present disclosure. Referring to FIG. 19, a wafer 20 may be attached to a dicing tape 70, and then singulated to form a plurality of elements 2 (including the first electrical element(s) 2*a* and the second electrical element(s) 2*b*, 2*c*). The element 2 of FIG. 19 may be same as or similar to the element 2 of FIG. 2A and FIG. 2B. In some embodiments, each of the elements 2 may have a top surface 21 (e.g., an active surface), a bottom surface 22 (e.g. a backside surface), a first surface 23 (e.g., a first lateral surface) and a second surface (e.g., a second lateral surface). The bottom surface 22 may be opposite to the top surface 21. The first surface 23 and the second surface may extend between the top surface 21 and the bottom surface 22. In addition, the element 2 may include a plurality of metal studs 25 disposed adjacent to the top surface 21. The bottom surface 22 of the element 2 may contact or may be adhered to the dicing tape 70.

Figure 20:
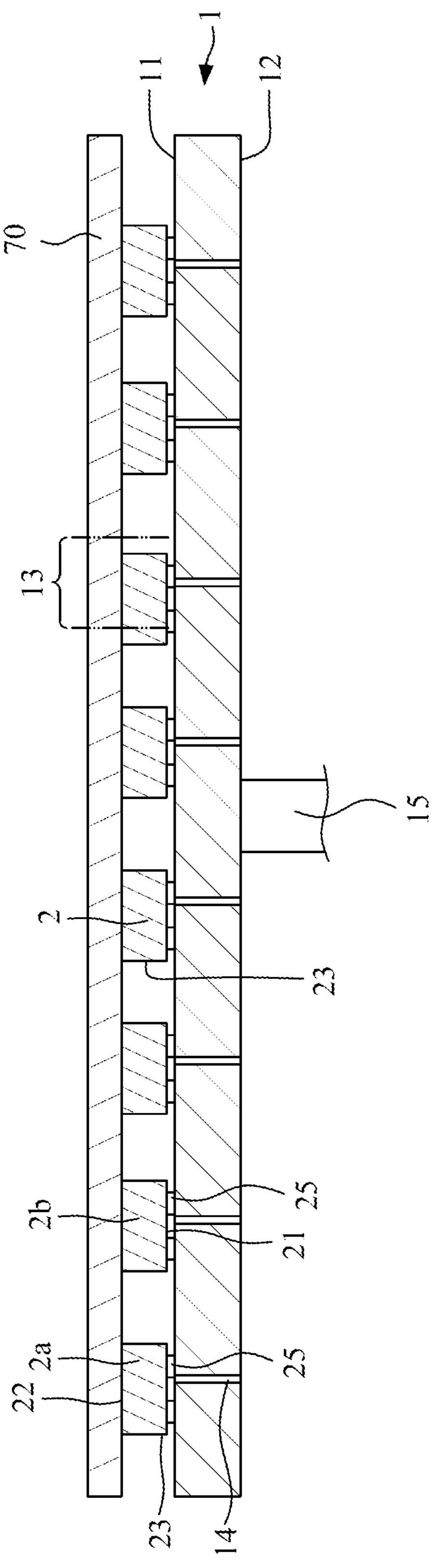

Referring to FIG. 20, the dicing tape 70 may be extended horizontally so that the gap between the elements 2 is enlarged. Then, the dicing tape 70 and the elements 2 are disposed on a first carrier 1. The first carrier 1 of FIG. 20 may be same as or similar to the first carrier 1 of FIG. 1 and FIG. 1A. The first carrier 1 may have a top surface 11 and a bottom surface 12 opposite to the top surface 11. The top surface 11 may be a flat surface so that the component or element may side (such as move and/or rotate) thereon. The first carrier 1 may define a plurality of predetermined areas 13 and a plurality of suction holes 14. Each of the suction holes 14 may have an opening at the top surface 11 within the predetermined areas 13. In some embodiments, the predetermined areas 13 and/or the suction holes 14 may be omitted. As shown in FIG. 20, the elements 2 may be disposed on the top surface 11 of the first carrier 1 simultaneously. The top surface 21 or the metal studs 25 of the element 2 may contact the top surface 11 of the first carrier 1. In some embodiments, the elements 2 may be not aligned with each other. Thus, each of the elements 2 may be misaligned with a respective one of the predetermined areas 13.

Figure 21:
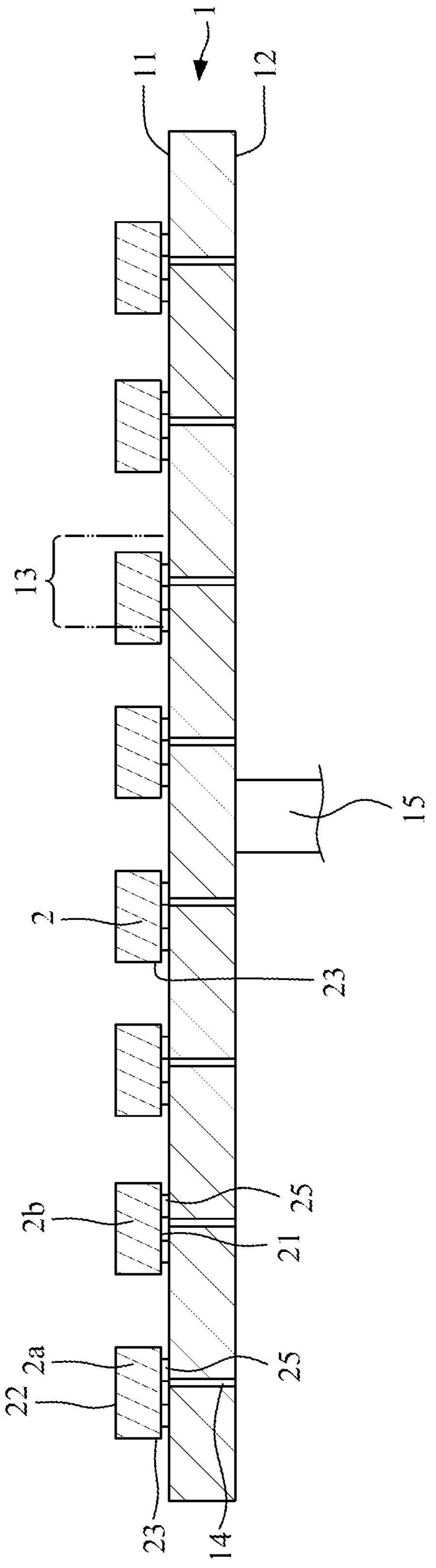

Referring to FIG. 21, a negative pressure is created on the top surface 11 of the first carrier 1 through the suction holes 14 to suck the elements 2 (including the first electrical element(s) 2*a* and the second electrical element(s) 2*b*). Then, the dicing tape 70 is removed.

Figure 22:
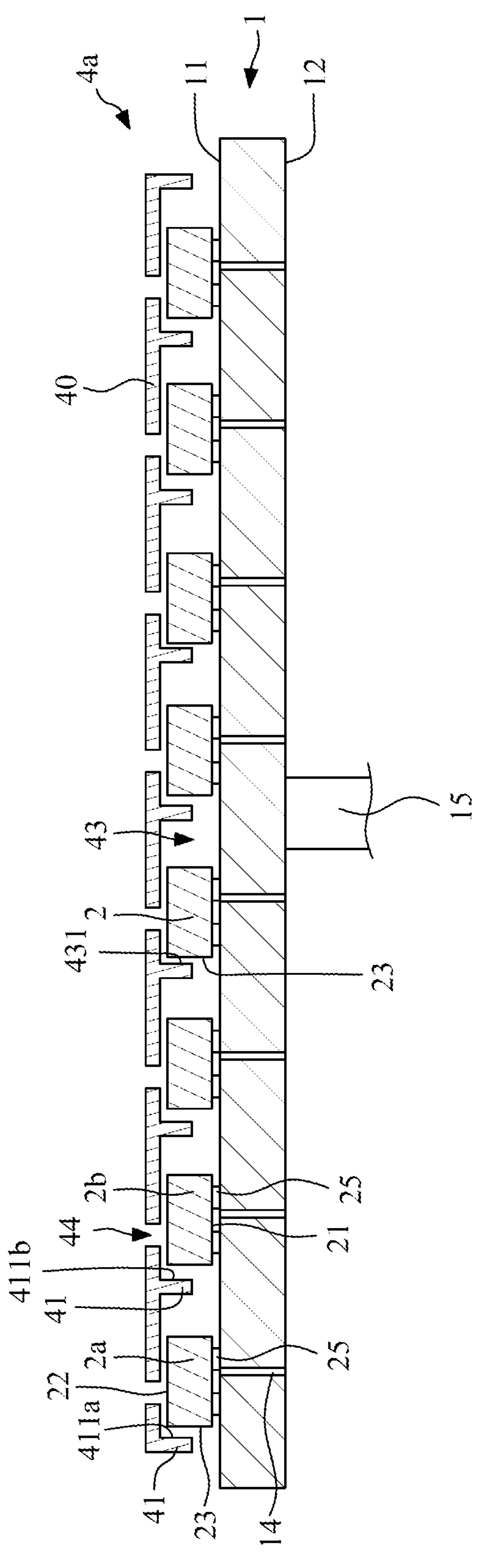

Referring to FIG. 22, a frame 4*a* may be provided. The frame 4*a* of FIG. 22 may be same as or similar to the frame 4 of FIG. 3 and FIG. 3A. The frame 4*a* may include a cover portion 40, a plurality of first strip portions 41 and a plurality of second strip portions 42. The first strip portions 41 may protrude from the cover portion 40, may extend along the second direction such as the y-axis direction, and may be substantially parallel with each other. The second strip portions 42 may protrude from the cover portion 40, may extend along the first direction such as the x-axis direction, and may be substantially parallel with each other. The first strip portions 41 and the second strip portions 42 may be crossed with each other at a predetermined angle (e.g., 90 degrees) so as to define a plurality of unit spaces 43. Each of the unit spaces 43 may accommodate an element 2. Thus, the first strip portions 41 and the second strip portions 42 may be located between the elements 2.

In some embodiments, the frame 4*a* may define a plurality of suction holes 44. The suction holes 44 may extend through the cover portion 40, and may be communicated with a pressure control device (not shown). Alternatively, the suction holes 44 may be communicated with each other. The pressure control device may provide a negative pressure to the unit spaces 43 through the suction holes 44.

Figure 23:
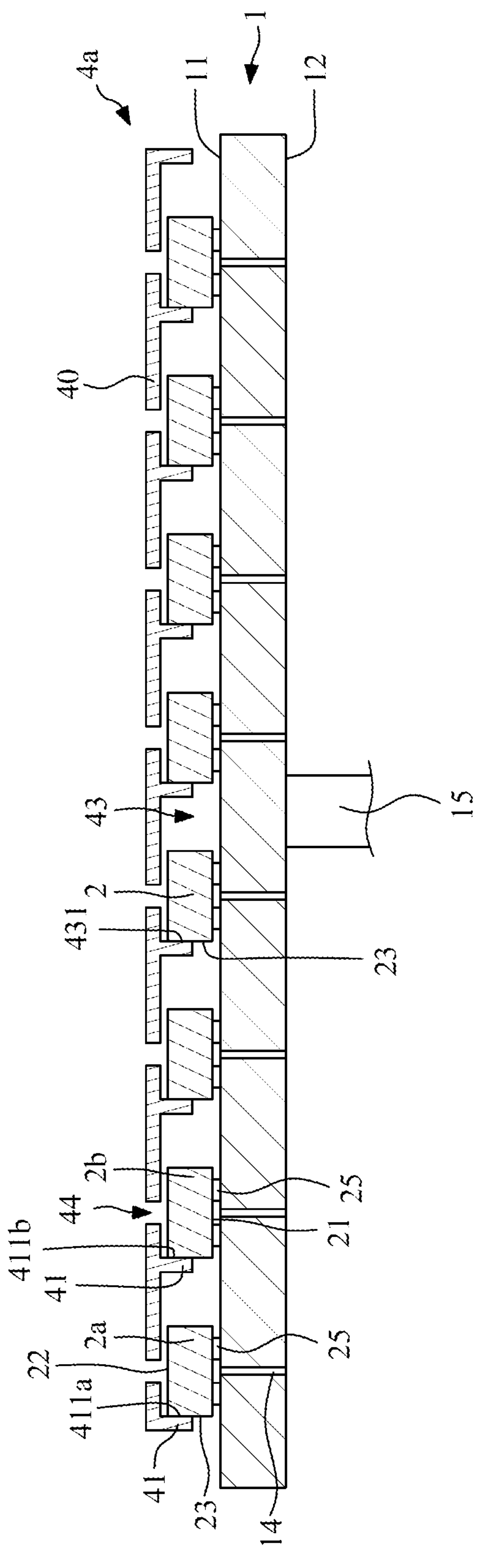

Referring to FIG. 23, the negative pressure created on the top surface 11 of the first carrier 1 through the suction holes 14 is released. Then, the frame 4*a* may be pushed to move along the first direction 51 (e.g., the x-axis direction) as shown in FIG. 4, FIG. 4A and FIG. 4B. Meanwhile, the elements 2 may rotate so that the first inner surface 411 of the first strip portion 41 (i.e., the first reference plane) of the frame 4*a* or the first sidewall 431 of the unit space 43 may contact the first surface 23 of the element(s) 2 by face-to-face contact. In addition, the first inner surface 411 of the first strip portion 41 (i.e., the first reference plane) of the frame 4*a* or the first sidewall 431 of the unit space 43 may push the first surfaces 23 of the elements 2 so that the elements 2 may slide or move toward the first direction 51 simultaneously for a distance. Then, the frame 4*a* may be pushed to move along the second direction 52 (e.g., the y-axis direction) as shown in FIG. 5, FIG. 5A and FIG. 5B. Meanwhile, the second inner surface 421 of the second strip portion 42 (i.e., the second reference plane) of the frame 4*a* or the second sidewall 432 of the unit space 43 may contact the second surface 24 of the element(s) 2 by face-to-face contact. In addition, the second inner surface 421 of the second strip portion 42 (i.e., the second reference plane) of the frame 4*a* or the second sidewall 432 of the unit space 43 may push the second surfaces 24 of the elements 2 so that the elements 2 may slide or move toward the second direction 52 simultaneously for a distance. Further, the corner of the element 2 may contact the corner of the unit space 43. Therefore, the elements 2 may be pushed to slide on the top surface 11 of the first carrier 1 to a predetermined position and/or orientation (i.e., the predetermined area 13). The elements 2 may be substantially aligned with each other along the second direction and the first direction.

Figure 24:
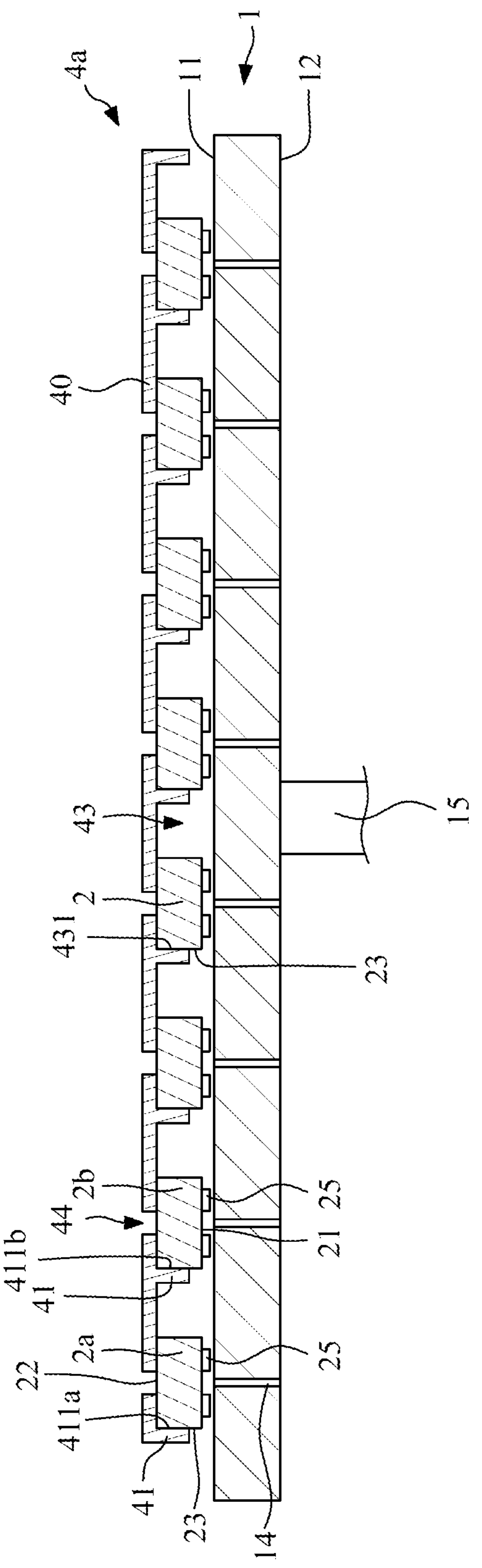

Referring to FIG. 24, a negative pressure is created in the unit spaces 43 of the frame 4*a* through the suction holes 44 to suck the elements 2. The elements 2 may leave the first carrier 1.

Figure 25:
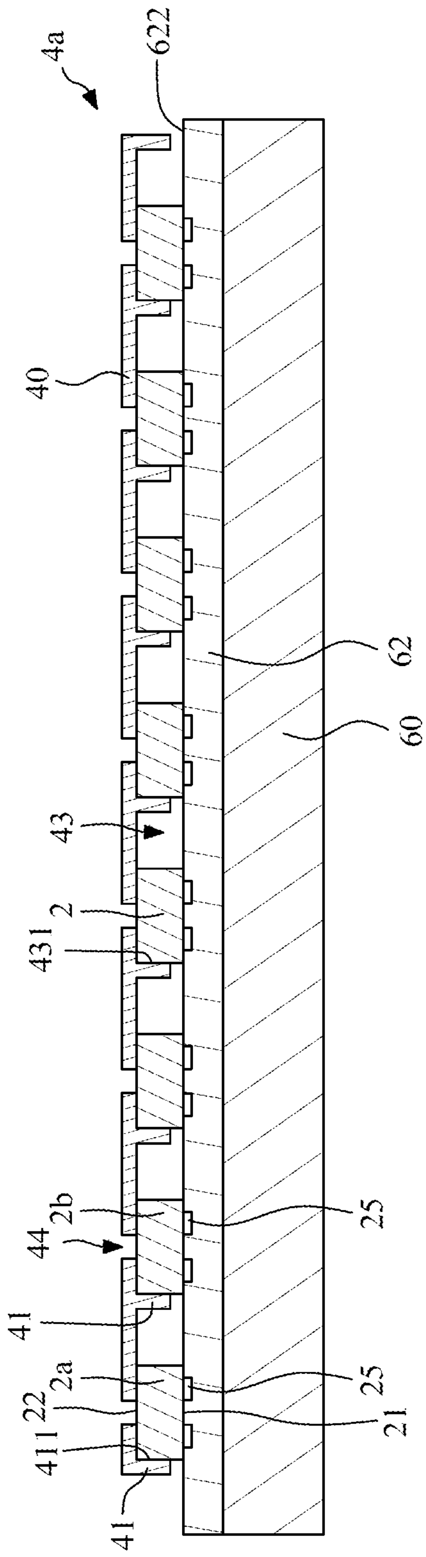

Referring to FIG. 25, a second carrier 60 is provided. The second carrier 60 may include a buffer layer 62 disposed on a surface of the second carrier 60. The buffer layer 62 may have a surface 622 opposite to the second carrier 60. The buffer layer 62 may be an adhesive layer or an adhesive tape. Then, the frame 4*a* and the elements 2 may be moved to a position corresponding to the second carrier 60. Alternatively, the second carrier 60 with the buffer layer 62 may be moved to a position corresponding to the frame 4*a*. Then, the frame 4*a* may move toward the second carrier 60, or the second carrier 60 may move toward the frame 4*a*. Thus, the first surfaces 21 of the elements 2 may contact the surface 622 of the buffer layer 62. In some embodiments, the first surfaces 21 of the elements 2 may be adhered to the surface 622 of the buffer layer 62, and the metal studs 25 of the elements 2 may be embedded in, inserted into, drawn into, or enclosed by the buffer layer 62.

Figure 26:
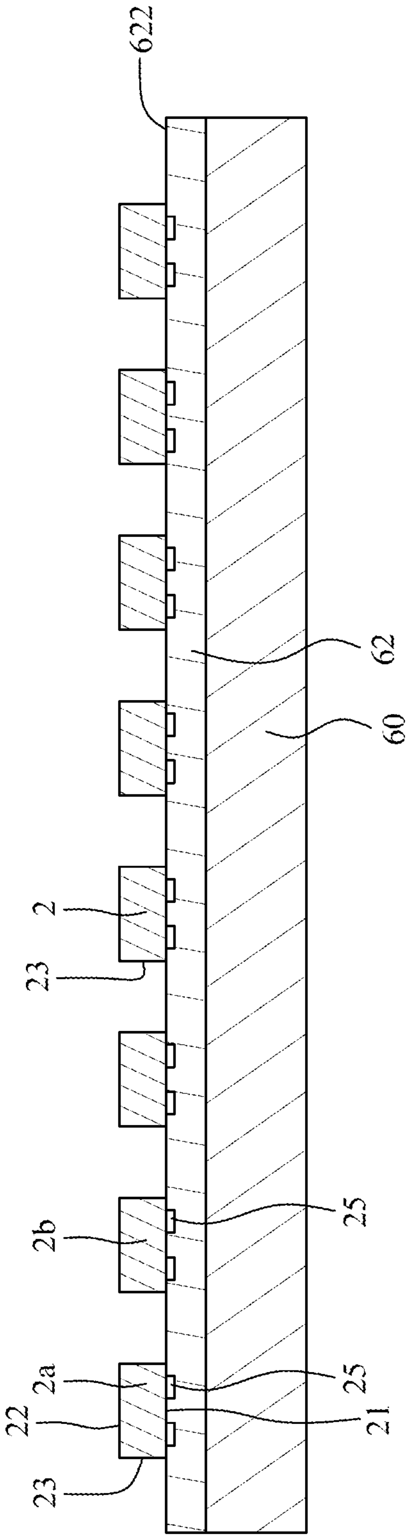

Referring to FIG. 26, the negative pressure created in the unit spaces 43 of the frame 4*a* through the suction holes 44 may be released. Then, the frame 4*a* may be removed. Thus, the elements 2 are simultaneously transferred to the second carrier 60. The first surfaces 21 of the elements 2 may be substantially aligned with the surface 622 of the buffer layer 62.

Figure 27:
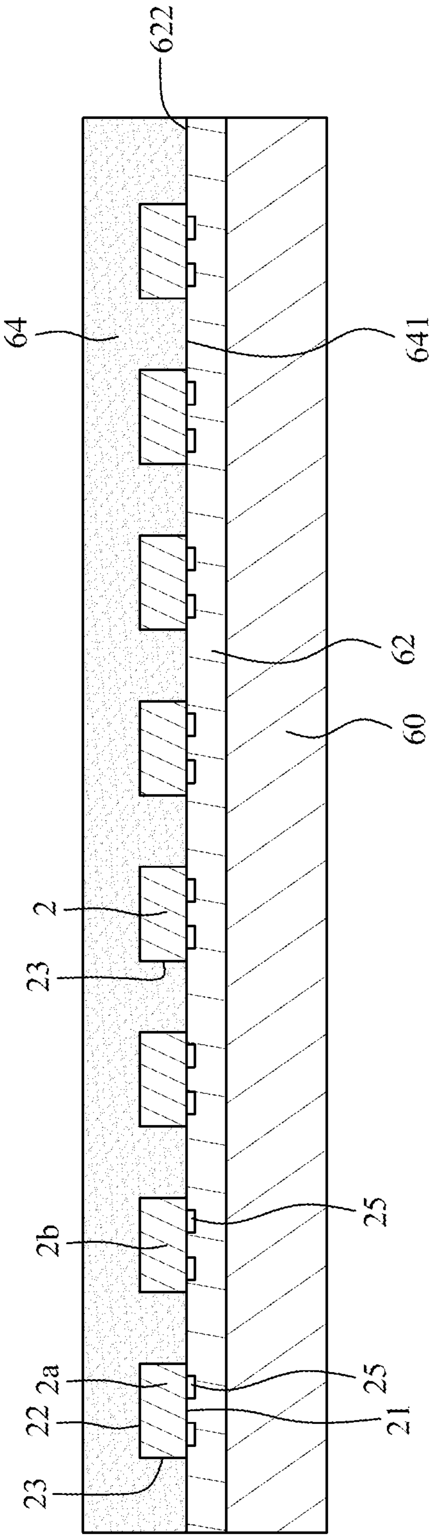

Referring to FIG. 27, an encapsulant 64 (e.g., a molding compound) may be applied to encapsulate the elements 2 to form a molded substrate 9. The encapsulant 64 may cover the surface 622 of the buffer layer 62. Thus, a surface 641 of the encapsulant 64 may contact the surface 622 of the buffer layer 62.

Figure 28:
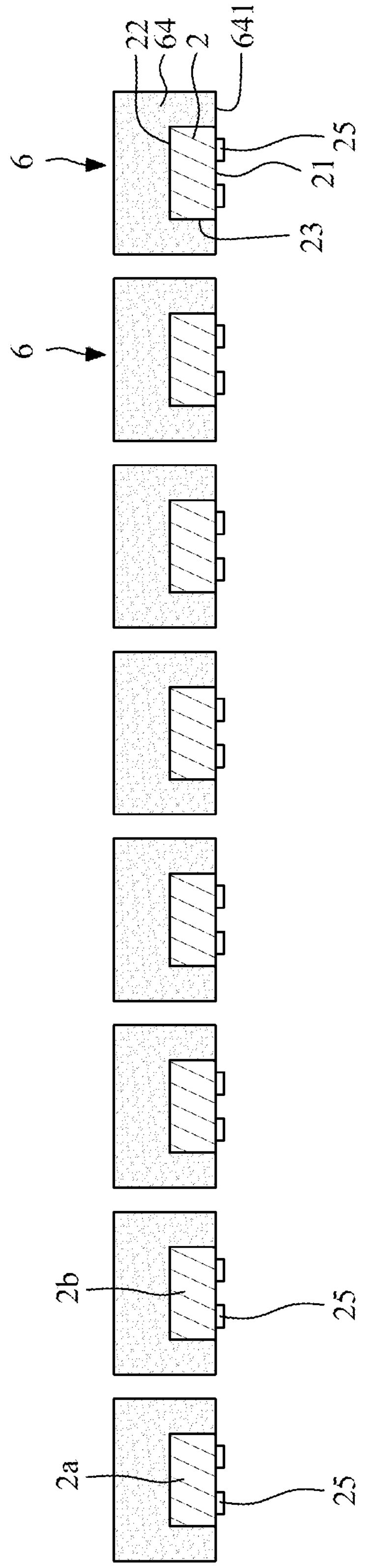

Referring to FIG. 28, the second carrier 60 with the buffer layer 62 may be removed. Then, the molded substrate 9 (e.g., the encapsulant 64) may be singulated to form a plurality of package structures 6.

Figure 29:
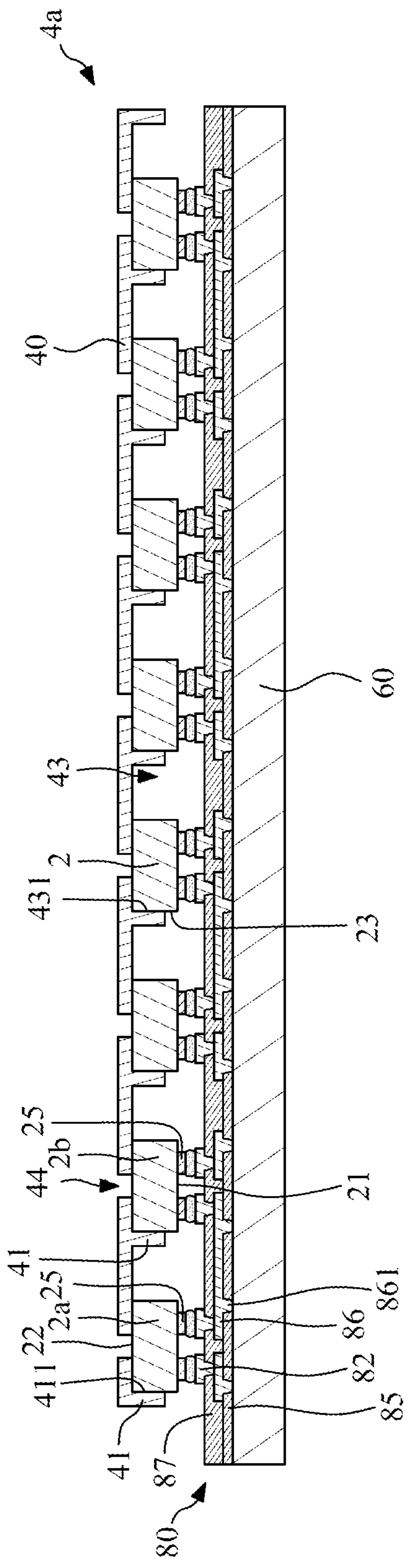
FIG. 29 to FIG. 31 illustrate a method for manufacturing a package structure according to some embodiments of the present disclosure.
Figure 30:
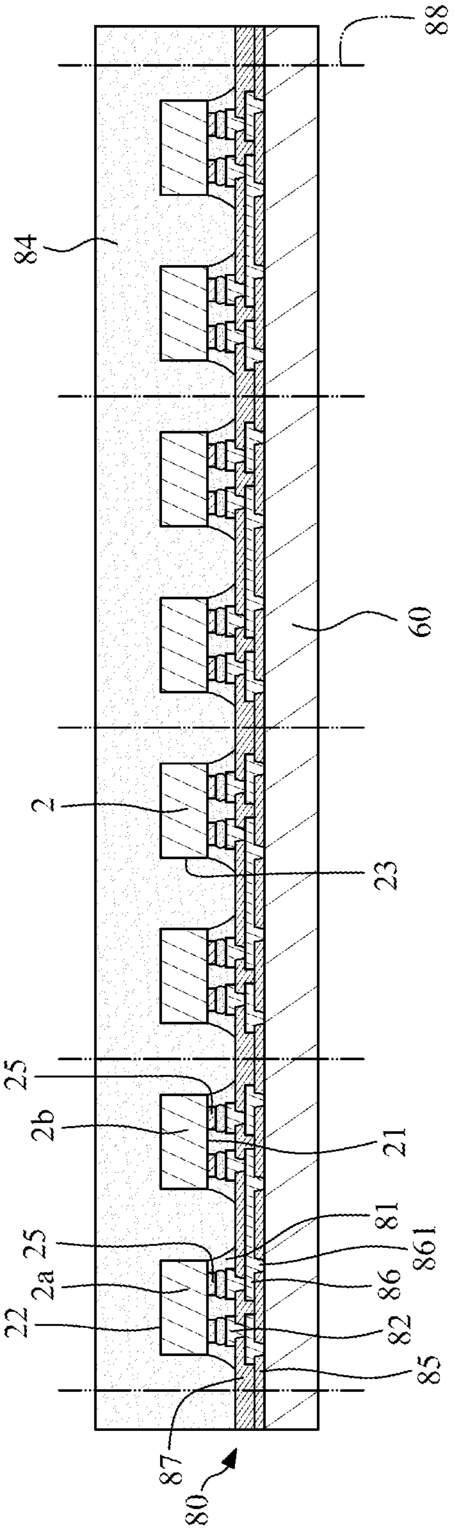
Figure 31:
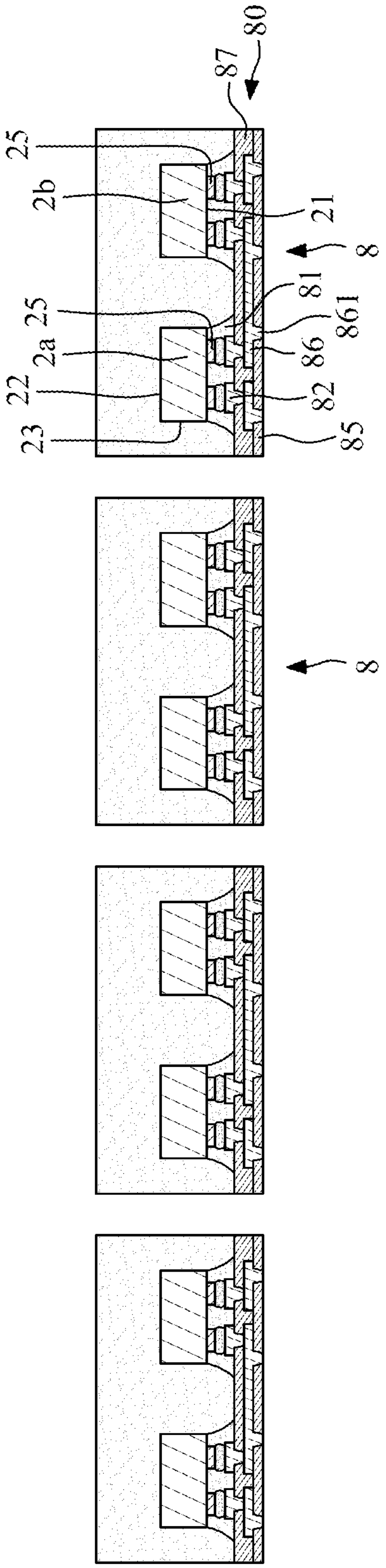

FIG. 29 to FIG. 31 illustrate a method for manufacturing a package structure according to some embodiments of the present disclosure. The initial several stages of the method corresponding to FIG. 29 to FIG. 31 are the same as, or at least similar to, the stages illustrated in FIG. 19 to FIG. 24. FIG. 29 depicts a stage subsequent to that depicted in FIG. 24.

Referring to FIG. 29, a second carrier 60 is provided. The second carrier 60 may include a redistribution structure 80 disposed on a surface of the second carrier 60. The redistribution structure 80 may include a first dielectric layer 85, a redistribution layer 86 (or a circuit layer), a second dielectric layer 87 and a plurality of bumps 82. The first dielectric layer 85 and the second dielectric layer 87 may be formed or stacked on the second carrier 60. The redistribution layer 86 may be disposed on the first dielectric layer 85 and covered by the second dielectric layer 87. The redistribution layer 86 may be configured to electrically connect at least two of the elements 2 (including a first electrical element 2*a* and a second electrical element 2*b*, 2*c*). A via portion 861 of the redistribution layer 86 may extend through the first dielectric layer 85, and may taper downward. The bumps 82 may protrude from the second dielectric layer 87, and may be electrically connected to the redistribution layer 86. The metal studs 25 of the elements 2 may be physically connected and/or electrically connected to the bumps 82 of the redistribution structure 80.

Referring to FIG. 30, the negative pressure created in the unit spaces 43 of the frame 4*a* through the suction holes 44 may be released. Then, the frame 4*a* may be removed. Then, an underfill 81 may be applied to cover the metal studs 25 of the elements 2 and the bumps 82 of the redistribution structure 80. Then, an encapsulant 84 (e.g., a molding compound) may be applied to encapsulate the elements 2. The encapsulant 64 may cover the underfill 81 and a surface of the redistribution structure 80.

Referring to FIG. 31, the second carrier 60 may be removed. Then, a singulation process may be conducted along the singulation lines 88 to form a plurality of package structures 8. The package structure 8 may include a first electrical element 2*a* and a second electrical element 2*b*.

Figure 32:
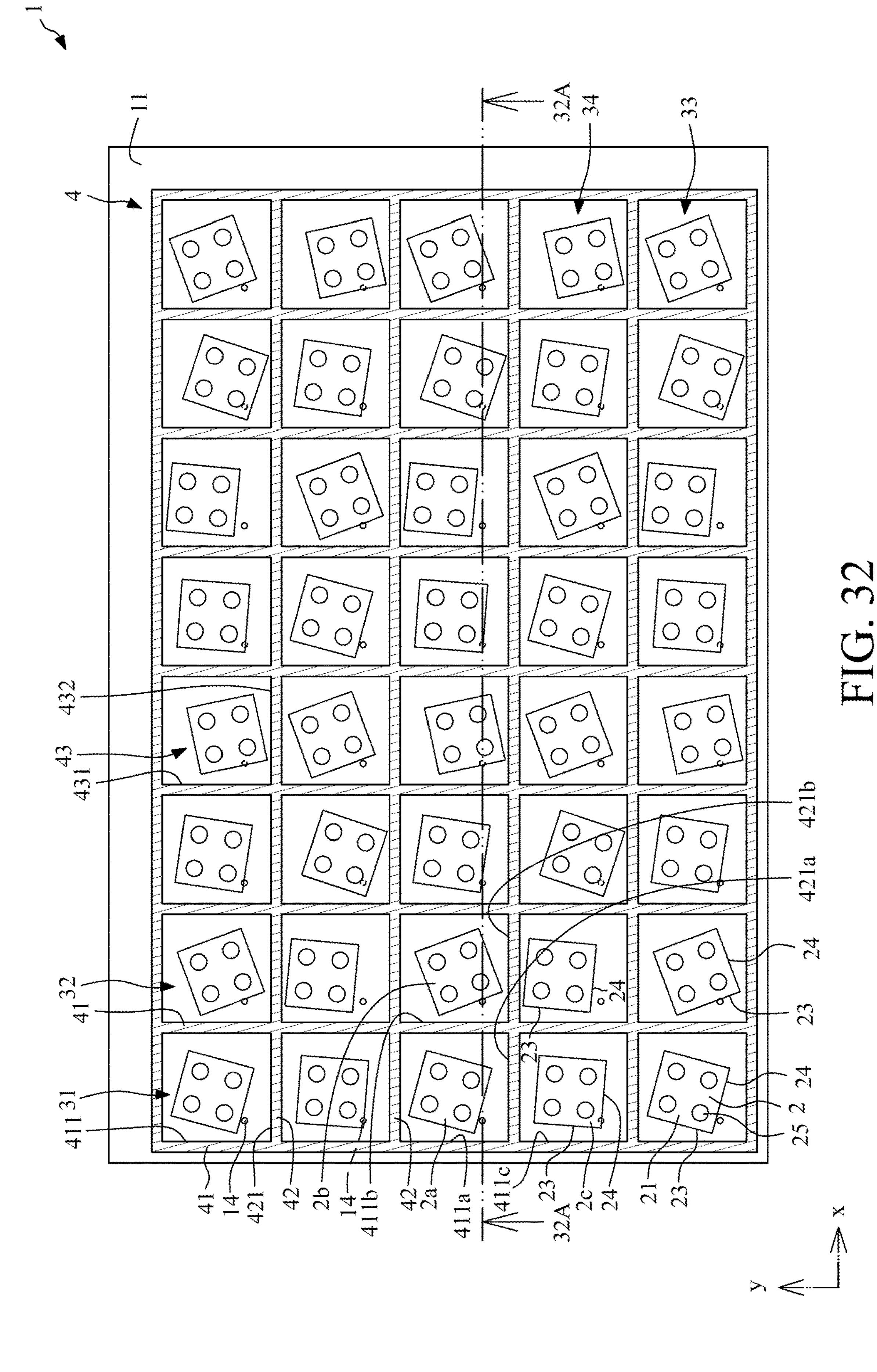
FIG. 32, FIG. 32A and FIG. 33 to FIG. 34 illustrate a method for manufacturing a package structure according to some embodiments of the present disclosure.
Figure 33:
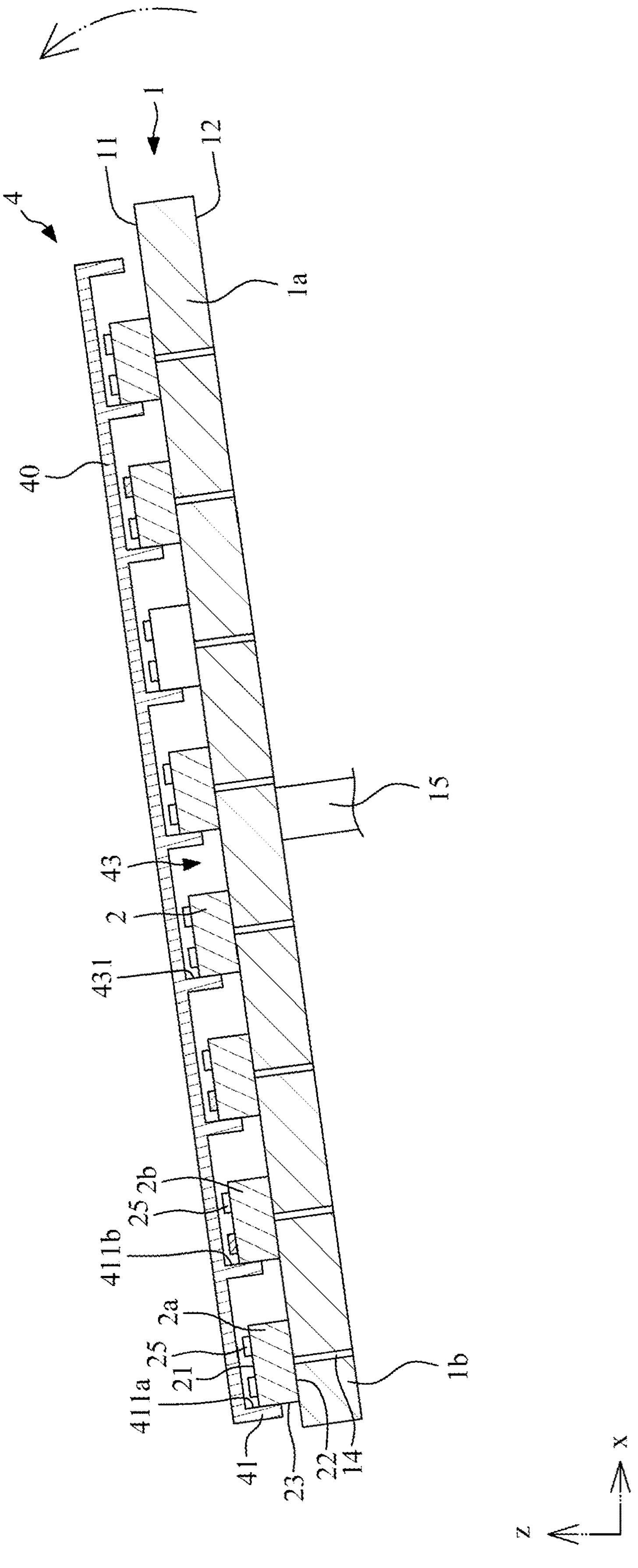
Figure 34:
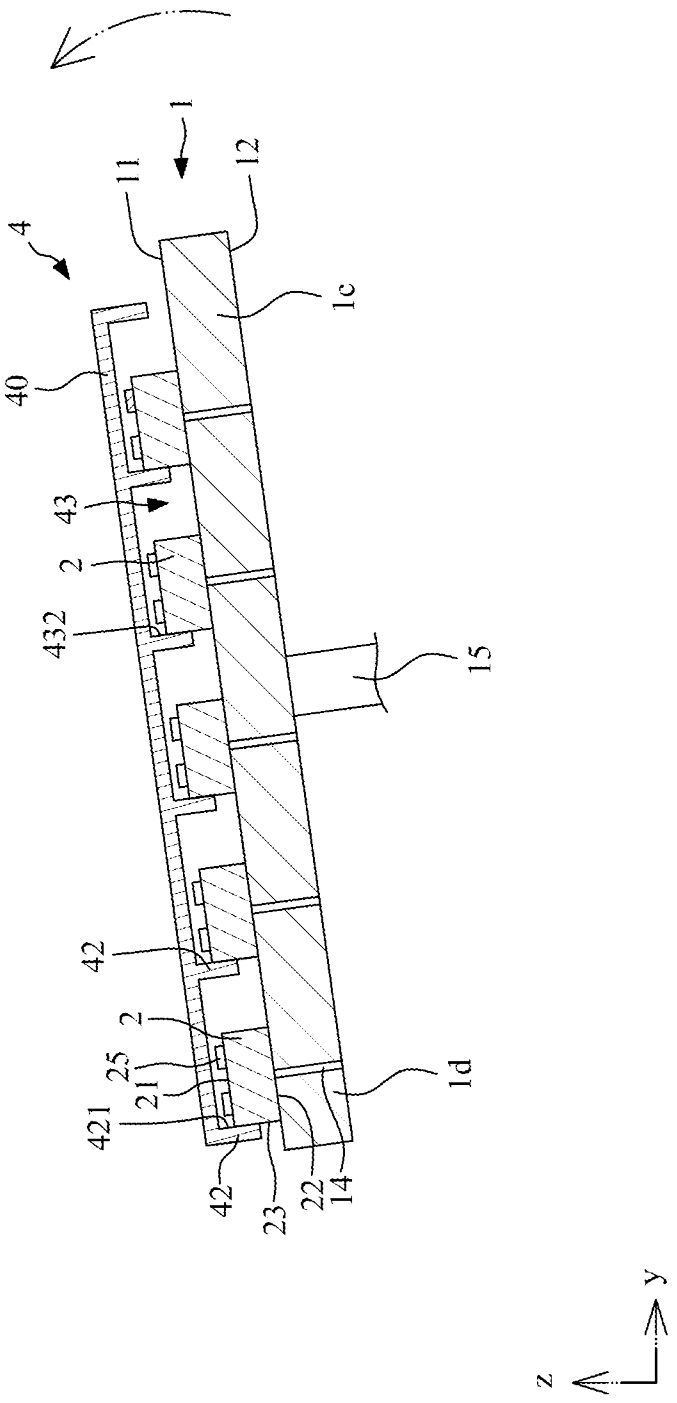

FIG. 32 to FIG. 34 illustrate a method for manufacturing a package structure according to some embodiments of the present disclosure. The initial several stages of the method corresponding to FIG. 32 to FIG. 34 are the same as, or at least similar to, the stages illustrated in FIG. 1 to FIG. 2. FIG. 32 depicts a stage subsequent to that depicted in FIG. 2.

Figure 32A:
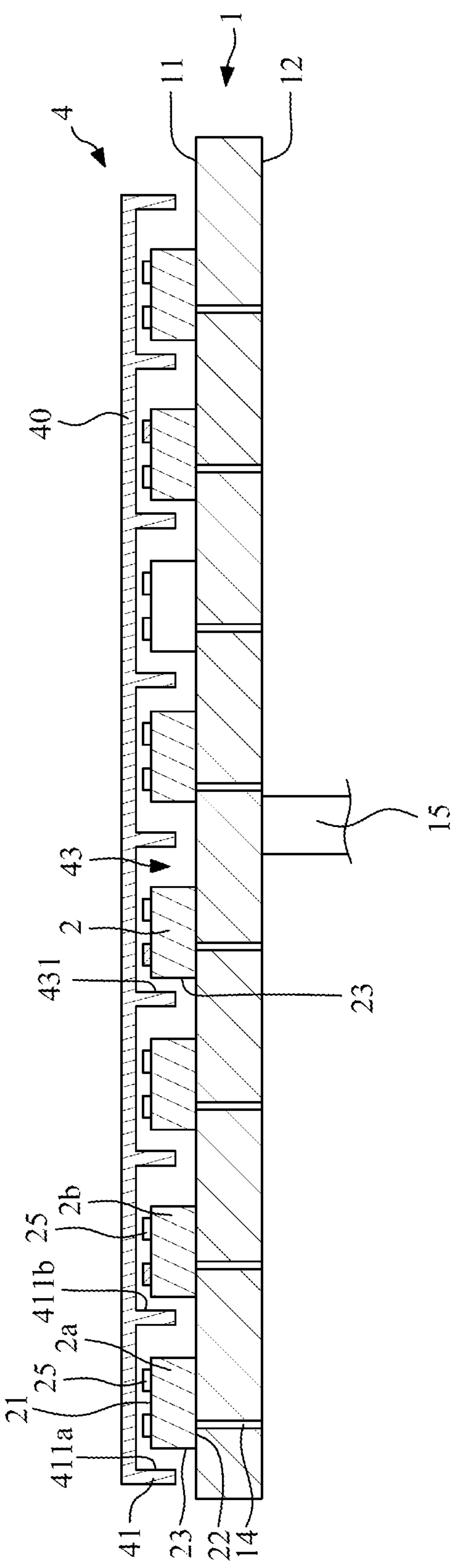

Referring to FIG. 32 and FIG. 32A, a frame 4 is provided. FIG. 32A illustrates a cross-sectional view taken along line 32A-32A of FIG. 32, wherein a cover portion 40 of the frame 4 in FIG. 32 is omitted for clear illustration. The frame 4 and the first carrier 1 of FIG. 32 and FIG. 32A may be same as or similar to the frame 4 and the first carrier 1 of FIG. 3 and FIG. 3A, except that there may be no relative movement between the frame 4 and the first carrier 1 in FIG. 32 and FIG. 32A. That is, the relative position between the frame 4 and the first carrier 1 in FIG. 32 and FIG. 32A is fixed. The frame 4 may not move relatively to the first carrier 1. In some embodiments, the frame 4 may be fixed or secured to the first carrier 1. In addition, the positions of the predetermined areas 13 and the suction holes 14 of FIG. 32 and FIG. 32A may be different from the positions of the predetermined areas 13 and the suction holes 14 of FIG. 3 and FIG. 3A.

Referring to FIG. 33, the frame 4 and the first carrier 1 may move together, rotate together or tilt together. In some embodiments, the frame 4 and the first carrier 1 may rotate or tilt around a first rotating axis. For example, the first rotating axis may be substantially parallel with the second direction such as the y-axis direction. In some embodiments, the first carrier 1 may include a first side 1*a* and a second side 1*b* opposite to the first side 1*a* along the first direction. That is, the direction between the first side 1*a* of the first carrier 1 and the second side 1*b* of the first carrier 1 is the first direction. The first side 1*a* of the first carrier 1 may be raised until an elevation of the first side 1*a* is higher than an elevation of the second side 1*b*, and the elements 2 slide toward the second side 1*b* of the first carrier 1 due to their gravities. In some embodiments, the elements 2 may slide until the lateral surfaces (e.g., the first surfaces 23) of the elements 2 lean on the sidewalls (e.g., the first portion 411*a* and the second portion 411*b*) of the frame 4 respectively. Therefore, each of the elements 2 may slide and/or rotate on the top surface 11 of the first carrier 1 in the unit space 43 of the frame 4. Meanwhile, the first surface 23 of the element 2 may approach to and contact the first inner surface 411 of the first strip portion 41 (i.e., the first reference plane) of the frame 4 or the first sidewall 431 of the unit space 43 along the first direction (e.g., the x-axis direction). Therefore, the first surfaces 23 of the elements 2 may be substantially aligned with each other along the second direction.

Referring to FIG. 34, then the frame 4 and the first carrier 1 may move together, rotate together or tilt together. In some embodiments, the frame 4 and the first carrier 1 may rotate or tilt around a second rotating axis. The first rotating axis may be perpendicular to the second rotating axis. For example, the second rotating axis may be substantially parallel with the first direction such as the x-axis direction. In some embodiments, the first carrier 1 may further include a third side 1*c* and a fourth side 1*d* opposite to the third side 1*c* along the second direction. That is, the direction between the third side 1*c* of the first carrier 1 and the fourth side 1*d* of the first carrier 1 is the second direction substantially perpendicular to the first direction between the first side 1*a* of the first carrier 1 and the second side 1*b* of the first carrier 1.

The third side 1*c* of the first carrier 1 may be raised until an elevation of the third side 1*c* is higher than an elevation of the fourth side 1*d*, and the elements 2 further slide toward the fourth side 1*d* of the first carrier 1 due to their gravities. Therefore, each of the elements 2 may further slide on the top surface 11 of the first carrier 1 in the unit space 43 of the frame 4. Meanwhile, the second surface 24 of the element 2 may approach to contact the second inner surface 421 of the second strip portion 42 (i.e., the second reference plane) of the frame 4 or the second sidewall 432 of the unit space 43 along the second direction (e.g., the y-axis direction). Therefore, the second surfaces 24 of the elements 2 may be substantially aligned with each other along the first direction, as shown in FIG. 5. Therefore, the elements 2 may be substantially aligned with each other along the second direction and the first direction.

The following stages of the method corresponding to FIG. 32 to FIG. 34 are the same as, or at least similar to, the stages illustrated in FIG. 6 to FIG. 11 so as to obtain the package structures 6 of FIG. 11.

Figure 35:
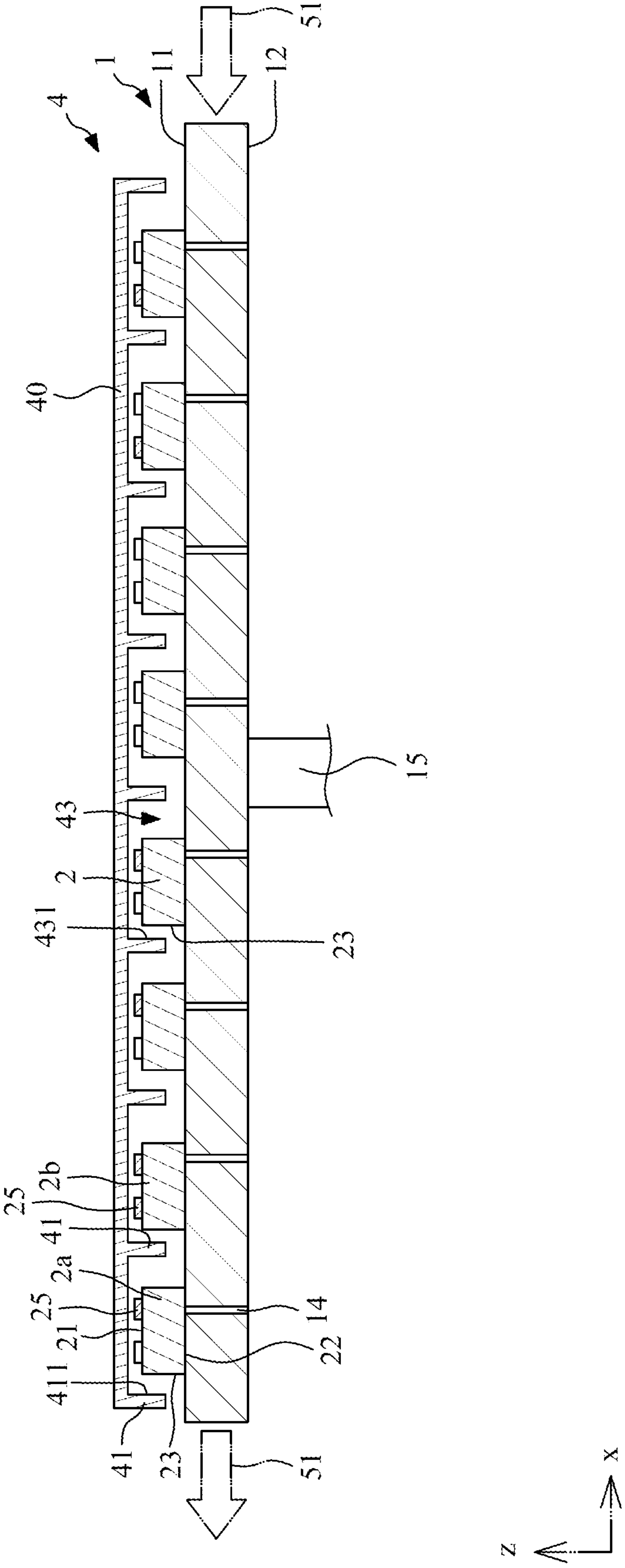
FIG. 35 illustrate a method for manufacturing a package structure according to some embodiments of the present disclosure.

FIG. 35 illustrate a method for manufacturing a package structure according to some embodiments of the present disclosure. The initial several stages of the method corresponding to FIG. 35 are the same as, or at least similar to, the stages illustrated in FIG. 1 to FIG. 3A. FIG. 35 depicts a stage subsequent to that depicted in FIG. 3 and FIG. 3A.

Referring to FIG. 35, the position of the frame 4 may be fixed, and the first carrier 1 may be moveable with respect to the frame 4. For example, the first carrier 1 may move horizontally and the frame 4 may not move. As shown in FIG. 35, the first carrier 1 may move along the first direction 51 (e.g., the x-axis direction). Meanwhile, the first surface 23 of the element 2 may approach to and contact the first inner surface 411 of the first strip portion 41 (i.e., the first reference plane) of the frame 4 or the first sidewall 431 of the unit space 43 along the first direction (e.g., the x-axis direction). Therefore, the first surfaces 23 of the elements 2 may be substantially aligned with each other along the second direction.

Then, the first carrier 1 may move along the second direction 52 (e.g., the y-axis direction). Meanwhile, the second surface 24 of the element 2 may approach to and contact the second inner surface 421 of the second strip portion 42 (i.e., the second reference plane) of the frame 4 or the second sidewall 432 of the unit space 43 along the second direction (e.g., the y-axis direction). Therefore, the second surfaces 24 of the elements 2 may be substantially aligned with each other along the first direction, as shown in FIG. 5. Therefore, the elements 2 may be substantially aligned with each other along the second direction and the first direction.

The following stages of the method corresponding to FIG. 35 are the same as, or at least similar to, the stages illustrated in FIG. 6 to FIG. 11 so as to obtain the package structures 6 of FIG. 11.

Figure 36:
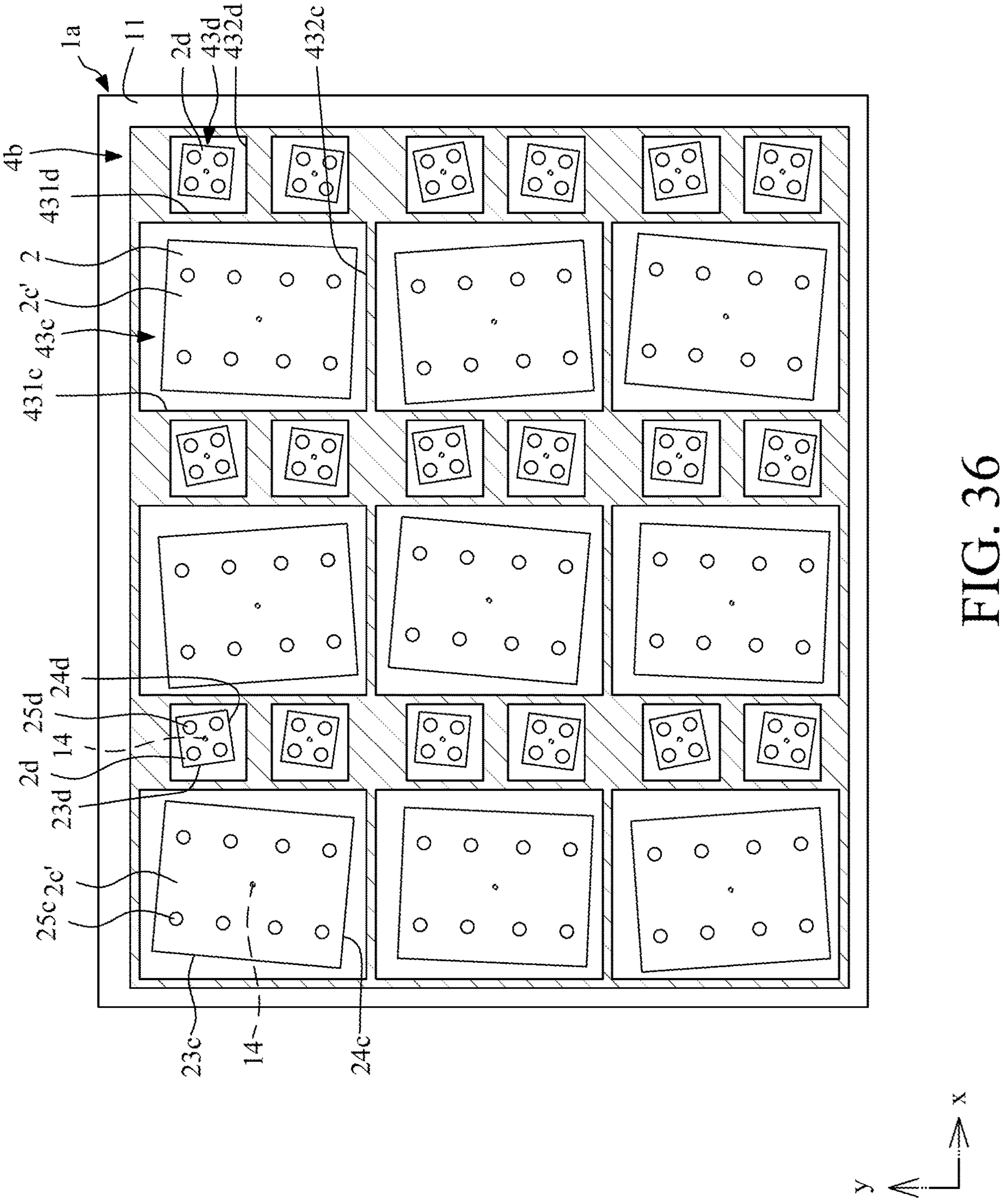
FIG. 36 to FIG. 42 illustrate a method for manufacturing a package structure according to some embodiments of the present disclosure.

FIG. 36 to FIG. 42 illustrate a method for manufacturing a package structure according to some embodiments of the present disclosure. Referring to FIG. 36, a first carrier 1*a* is provided. The first carrier 1*a* of FIG. 36 may be similar to the first carrier 1 of FIG. 1 and FIG. 1A. Then, a plurality of elements 2 are disposed on the top surface 11 of the first carrier 1*a*. The elements 2 may include a plurality of first elements 2*c*' and a plurality of second elements 2*d*. A size of the first element 2*c*' may be greater than a size of the second element 2*d*. One first element 2*c*' may correspond to two second elements 2*d*. In some embodiments, each of the first elements 2*c*' may have a top surface 21 (e.g., an active surface), a bottom surface 22 (e.g. a backside surface), a first surface 23*c* (e.g., a first lateral surface) and a second surface 24*c* (e.g., a second lateral surface). The bottom surface 22 may be opposite to the top surface 21. The first surface 23*c* and the second surface 24*c* may extend between the top surface 21 and the bottom surface 22. In addition, the first element 2*c*' may include a plurality of metal studs 25*c* disposed adjacent to the top surface 21. The bottom surface 22 of the first element 2*c*' may contact the top surface 11 of the first carrier 1*a*, and may slide, move or rotate on the top surface 11 of the first carrier 1*a*.

In some embodiments, each of the second elements 2*d* may have a top surface 21 (e.g., an active surface), a bottom surface 22 (e.g. a backside surface), a first surface 23*d* (e.g., a first lateral surface) and a second surface 24*d* (e.g., a second lateral surface). The bottom surface 22 may be opposite to the top surface 21. The first surface 23*d* and the second surface 24*d* may extend between the top surface 21 and the bottom surface 22. In addition, the second element 2*d* may include a plurality of metal studs 25*d* disposed adjacent to the top surface 21. The bottom surface 22 of the second element 2*d* may contact the top surface 11 of the first carrier 1*a*, and may slide, move or rotate on the top surface 11 of the first carrier 1*a*.

Then, a frame 4*b* is provided to the top surface 11 of the first carrier 1*a*. The frame 4*b* may define a plurality of first unit spaces 43*c* and a plurality of second unit spaces 43*d*. The first unit space 43*c* may have a first sidewall 431*c* and a second sidewall 432*c*. The second unit space 43*d* may have a first sidewall 431*d* and a second sidewall 432*d*. The first element 2*c*' may be accommodated in the first unit spaces 43*c*, and the second element 2*d* may be accommodated in the second unit spaces 43*d*.

Figure 37:
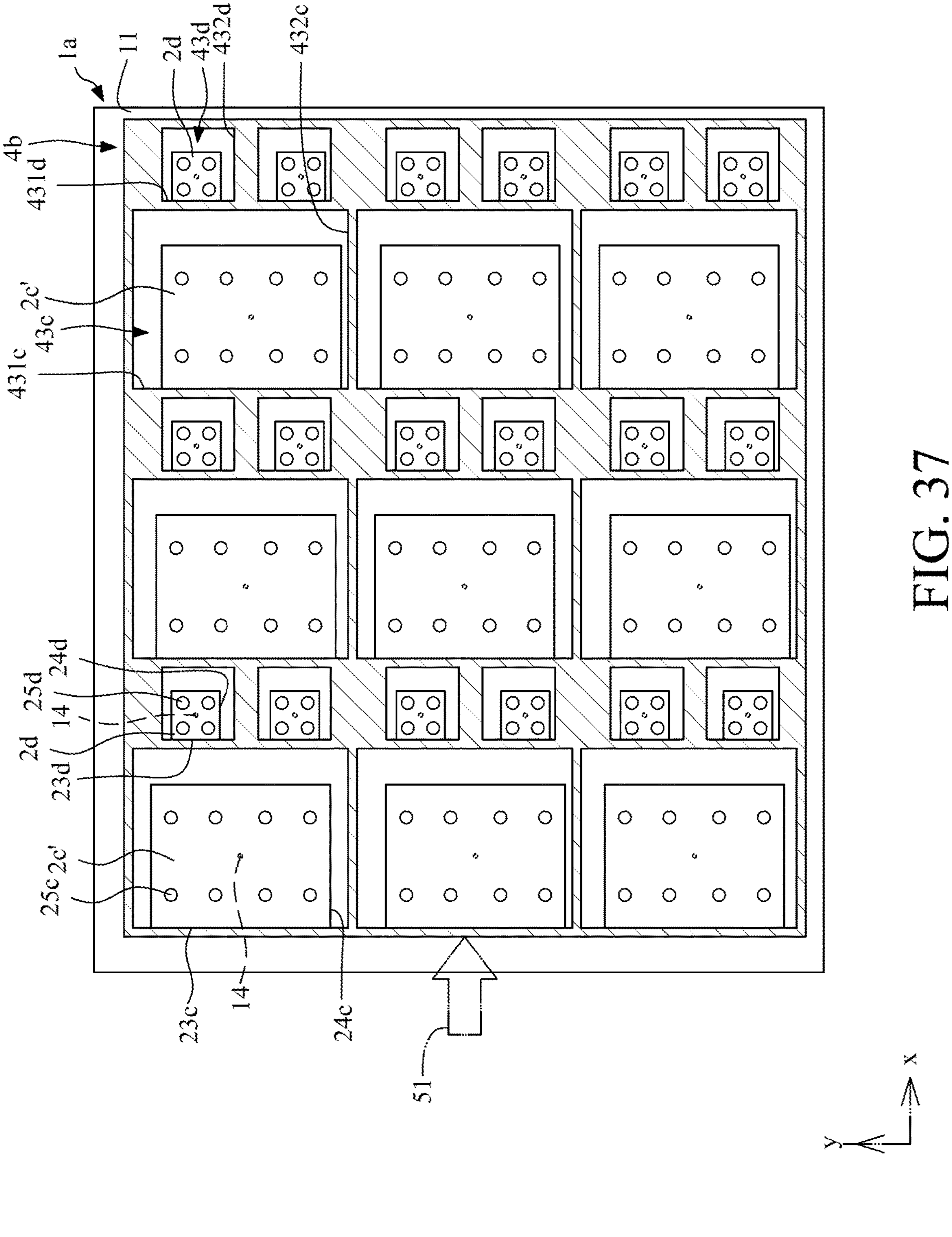

Referring to FIG. 37, the frame 4*b* is pushed to move along the first direction 51 such as the x-axis direction. Meanwhile, the first sidewall 431*c* of the first unit space 43*c* may contact the first surface 23*c* of the first element 2*c*', and the first sidewall 431*d* of the second unit space 43*d* may contact the first surface 23*d* of the second element 2*d*. Therefore, the first surfaces 23*c* of the first elements 2*c*' are substantially aligned with each other along the second direction such as the y-axis direction, and the first surfaces 23*d* of the second elements 2*d* are substantially aligned with each other along the second direction such as the y-axis direction.

Figure 38:
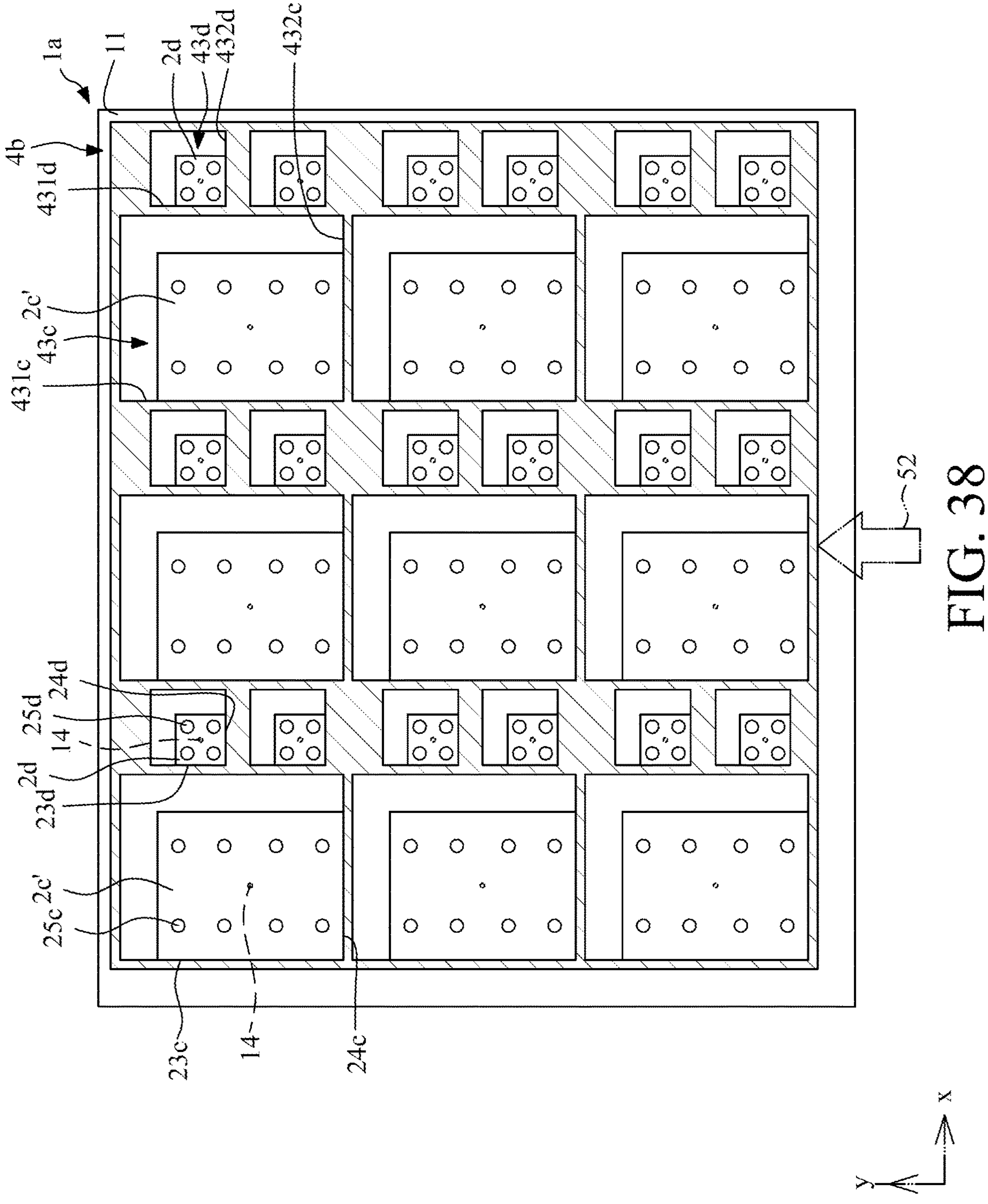

Referring to FIG. 38, the frame 4*b* is pushed to move along the second direction 52 such as the y-axis direction. Meanwhile, the second sidewall 432*c* of the first unit space 43*c* may contact the second surface 24*c* of the first element 2*c*', and the second sidewall 432*d* of the second unit space 43*d* may contact the second surface 24*d* of the second element 2*d*. Therefore, the second surfaces 24*c* of the first elements 2*c*' are substantially aligned with each other along the first direction such as the x-axis direction, and the second surfaces 24*d* of the second elements 2*d* are substantially aligned with each other along the first direction such as the x-axis direction. Therefore, the elements 2 may be substantially aligned with each other along the second direction and the first direction.

Figure 39:
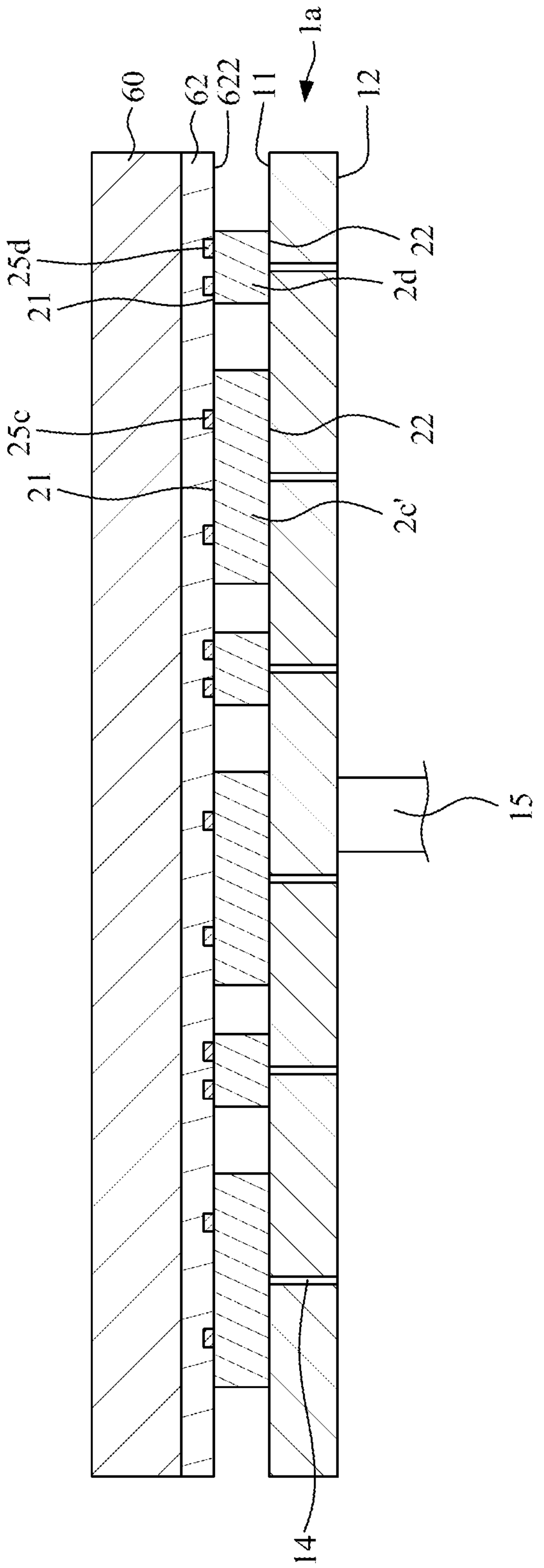

Referring to FIG. 39, the frame 4*a* is removed. A negative pressure is created on the top surface 11 of the first carrier 1*a* through the suction holes 14 to suck the elements 2 (including the first elements 2*c*' and the second elements 2*d*). Then, a second carrier 60 is provided. The second carrier 60 may include a buffer layer 62 disposed on a surface of the second carrier 60. The buffer layer 62 may have a surface 622 opposite to the second carrier 60. The buffer layer 62 may be an adhesive layer or an adhesive tape. Then, the first carrier 1*a* and the elements 2 (including the first elements 2*c*' and the second elements 2*d*) may be moved to a position corresponding to the second carrier 60. Then, the first carrier 1*a* may move toward the second carrier 60, or the second carrier 60 may move toward the first carrier 1*a*. Thus, the first surfaces 21 of the elements 2 (including the first elements 2*c*' and the second elements 2*d*) may contact the surface 622 of the buffer layer 62. In some embodiments, the first surfaces 21 of the elements 2 (including the first elements 2*c*' and the second elements 2*d*) may be adhered to the surface 622 of the buffer layer 62, and the metal studs 25*c*, 25*d* of the elements 2 may be embedded in, inserted into, drawn into, or enclosed by the buffer layer 62.

Figure 40:
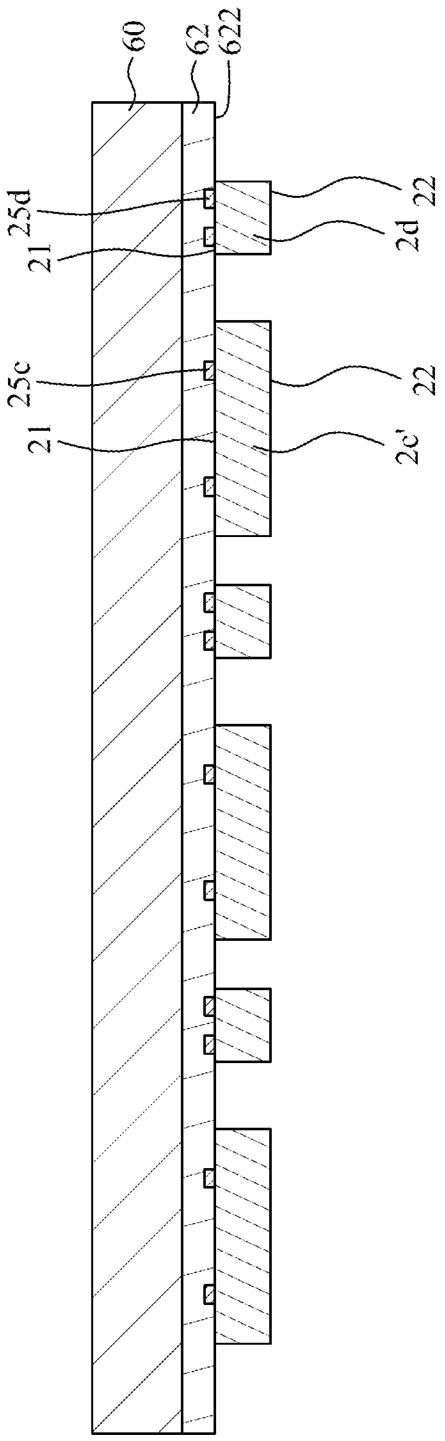

Referring to FIG. 40, the negative pressure may be released. Then, the first carrier 1*a* may be removed. Thus, the elements 2 (including the first elements 2*c*' and the second elements 2*d*) are simultaneously transferred to the second carrier 60.

Figure 41:
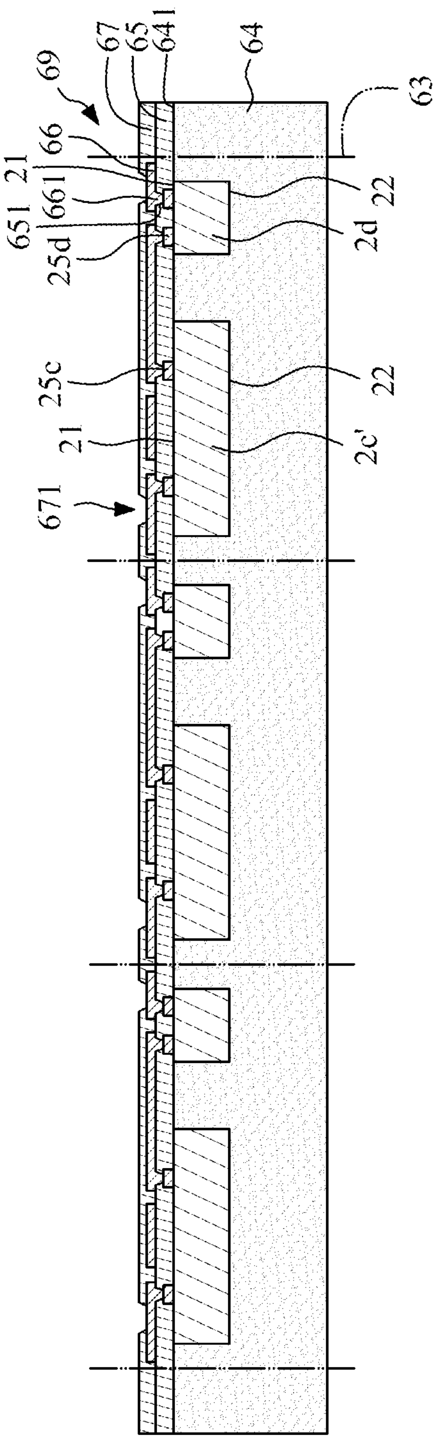

Referring to FIG. 41, an encapsulant 64 (e.g., a molding compound) may be applied to encapsulate the elements 2 (including the first elements 2*c*' and the second elements 2*d*). Then, the second carrier 60 with the buffer layer 62 may be removed. Then, a redistribution structure 69 may be formed on the encapsulant 64 to electrically connect the first elements 2*c*' and the second elements 2*d*. The redistribution structure 69 of FIG. 41 may be similar to the redistribution structure 69 of FIG. 14, and may include a first dielectric layer 65, a redistribution layer 66 and a second dielectric layer 67. Then, a plurality of connecting elements 68 (e.g., solder balls) may be formed or disposed in the openings 671 of the second dielectric layer 67 to physically connect or electrically connect the redistribution layer 66. The encapsulant 64 may have a plurality of singulation lines 63.

Figure 42:
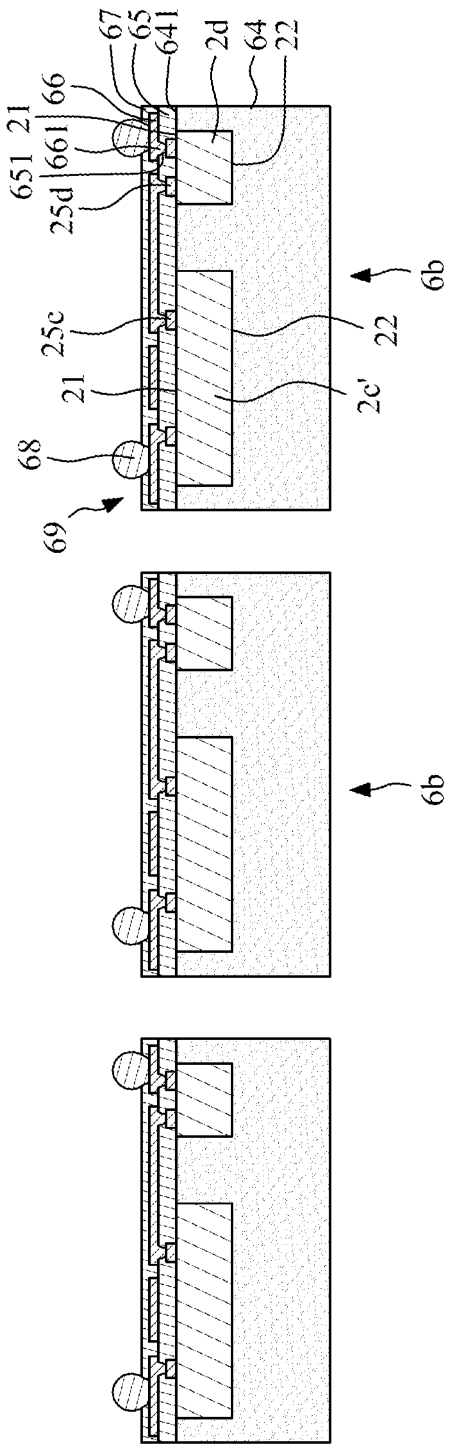

Referring to FIG. 42, the encapsulant 64 and the redistribution structure 69 may be singulated along the singulation lines 63 to form a plurality of package structures 6*b*.

Figure 43:
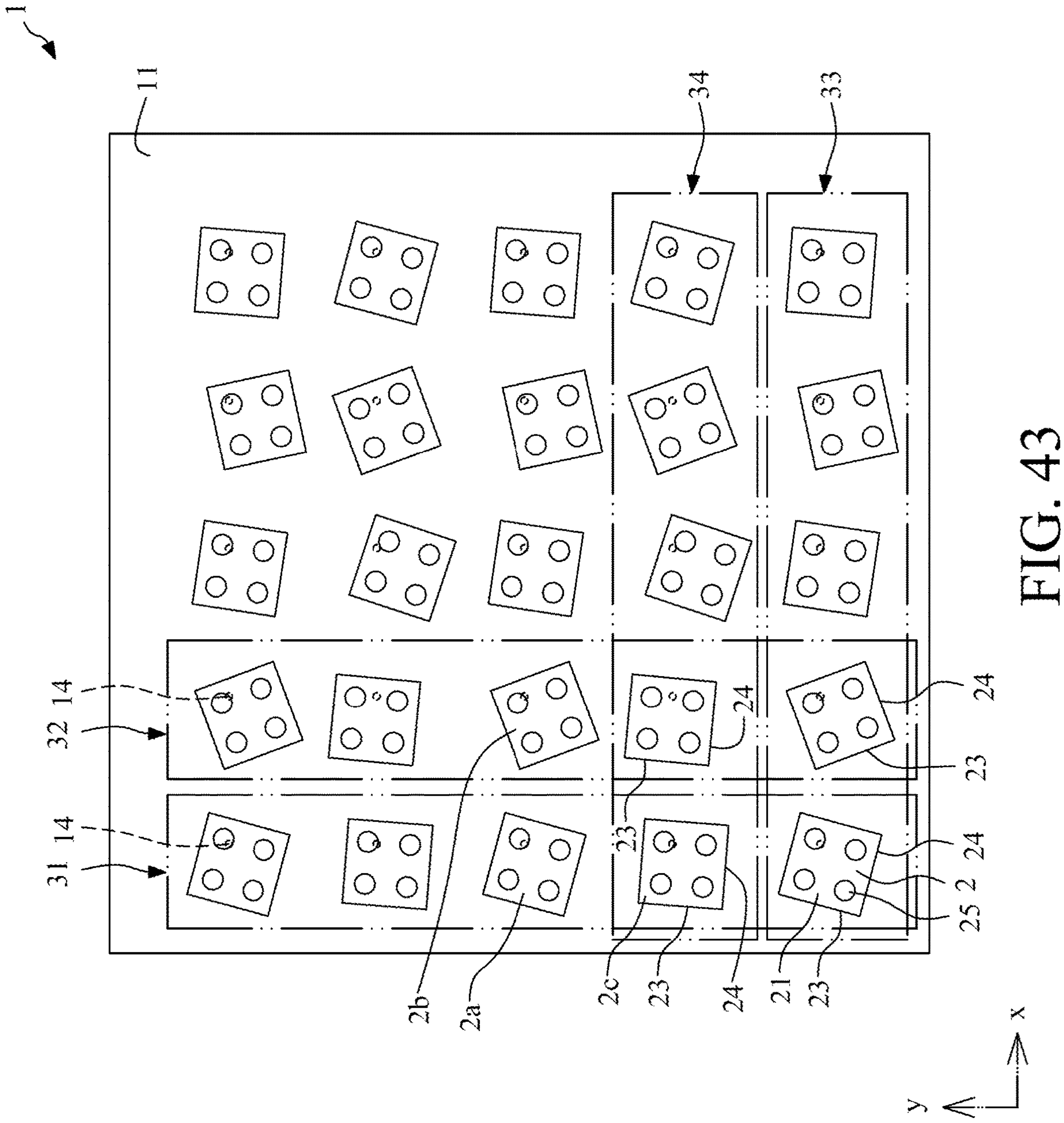
FIG. 43 to FIG. 46 illustrate a method for manufacturing a package structure according to some embodiments of the present disclosure.

FIG. 43 to FIG. 46 illustrate a method for manufacturing a package structure according to some embodiments of the present disclosure. Referring to FIG. 43, a plurality of electrical elements 2 are provided on a surface 11 of a first carrier 1. The first carrier 1 of FIG. 43 may be same as or similar to the first carrier 1 of FIG. 1 and FIG. 1A. The elements 2 may be same as or similar to the elements 2 of FIG. 2 and FIG. 2A.

Figure 44:
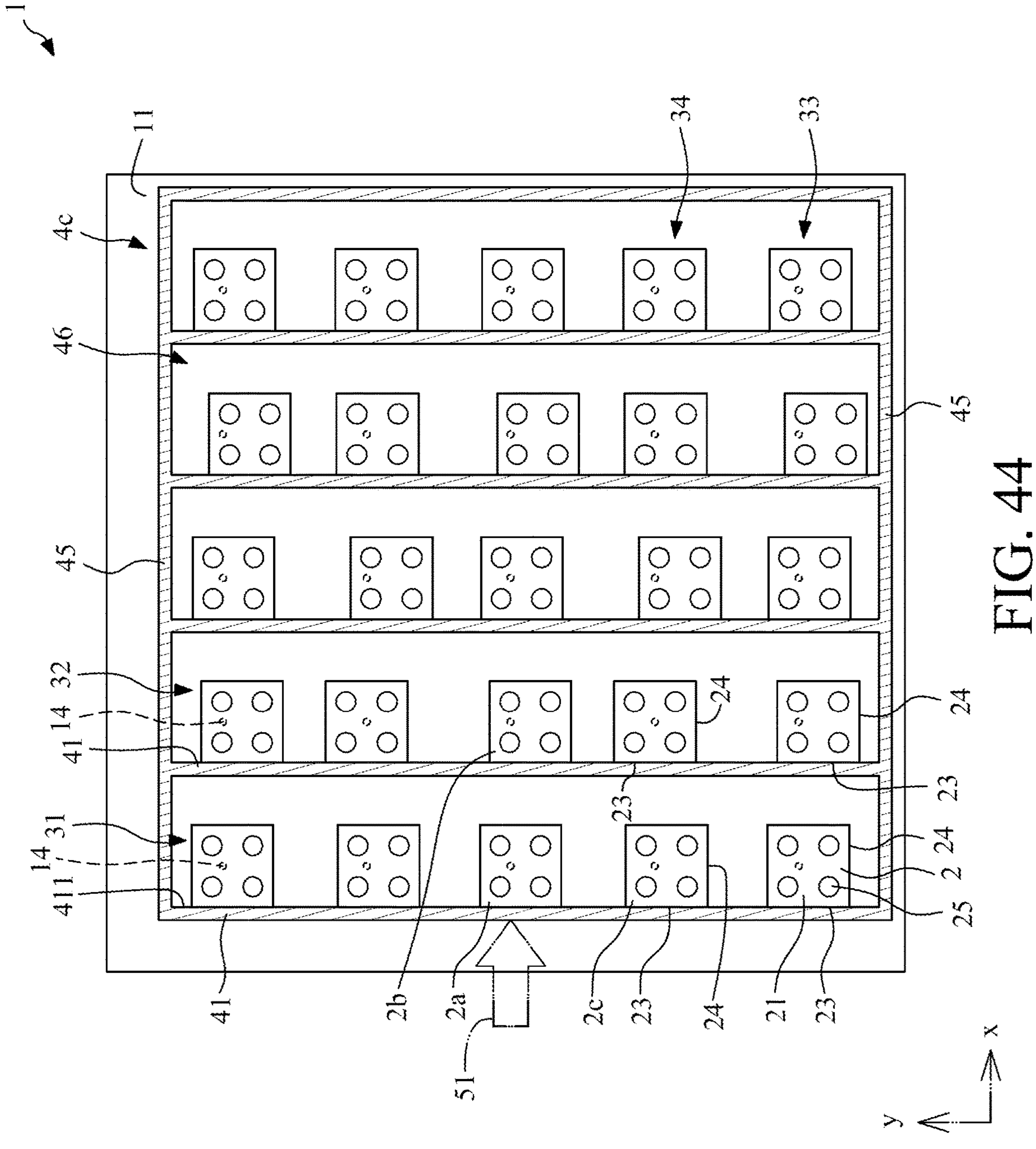

Referring to FIG. 44, a frame 4*c* is provided to the top surface 11 of the first carrier 1. The frame 4*c* may include a plurality of first strip portions 41 (e.g., first sidewalls) and two connection bars 45. The first strip portions 41 may be substantially parallel with each other. The first strip portion 41 may have a first inner surface 411 facing the element 2. The first inner surface 411 of the first strip portion 41 may be also referred to as "a first reference plane", "a first plane", "a first inner sidewall" or "a first sidewall". Two ends of each of the first strip portions 41 may be connected to the connection bars 45. Thus, the frame 4*c* may define a plurality of unit spaces 46. More than two elements 2 may be accommodated in a unit space 46. For example, the first column 31 of the elements 2 may be accommodated in a unit space 46, and the second column 32 of the elements 2 may be accommodated in another unit space 46.

Then, the frame 4*c* is pushed to move along the first direction 51 such as the x-axis direction. Meanwhile, the first inner surface 411 of the first strip portion 41 may contact the first surfaces 23 of the elements 2. Therefore, the first surfaces 23 of the elements 2 are substantially aligned with each other along the second direction such as the y-axis direction. In other words, the frame 4*c* may push the first surfaces 23 of the elements 2 through the first plane 411 of the frame 4*c* respectively until the first surfaces 23 of the elements 2 are substantially aligned with each other.

Figure 45:
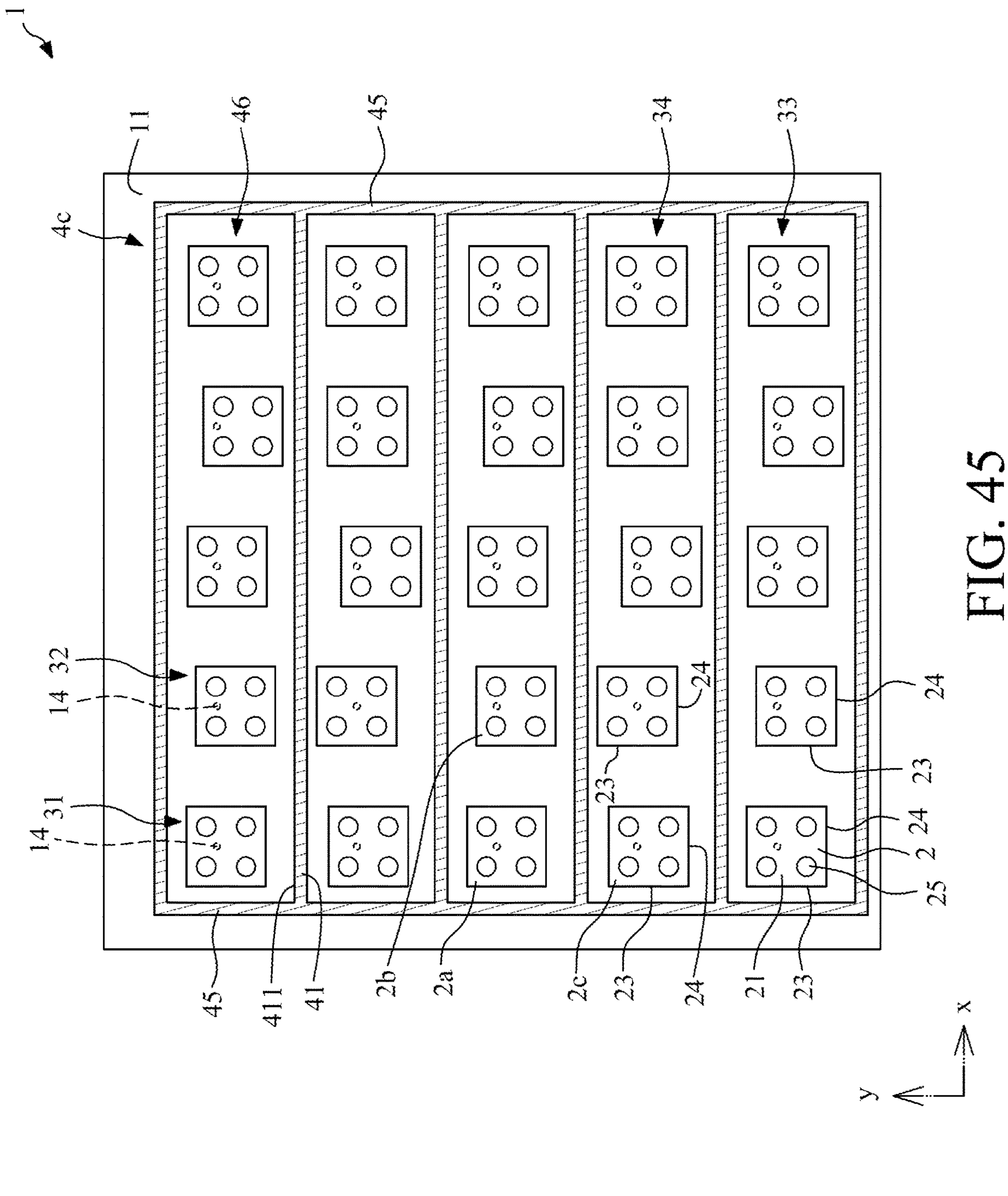

Referring to FIG. 45, the frame 4*c* is lifted up so that the frame 4*c* is separated or removed from the elements 2. Thus, the frame 4*c* does not contact the elements 2. Then, the frame 4*c* may be rotated with respect to the elements 2 from a top view. For example, the frame 4*c* may be rotated clockwise by 90 degrees. Then, the frame 4*c* may be lowered down. An elevation of the frame 4*c* of FIG. 45 may be same as an elevation of the frame 4*c* of FIG. 44.

Figure 46:
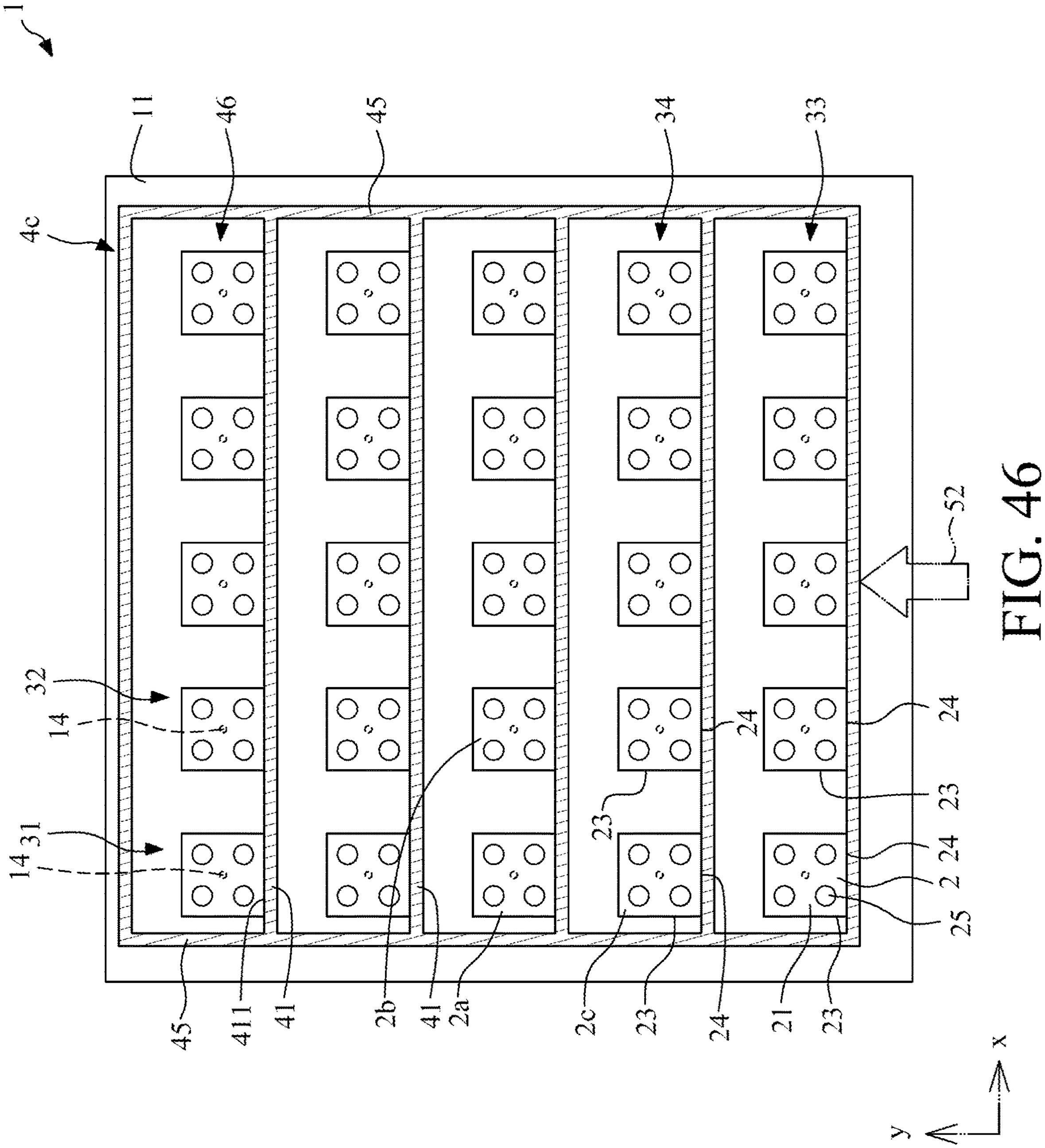

Referring to FIG. 46, the frame 4*c* is pushed to move along the second direction 52 such as the y-axis direction, so that the frame 4*c* may push the second surfaces 24 of the elements 2 adjacent to the first surfaces 23 through the first plane 411 of the frame 4 until the second surfaces 24 of the elements 2 are aligned with each other along the first direction such as the x-axis direction.

In some embodiments, if the positions of the elements 2 of FIG. 46 do not match the predetermined areas 13 of the first carrier 1, the elements 2 may be further moved to the predetermined positions 13 of the first carrier 1 respectively. For example, the stages of FIG. 44 to FIG. 46 may be repeated until the elements 2 reach to the predetermined positions 13 of the first carrier 1.

The following stages of the method corresponding to FIG. 43 to FIG. 46 may be the same as, or at least similar to, the stages illustrated in FIG. 6 to FIG. 11 so as to obtain the package structures 6 of FIG. 11.

Figure 47:
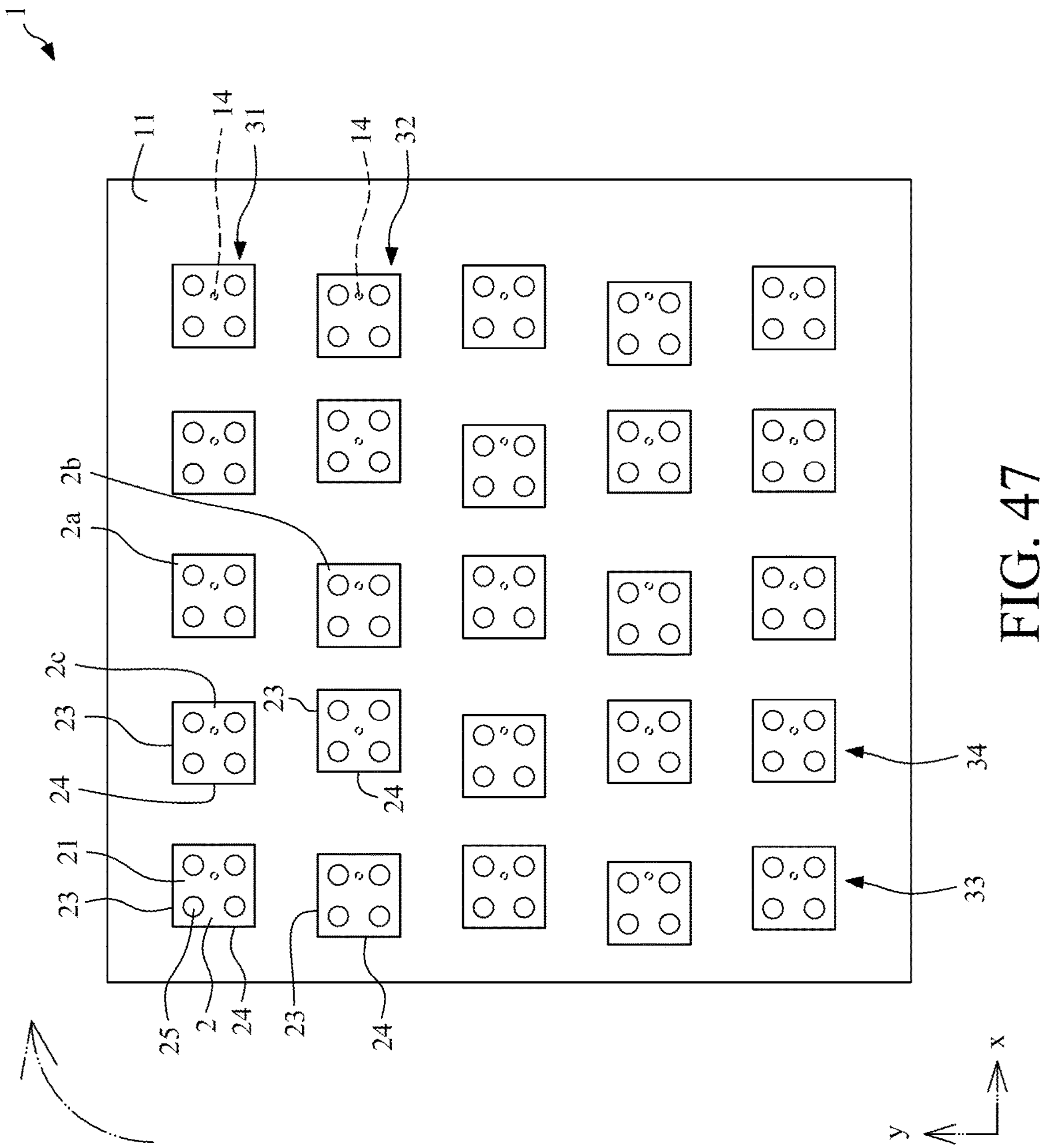
FIG. 47 to FIG. 49 illustrate a method for manufacturing a package structure according to some embodiments of the present disclosure.
Figure 48:
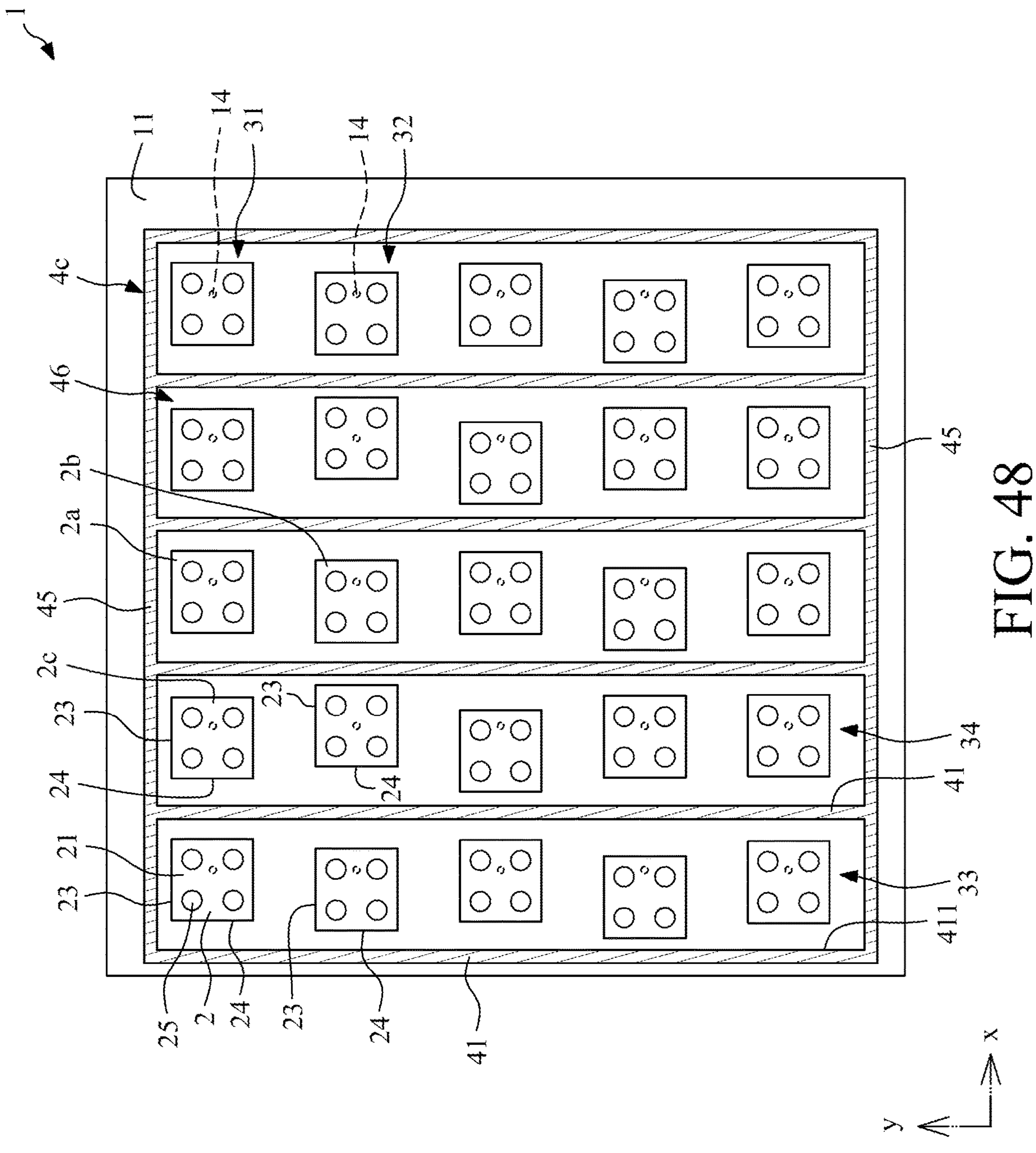
Figure 49:
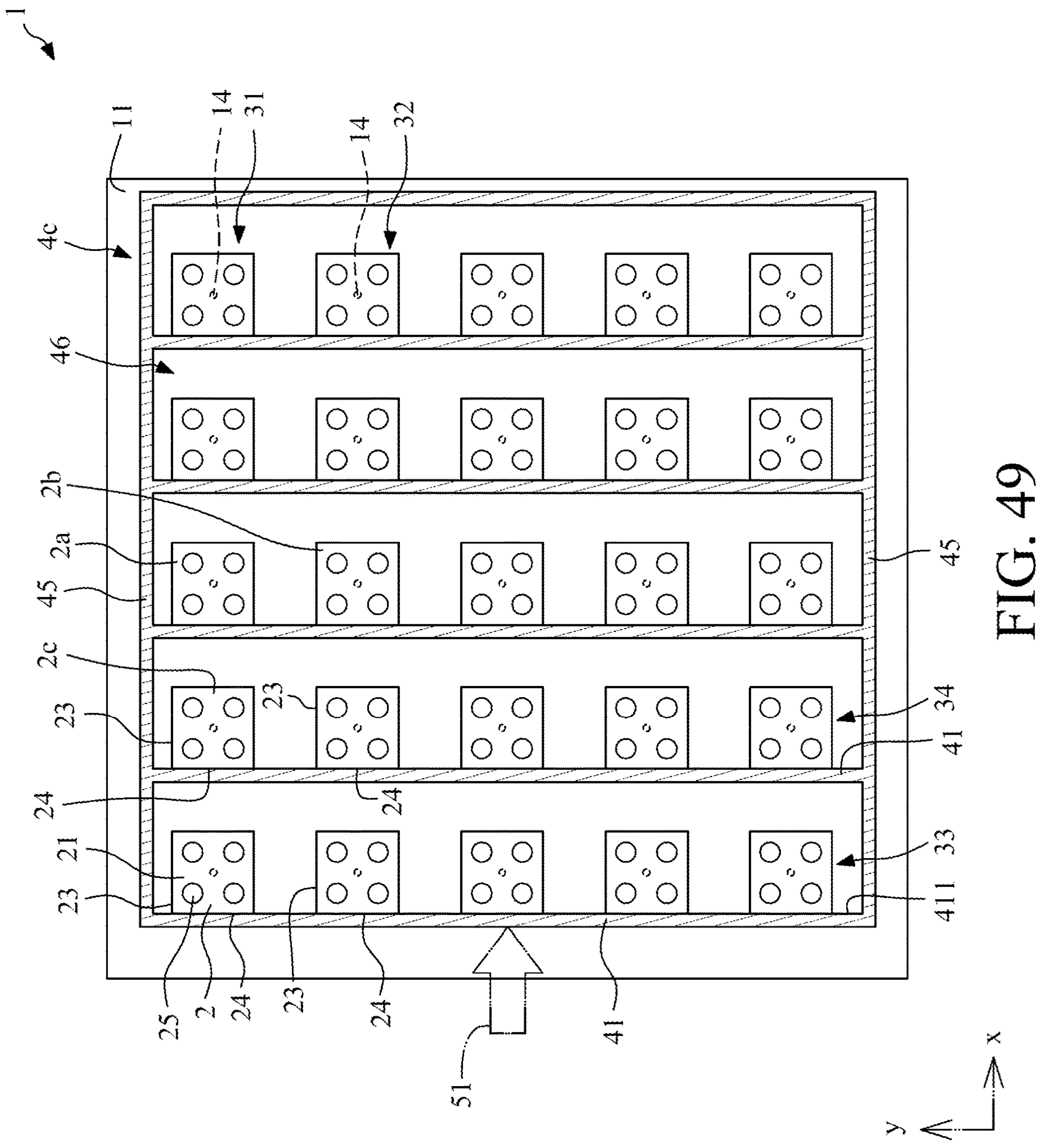

FIG. 47 to FIG. 49 illustrate a method for manufacturing a package structure according to some embodiments of the present disclosure. The initial several stages of the method corresponding to FIG. 47 to FIG. 49 are the same as, or at least similar to, the stages illustrated in FIG. 43 to FIG. 44. FIG. 47 depicts a stage subsequent to that depicted in FIG. 44.

Referring to FIG. 47, the frame 4*c* is lifted up so that the frame 4*c* is separated or removed from the elements 2. Thus, the frame 4*c* does not contact the elements 2. Then, the first carrier 11 may be rotated with respect to the frame 4*c* from a top view. For example, the first carrier 11 may be rotated clockwise by 90 degrees.

Referring to FIG. 48, the frame 4*c* may be lowered down. An elevation of the frame 4*c* of FIG. 48 may be same as an elevation of the frame 4*c* of FIG. 44.

Referring to FIG. 49, the frame 4*c* is pushed to move along the first direction 51 such as the x-axis direction. Meanwhile, the first inner surface 411 of the first strip portion 41 may contact the first surfaces 23 of the elements 2. Therefore, the first surfaces 23 of the elements 2 are substantially aligned with each other along the second direction such as the y-axis direction. In other words, the frame 4*c* may push the first surfaces 23 of the elements 2 through the first plane 411 of the frame 4*c* respectively until the first surfaces 23 of the elements 2 are substantially aligned with each other.

In some embodiments, if the positions of the elements 2 of FIG. 49 do not match the predetermined areas 13 of the first carrier 1, the elements 2 may be further moved to the predetermined positions 13 of the first carrier 1 respectively. For example, the stages of FIG. 47 to FIG. 49 may be repeated until the elements 2 reach to the predetermined positions 13 of the first carrier 1.

The following stages of the method corresponding to FIG. 47 to FIG. 49 may be the same as, or at least similar to, the stages illustrated in FIG. 6 to FIG. 11 so as to obtain the package structures 6 of FIG. 11.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a package structure, comprising:

providing a first electrical element and a second electrical element on a top surface of a first carrier, wherein the second electrical element is shifted with respect to the first electrical element; and moving the first electrical element along at least one direction substantially parallel with the surface of the first carrier until a first surface of the first electrical element is substantially aligned with a first surface of the second electrical element from a top view, wherein the first electrical element and the second electrical element slide on the top surface of the first carrier.

2. The method of claim 1, wherein the first electrical element has a top surface, a bottom surface and a lateral surface extending between the top surface and the bottom surface, wherein moving the first electrical element includes:

pushing the lateral surface of the first electrical element to make the first electrical element slide on the top surface of the first carrier.

3. The method of claim 2, wherein the first electrical element includes a plurality of metal studs disposed adjacent to the bottom surface of the first electrical element, wherein the metal studs contact the top surface of the first carrier.

4. The method of claim 3, wherein the at least one direction includes a first direction and a second direction, the second direction is substantially perpendicular to the first direction from the top view.

5. The method of claim 1, wherein moving the first electrical element includes:

simultaneously pushing and/or rotating the first electrical element and the second electrical element until the first surface of the first electrical element is substantially aligned with the first surface of the second electrical element.

6. The method of claim 5, wherein simultaneously pushing and/or rotating the first electrical element and the second electrical element includes:

pushing and/or rotating the first electrical element by using a first portion of a sidewall of a frame; and pushing and/or rotating the second electrical element by using a second portion of the sidewall of the frame, wherein the first portion of the sidewall of the frame is substantially aligned with the second portion of the sidewall of the frame.

7. The method of claim 1, further comprising:

attaching the first electrical element and the second electrical element on the top surface of the first carrier.

8. The method of claim 7, wherein attaching the first electrical element and the second electrical element on the top surface of the first carrier includes:

creating a first negative pressure between the first electrical element and the first carrier; and creating a second negative pressure between the second electrical element and the first carrier.

9. The method of claim 8, further comprising:

transferring the first electrical element and the second electrical element to a second carrier; and releasing the first negative pressure and the second negative pressure.

10. The method of claim 1, wherein providing the first electrical element and the second electrical element includes:

disposing the first electrical element and the second electrical element on the top surface of the first carrier by a pick-and-place method.

11. A method for manufacturing a package structure, comprising:

providing a carrier defining a plurality of predetermined areas aligned with each other from a top view;

disposing a plurality of electrical elements on a top surface of the carrier;

providing a frame after disposing the plurality of electrical elements on the top surface of the carrier, wherein the frame is spaced apart from the plurality of electrical elements; and moving the frame to push the plurality of electrical elements to slide on the top surface of the carrier until the plurality of electrical elements enter the plurality of predetermined areas respectively from the top view.

12. The method of claim 11, wherein the frame includes a plurality of sidewalls configured to push a plurality of lateral surfaces of the plurality of electrical elements, wherein the sidewalls are substantially aligned with each other.

13. The method of claim 12, further comprising:

transferring the plurality of electrical elements to a second carrier through a negative pressure through a plurality of suction holes of the frame.

14. The method of claim 13, further comprising:

releasing the negative pressure;

removing the frame; and encapsulating the plurality of elements to form a molded substrate.

15. A method for manufacturing a package structure, comprising:

providing a plurality of electrical elements on a surface of a first carrier;

providing a frame after disposing the plurality of electrical elements on the surface of the first carrier, wherein the frame has a first plane and a second plane non-parallel with the first plane;

pushing a plurality of first surfaces of the plurality of electrical elements through the first plane of a frame respectively until the plurality of first surfaces of the plurality of electrical elements are substantially aligned with each other; and pushing a plurality of second surfaces of the plurality of electrical elements through the second plane of the frame until the plurality of second surfaces of the plurality of electrical elements adjacent to the first surfaces of the plurality of electrical elements are substantially aligned with each other.

16. The method of claim 15, wherein pushing the plurality of first surfaces of the plurality of electrical elements includes:

pushing the plurality of first surfaces of the plurality of electrical elements to make the plurality of electrical elements slide on the surface of the first carrier along a first direction, wherein pushing the plurality of second surfaces of the plurality of electrical elements includes:

pushing the plurality of second surfaces of the plurality of electrical elements to make the plurality of electrical elements slide on the surface of the first carrier along a second direction, wherein the second direction is non-parallel with the first direction from a top view.

17. The method of claim 16, wherein the frame defines a plurality of unit spaces for accommodating the plurality of electrical elements, wherein a plurality of corners of the plurality of electrical elements contact a plurality of corners of the plurality of unit space after pushing the plurality of first surfaces of the plurality of electrical elements and pushing the plurality of second surfaces of the plurality of electrical elements.

18. The method of claim 15, further comprising:

transferring the plurality of electrical elements to a second carrier, wherein the second carrier defines a plurality of predetermined positions corresponding to the plurality of predetermined positions of the first carrier.

19. The method of claim 18, wherein the plurality of electrical elements are transferred to the second carrier through a negative pressure through a plurality of suction holes of the frame, wherein a plurality of active surfaces of the plurality of electrical elements contact the second carrier.

20. The method of claim 19, further comprising:

releasing the negative pressure;

removing the frame; and encapsulating the plurality of elements to form a molded substrate.

* * * * *